United States Patent [19]

Saitoh et al.

[11] Patent Number: 4,705,732

[45] Date of Patent: Nov. 10, 1987

[54] MEMBER HAVING SUBSTRATE WITH PROJECTING PORTIONS AT SURFACE AND LIGHT RECEIVING LAYER OF AMORPHOUS SILICON

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 726,768

[22] Filed: Apr. 24, 1985

[30] Foreign Application Priority Data

| Apr. 27, 1984 | [JP] | Japan | 59-86591 |
| Apr. 28, 1984 | [JP] | Japan | 59-86895 |
| Apr. 29, 1984 | [JP] | Japan | 59-87269 |
| Apr. 30, 1984 | [JP] | Japan | 59-87228 |
| May 1, 1984 | [JP] | Japan | 59-88028 |
| May 2, 1984 | [JP] | Japan | 59-88688 |
| Oct. 30, 1984 | [JP] | Japan | 59-226663 |
| Oct. 31, 1984 | [JP] | Japan | 59-227894 |
| Nov. 1, 1984 | [JP] | Japan | 59-228991 |
| Nov. 2, 1984 | [JP] | Japan | 59-230353 |
| Nov. 5, 1984 | [JP] | Japan | 59-231243 |
| Nov. 6, 1984 | [JP] | Japan | 59-232356 |

[51] Int. Cl.$^4$ .................................. G03G 5/085
[52] U.S. Cl. ........................................ 430/57; 430/65; 430/84
[58] Field of Search ................ 430/56, 57, 58, 65, 430/69, 84, 127

[56] References Cited

U.S. PATENT DOCUMENTS

| 4,359,514 | 11/1982 | Shimizu et al. | 430/65 |
| 4,492,745 | 1/1985 | Mimura et al. | 430/67 |
| 4,514,483 | 4/1985 | Matsuura et al. | 430/84 |
| 4,592,981 | 6/1986 | Saitoh et al. | 430/69 |
| 4,592,983 | 6/1986 | Saitoh et al. | 430/69 |
| 4,595,644 | 6/1986 | Saitoh et al. | 430/69 |
| 4,600,671 | 7/1986 | Saitoh et al. | 430/69 |

FOREIGN PATENT DOCUMENTS

| 2733187 | 1/1978 | Fed. Rep. of Germany | 430/65 |
| 56-150754 | 11/1981 | Japan | 430/65 |
| 60-31144 | 2/1985 | Japan | 430/69 |

Primary Examiner—John L. Goodrow
Attorney, Agent, or Firm—Fitzpatrick, Cella, Harper & Scinto

[57] ABSTRACT

A light-receiving member comprises a substrate having a large number of protruding portions on a surface thereof, each of said protruding portions having at a predetermined cut position a sectional shape comprising a main projection and a subprojection, the main projection and the subprojection overlapping each other, and a light-receiving layer of a multi-layer structure having a first layer comprising an amorphous material containing silicon atoms and germanium atoms and a second layer comprising an amorphous material containing silicon atoms and exhibiting photoconductivity provided on said substrate successively from the substrate side.

50 Claims, 82 Drawing Figures (A)

(B)

(C)

(A)

(B)

(C)

MEMBER HAVING SUBSTRATE WITH PROJECTING PORTIONS AT SURFACE AND LIGHT RECEIVING LAYER OF AMORPHOUS SILICON

CROSS-REFERENCE TO RELATED APPLICATIONS

This application contains subject matter related to commonly assigned, copending application Ser. Nos. 697,141; 717,821; 719,980; 725,751; 739,867; 740,714; 741,300; 753,048; 753,011; 752,920; 699,868; 705,516; 709,888; 720,011; 740,901 and 786,970.

BACKGROUND OF THE INVENTION

1. Field of the Invention

This invention relates to a light receiving member having sensitivity to electromagnetic waves such as light [herein used in a broad sense, including ultraviolet rays, visible light, infrared rays, X-rays and gamma-rays]. More particularly, it pertains to a light-receiving member suitable for using a coherent light such as laser beam.

2. Description of the Prior Art

As the method for recording a digital image information as an image, there have been well known the methods in which an electrostatic latent image is formed by scanning optically a light-receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650-820 nm).

In particular, as the light-receiving member for electrophotography which is suitable when using a semiconductor laser, an amorphous material containing silicon atoms (hereinafter written briefly as "A-Si") as disclosed in Japanese Laid-open Patent Application Nos. 86341/1979 and 83746/1981 is attracting attention for its high Vickers hardness and non-polluting properties in social aspect in addition to the advantage of being by far superior in matching in its photosensitive region as compared with other kinds of light-receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light-receiving member is considerably limited.

As attempts to enlarge this tolerance in designing, namely to enable effective utilization of its high photosensitivity in spite of somewhat lower dark resistance, there have been proposed a light-receiving layer with a multi-layer structure of two or more laminated layers with different conductivity characteristics with formation of a depletion layer within the light-receiving layer, as disclosed in Japanese Laid-open Patent Application Nos. 121743/1979, 4053/1982 and 4172/1982, or a light-receiving member with a multi-layer structure in which a barrier layer is provided between the substrate and the photosensitive layer and/or on the upper surface of the photosensitive layer, thereby enhancing apparent dark resistance of the light-receiving layer as a whole, as disclosed in Japanese Laid-open Patent Application Nos. 52178/1982, 52179/1982, 52180/1982, 58159/1982, 58160/1982 and 58161/1982.

According to such proposals, A-Si type light-receiving members have been greatly advanced in tolerance in designing of commercialization thereof or easiness in management of its production and productivity, and the speed of development toward commercialization is now further accelerated.

When carrying out laser recording by use of such a light-receiving member having a light-receiving layer of a multi-layer structure, due to irregularity in thickness of respective layers, and also because of the laser beam which is an coherent monochromatic light, it is possible that the respective reflected lights reflected from the free surface on the laser irradiation side of the light-receiving layer and the layer interface between respective layers constituting the light-receiving layer and between the substrate and the light-receiving layer (hereinafter "interface" is used to mean comprehensively both the free surface and the layer interface) may undergo interference.

Such an interference phenomenon results in the so-called interference fringe pattern in the visible image formed and causes a poor iamge. In particular, in the case of forming a medium tone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light-receiving layer of a light-receiving member, a reflected light $R_1$ from the upper interface 102 and a reflected light $R_2$ reflected from the lower interface 101.

Now, the average layer thickness of the layer is defined as d, its refractive index as n and the wavelength of the light as $\lambda$, and when the layer thickness of a certain layer is ununiform gently with a layer thickness difference of $\lambda/2n$ or more, changes in absorbed light quantity and transmitted light quantity occur depending on to which condition of $2nd = m\lambda$ (m is an integer, reflected lights are strengthened with each other) and $2nd = (m+\frac{1}{2})\lambda$ (m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of $\pm 500$ Å $- \pm 1000$ Å, thereby forming a light scattering surface (as disclosed in Japanese Laid-open Patent Application No. 162975/1983); to provide a light absorbing layer by subjecting the aluminum substrate surface to black Alumite treatment or dispersing carbon, color pigment or dye in a resin (as disclosed in Japanese Laid-open Patent Application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open Patent Application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light-receiving layer 302 through prevention of interference, light will be diffused within the light-receiving layer 302 to cause halation, whereby resolution is disadvantageously lowered.

Particularly, in a light-receiving member of a multi-layer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light-receiving member. Accordingly, in a light-receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light-receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light-receiving layer 502.

Accordingly, for the incident light on that portion, $2nd_1 = m\lambda$ or $2nd_1 = (m + \frac{1}{2})\lambda$ holds, to make it a light portion or a dark portion. Also, in the light-receiving layer as a whole, since there is nonuniformity in which the maximum difference among the layer thicknesses $d_1$, $d_2$, $d_3$ and $d_4$ of the light-receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light-receiving layer of a multi-layer structure on the substrate, the surface of which is regularly roughened, in addition to the interference between the regularly reflected light from the substrate surface and the reflected light from the light receiving layer surface as explained for light-receiving member of a single layer structure in FIG. 3, interferences by the reflected lights from the interfaces between the respective layers participate to make the extent of appearance of interferance fringe pattern more complicated than in the case of the light-receiving member of a single layer structure.

SUMMARY OF THE INVENTION

An object of the present invention is to provide a novel light-receiving member sensitive to light, which has cancelled the drawbacks as described above.

Another object of the present invention is to provide a light-receiving member which is suitable for image formation by use of a coherent monochromatic light and also easy in production management.

Still another object of the present invention is to provide a light-receiving member which can cancel the interference fringe pattern appearing during image formation and appearance of speckles on reversal developing at the same time and completely.

Still another object of the prevent invention is to provide a light-receiving member which is high in dielectric strength and photosensitivity and excellent in electrophotographic characteristics.

It is also another object of the present invention to provide a light-receiving member, which can provide an image of high quality which is high in density, clear in halftone and high in resolution and is suitable for electrophotography.

Further, another object of the present invention is to provide a light-receiving member which can perform digital image recording utilizing electrophotography, above all digital image recording having a halftone information, clearly and at high resolution with high quality.

Still another object of the present invention is to provide a light-receiving member having high photosensitivity, high SN ratio characteristic and good electrical contact with a substrate.

Still another object of the present invention is to provide a light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer with a multi-layer structure having a first layer comprising an amorphous material containing silicon atoms and germanium atoms and a second layer comprising an amorphous material containing silicon atoms and exhibiting photoconductivity provided on said substrate successively from the substrate side.

DESCRIPTION OF THE PREFERRED EMBODIMENTS

Referring now to the accompnaying drawings, the present invention is to be described in detail.

Figure 1:
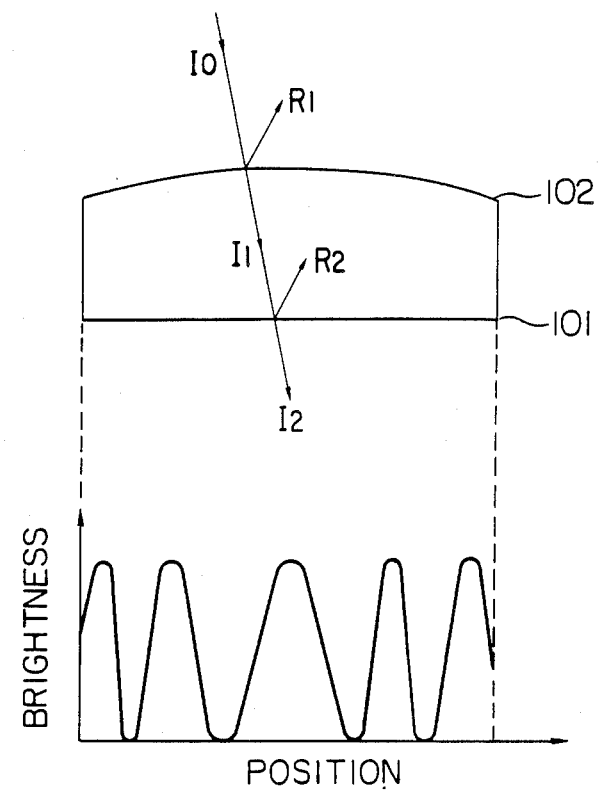
FIG. 1 is a schematic illustration of interference fringe in general.
Figure 2:
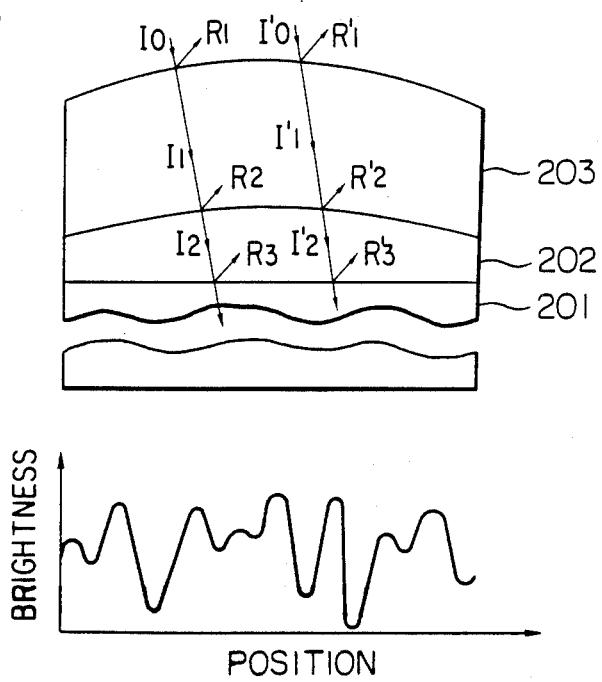
FIG. 2 is a schematic illustration of interference fringe in the case of a multi-layer light-receiving member.
Figure 3:
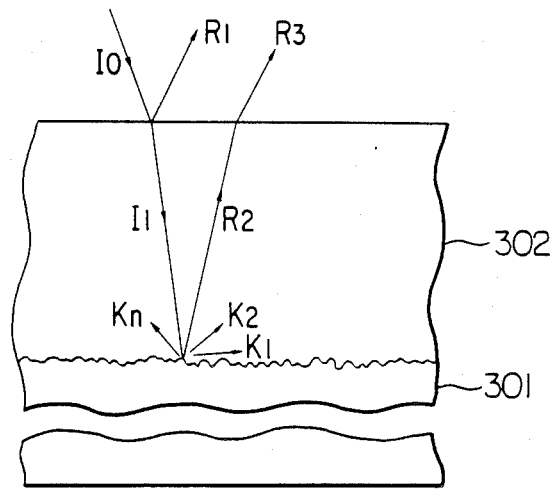
FIG. 3 is a schematic illustration of interference fringe by scattered light.
Figure 4:
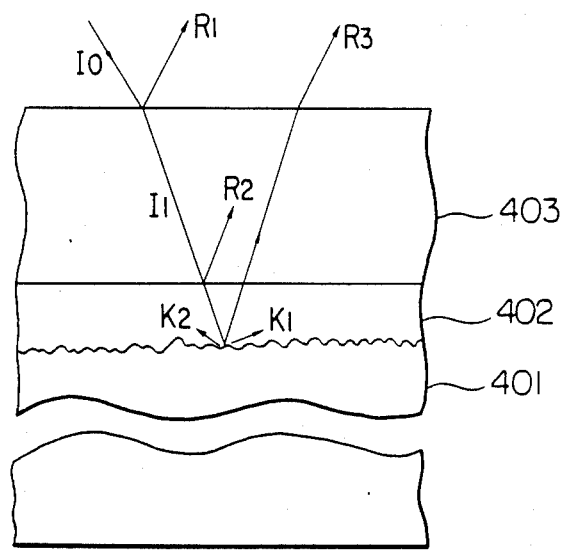
FIG. 4 is a schematic illustration of interference fringe by scattered light in the case of a multi-layer light-receiving member.
Figure 5:
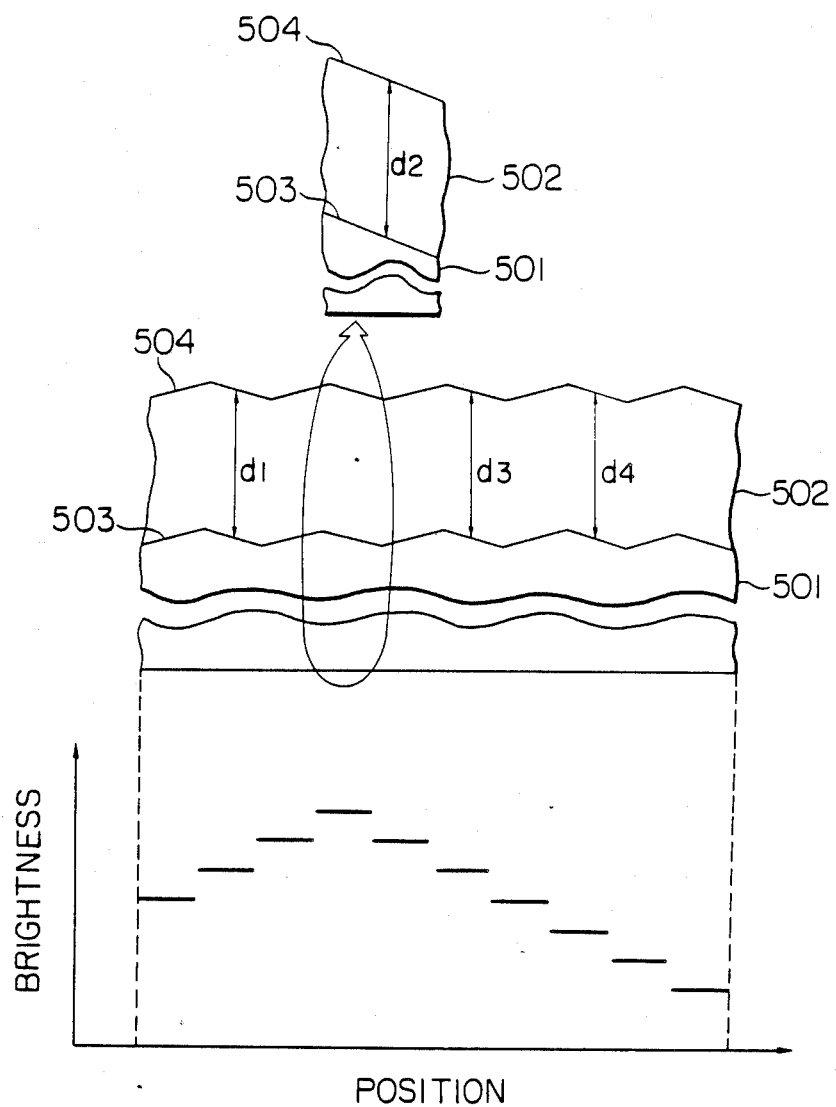
FIG. 5 is a schematic illustration of interference fringe in the case where the interfaces of respective layers of a light-receiving member are parallel to each other.
Figure 6:
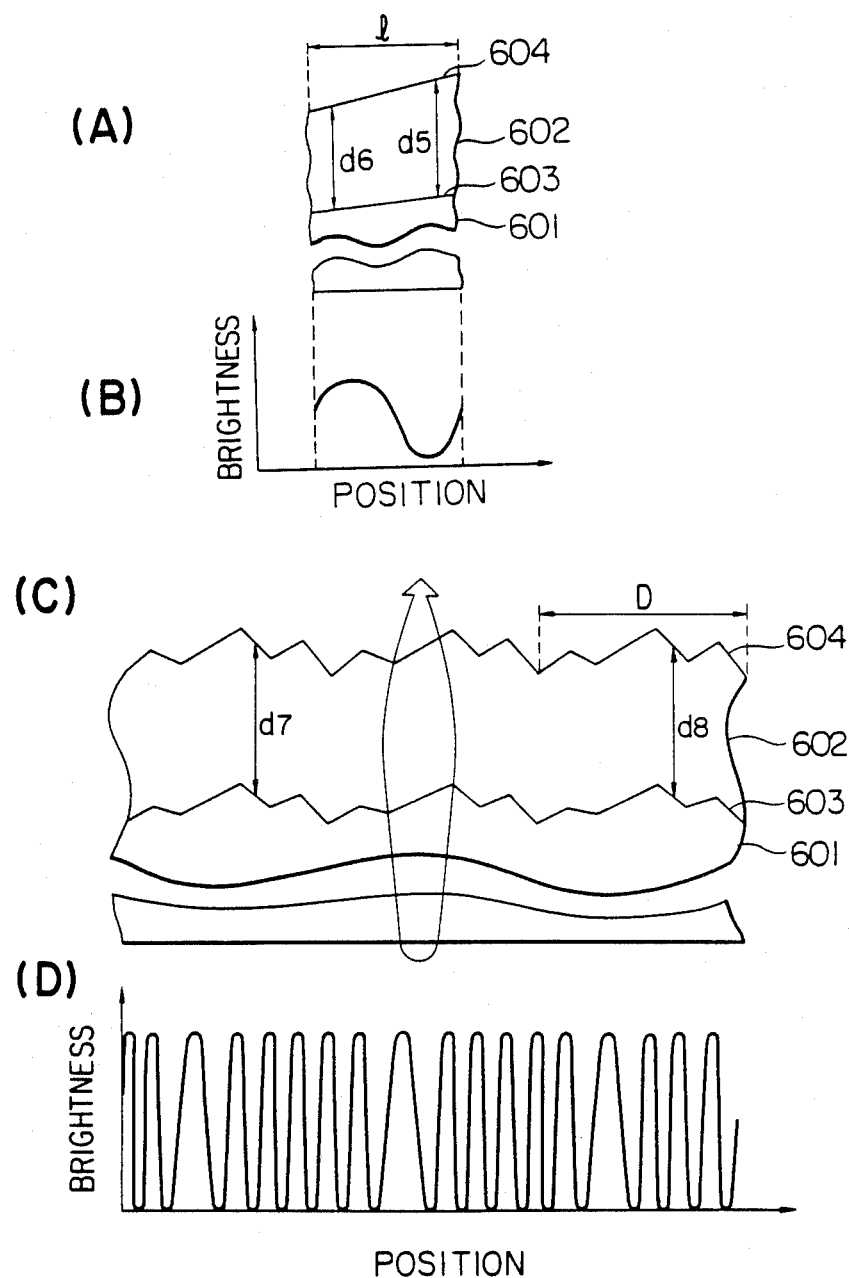
FIGS. 6(A), (B), (C) and (D) are schematic illustrations of no appearance of interference fringe in the case of non-parallel interfaces between respective layers of a light-receiving member.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region ) l [indicated schematically in FIG. 6(C), and its enlarged view shown in FIG. 6(A)] undergoes interference at said minute portion l to form a minute interference fringe pattern.

Figure 7:
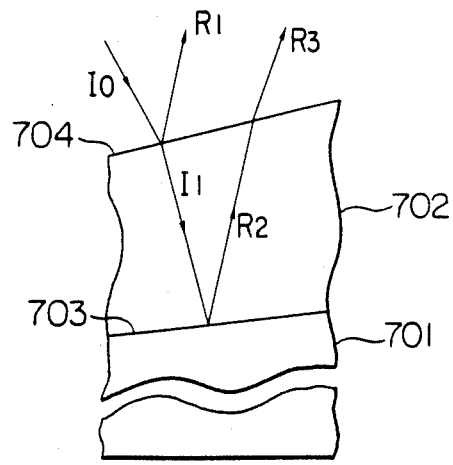
FIGS. 7(A), (B) and (C) are schematic illustration of comparison of the reflected light intensity between the case of parallel interfaces and non-parallel interfaces between the respective layers of a light-receiving member.
Figure 7:
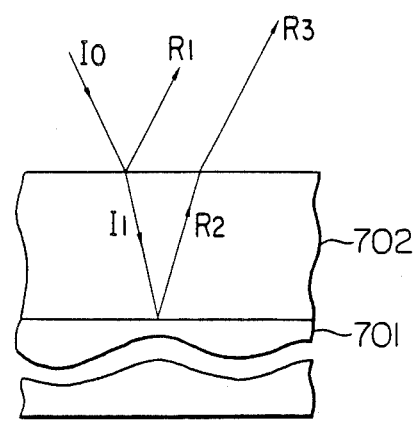
Figure 7:
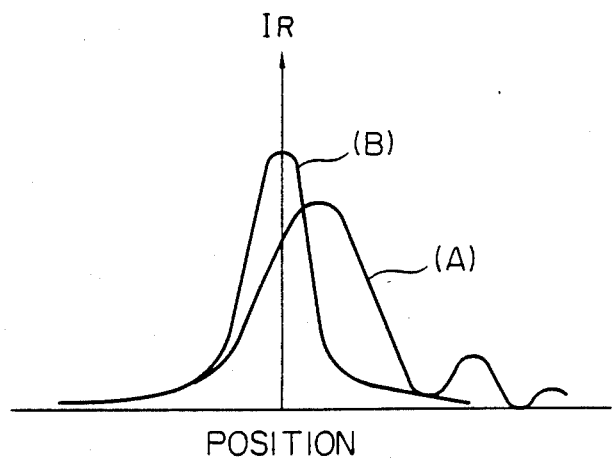
Figure 8:
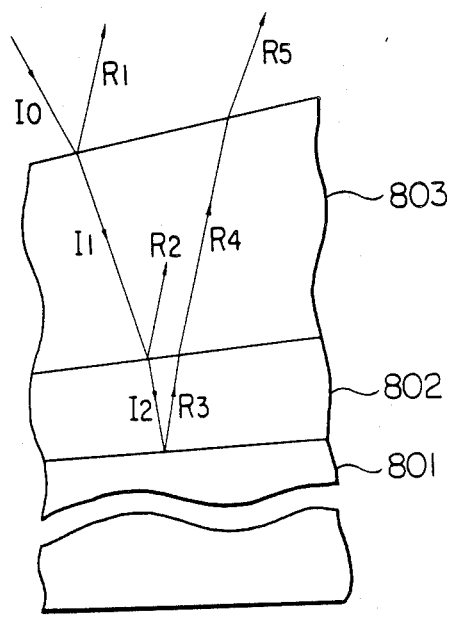
FIG. 8 is a schematic illustration of no appearance of interference fringe in the case of non-parallel interfaces between respective layers.

Also, as shown in FIG. 7, when the interface 703 between the first layer 701 and the second layer 702 and the free surface 704 are non-parallel to each other, the reflected light $R_1$ and the emitted lgiht $R_3$ are different in direction of progress from each other relative to the incident light $I_0$ as shown in FIG. 7(A), and therefore the degree of interference will be reduced as compared with the case (FIG. 7(B)) when the interfaces 703 and 704 are parallel to each other.

Accordingly, as shown in FIG. 7(C), as compared with the case "(B)" where a pair of the interfaces are in parallel relation, the difference in lightness and darkness in the interference fringe pattern becomes negligibly small even if interfered, if any, in the non-parallel case "(A)".

The same is the case, as shown in FIG. 6, even when the layer thickness of the layer 602 may be macroscopically ununiform ($d_7 \neq d_8$), and therefore the incident light quantity becomes uniform all over the layer region (see FIG. 6(D)).

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exist in connection with the incident light $I_0$. Accordingly, at the respective layers, the same phenomenon as described with reference to FIG. 7 occurs.

Moreover, the interfaces between the respective layers at a minute portion function as a kind of slit, at which diffraction phenomenon will occur.

Accordingly, interference at respective layers appears as the effect of the product of interference due to difference in layer thickness and the interference due to difraction at the respective layer interfaces.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

By such a designing, the diffraction effect at the ends of minute portions can positively be utilized, whereby appearance of interference fringe pattern can further be suppressed.

Further, in order to accomplish more effectively the objects of the present invention, the layer thickness difference ($d_5 - d_6$) at the minute portion l should desirably be as follows:

$d_5 - d_6 \geq \lambda/2n$ (where $\lambda$ is the wavelength of the irradiation light and n is the refractive index of the second layer 602) (See FIG. 6).

In the present invention, within the layer thickness of the minute portion l (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the first layer and the second layer constituting the light-receiving layer, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

As the method for working the substrate to accomplish the objects of the present invention, it is possible to utilize the chemical methods such as chemical etching, electric plating, etc., the physical methods such as vapor deposition, sputtering, etc. and the mechanical methods such as lathe working, etc. However, the mechanical working method by lathe, etc. are preferred for easy production management. For example, a substrate may be worked with a lathe by fixing a bite having a V-shaped cutting blade at a predetermined position on a cutting working machine such as milling machine, lathe, etc, and cut working accurately the substrate surface by, for example, moving regularly in a certain direction while rotating a cylindrical substrate according to a program previously designed as desired, thereby forming to a desired unevenness shape, pitch and depth. The linear projection produced by the unevenness formed by such a cutting working has a spiral structure with the center axis of the cylindrical substrate as its center. The spiral structure of the projection may be made into a multiple spiral structure such as double or triple structure or a crossed spiral structure.

Alternatively, a straight line structure along the center axis may also be introduced in addition to the spiral structure.

Each of the protruding portions formed on the surface of the substrate is preferred to have the same shape as the first order approximation at a predetermined section in order to make the working control easy.

At a predetermined cut position, each of the protruding portions has a sectional shape comprising a main projection (main peak) and a subprojection (subpeak), the main projection and the subprojection overlapping each other.

Figure 9:
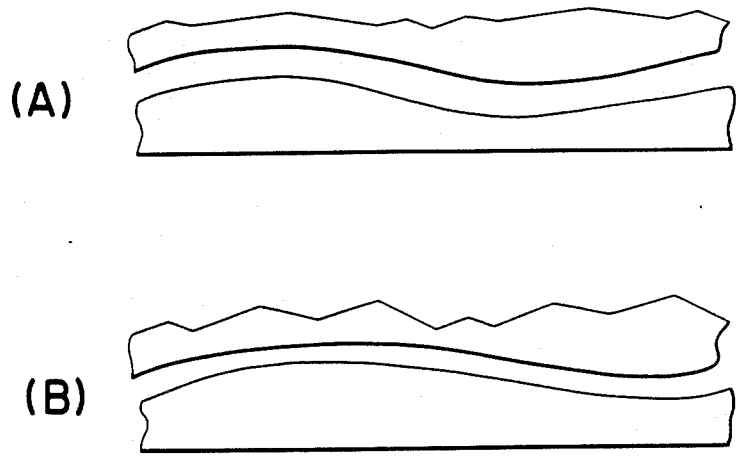
FIGS. 9(A), (B) and (C) are schematic illustrations of the surface condition of typical substrates.

Preferably, the above-mentioned protruding portions may be arranged regularly or periodically in order to enhance the effect of the invention. Further, the above-mentioned protruding portion, for further enhancing the effect of the invention and enhancing adhesion between the light-receiving layer and the substrate, may preferably have multiple subprojections which may overlap each other. In addition to these, for scattering with good efficiency the incident light in one direction, the above-mentioned protruding portion may preferably be united in symmetrically [FIG. 9(A)] or asymmetrically [FIG. 9(B)] with the main projection at its center. However, for enhancing the degree of freedom in management of substrate working, it is preferred that both exist mixed in the substrate.

In the present invention, the respective dimensions of the unevenness provided on the substrate surface under managed condition are set so as to accomplish effectively the objects of the present invention in view of the following points.

More specifically, in the first place, the A-Si layer constituting the light-receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 μm to 0.3 μm, more preferably 200 μm to 1 μm, most preferably 50 μm to 5 μm.

It is also desirable that the maximum depth of the recessed portion should preferably be made 0.1 μm to 5 μm, more preferably 0.3 μm to 3 μm, most preferably 0.6 μm to 2 μm. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 μm to 2 μm within the same pitch, more preferably 0.1 μm to 1.5 μm, most preferably 0.2 μm to 1 μm.

Further, the light-receiving layer in the light-receiving member of the present invention has a multi-layer structure comprising a first layer constituted of an amorphous material containing silicon atoms and germanium atoms and a second layer constituted of an amorphous material containing silicon atoms and exhibiting photoconductivity provided on a substrate successively from the substrate side, and therefore can exhibit very excellent electrical, optical and photoconductive characteristics, dielectric strength as well as good use environmental characteristics.

In particular, when it is applied as a light-receiving member for electrophotography, there is no influence of residual potential on image formation at all, with its electrical properties being stable with high sensitivity and high SN ratio, also excellent in light fatigue resistance and repeated use characteristics, whereby it is possible to obtain repeatedly and stably images of high quality with high density, clear halftone and high resolution.

Further, the light-receiving member of the present invention is high in photosensitivity over the all visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 10:
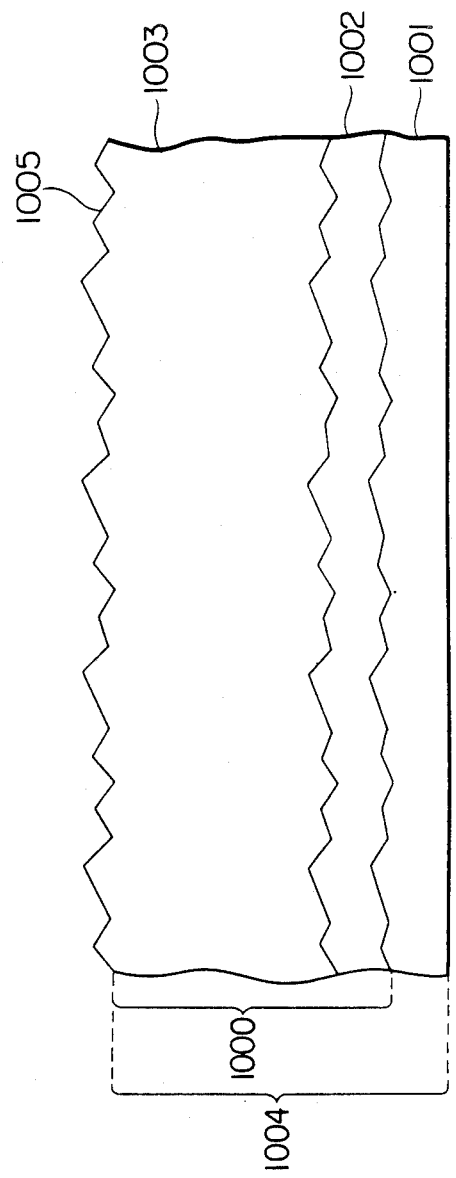
FIG. 10 is a schematic illustration of the layer constitution of a light-receiving member.

FIG. 10 shows a schematic sectional view for illustration of the layer structure of an embodiment of the light-receiving member of the present invention.

The light-receiving member 1004 as shown in FIG. 10 has a light-receiving layer 1000 on a substrate for light-receiving member 1001, said light-receiving layer 1000 having a free surface 1005 on one end surface.

The light-receiving layer 1000 has a layer structure constituted of a first layer (G) 1002 comprising an amorphous material containing silicon atoms and germanium atoms and, if desired, hydrogen atoms (H) and/or halogen atoms (X) (hereinafter abbreviated as "A-SiGe(H,X)") and a second layer (S) 1003 comprising A-Si containing, if desired, hydrogen atoms (H) and/or halogen atoms (X) (hereinafter abbreviated as A-Si(H,X)) and exhibiting photoconductivity laminated successively from the substrate 1001 side.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
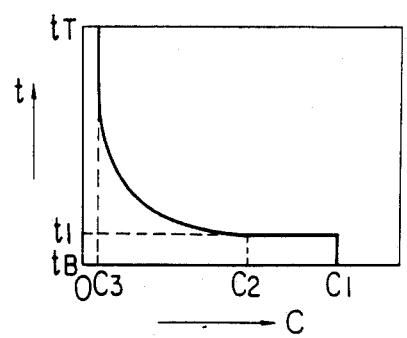
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G)

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
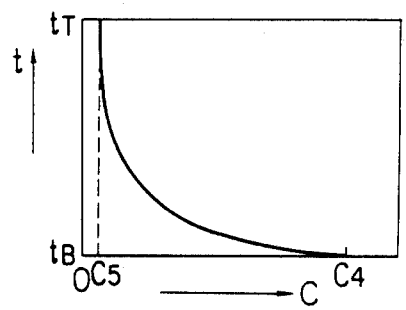

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
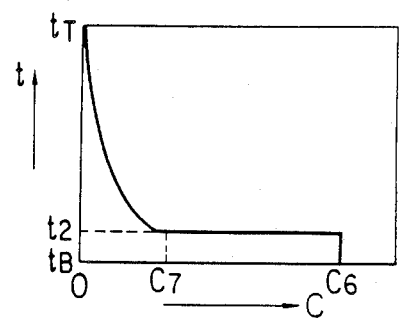

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
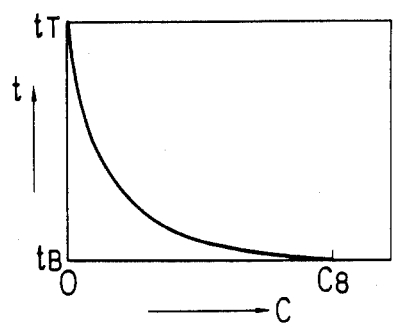

In case of FIG. 14, germanium atoms are decreased gradually and continuously from the position $t_B$ to the position $t_T$ from the concentration $C_8$, until it is made substantially zero at the position $t_T$.

Figure 15:
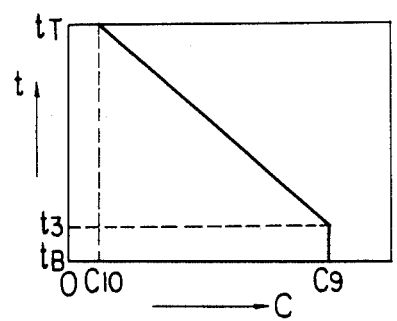

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
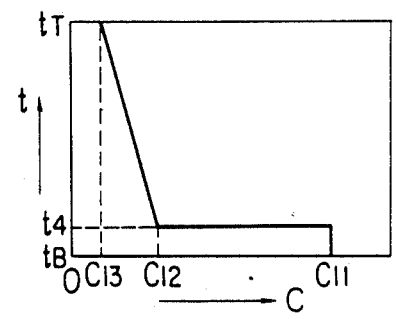

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
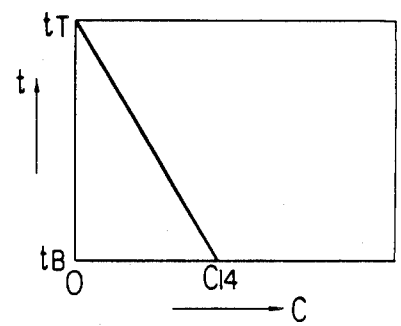

In the embodiment shown in FIG. 17, the distribution concentration C of germanium atoms is decreased as a first order function from the concentration $C_{14}$ to zero from the position $t_B$ to the position $t_T$.

Figure 18:
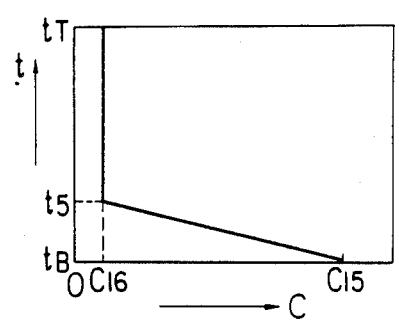

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
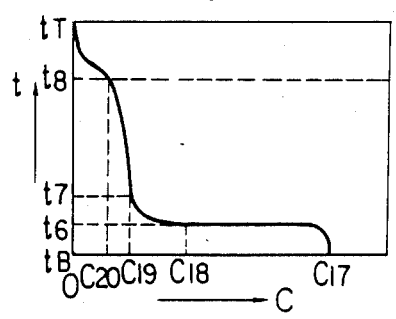

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_R$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of $5\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1 \times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to acheive effectively the objects of the present invention, may preferably be 1 to $9.5 \times 10^5$ atomic ppm, more preferably 100 to $8 \times 10^5$ atomic ppm, most preferably 500 to $7 \times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to $50\mu$, more preferably 40 Å to $40\mu$, most preferably 50 Å to $30\mu$.

On the other hand, the layer thickness T of the second layer (S) may be preferably 0.5 to $90\mu$, more preferably 1 to $80\mu$, most preferably 2 to $50\mu$.

The sum of the above layer thicknesses T and $T_B$, namely ($T + T_B$) may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above ($T_B + T$) may generally be from 1 to $100\mu$, preferably 1 to $80\mu$, most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1 \times 10^5$ atomic ppm or more, the layer thickness $T_B$ should desirably be made considerably thinner, preferably $30\mu$ or less, more preferably $25\mu$ or less, most preferably $20\mu$ or less.

In the present invention, illustrative of halogen atoms (X), which may optionally be incorporated in the first layer (G) and the second layer (S) constituting the light-receiving layer, are fluorine, chlorine, bormine and iodine, particularly preferably fluorine and chlorine.

In the present invention, formation of the first layer (G) constituted of A-SiGe(H,X) may be conducted according to the vacuum deposition method utilizing discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe(H,X) according to the reactive sputtering method or the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made nonuniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type condutivity characteristics and n-type impurities and/or giving n-type conductivity characteristics to A-Si(H,X) and/or A-SiGe(H,X) constituting the light receiving layer to be formed.

More specifically, there may be mentioned as p-type impurities atoms belonging to the group III of the periodic table (Group III atoms), such as B (boron), Al- (aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to ⊕ polarity. On the other hand, when the substance to be incorporated is a n-type impurity, migration of positive holes injected from the substrate side into the light-receiving layer may be effectively inhibited when the free surface of the light-receiving layer is subjected to the charging treatment to ⊖ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose, since the difference between respective Figures will be indistinct if represented by the real values as such, and it should be understood that these Figures are schematic in nature. As practical distribution, the values of ti ($1 \leq i \leq 9$) or Ci ($1 \leq i \leq 17$) chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
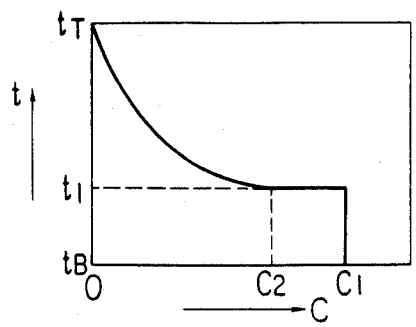
FIGS. 27 to 35 are illustrations for explanation of distribution states of the substance (C) in the layer region (PN)

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
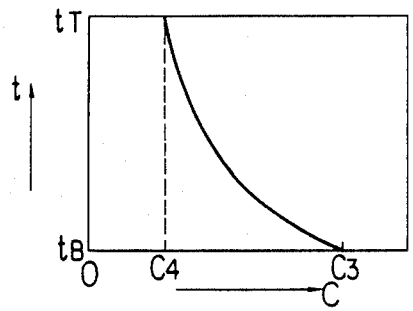

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
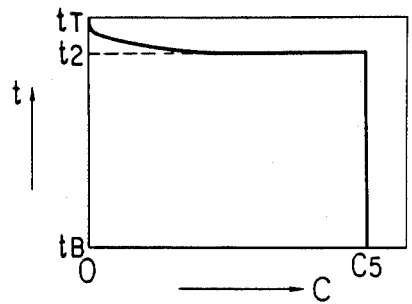

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
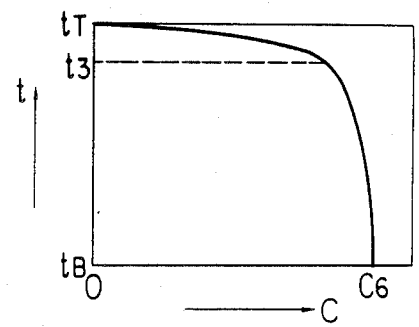

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
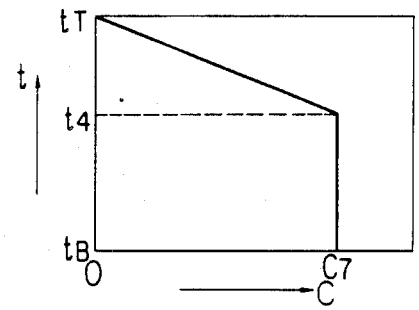

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
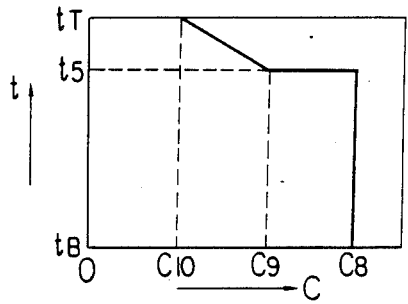

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
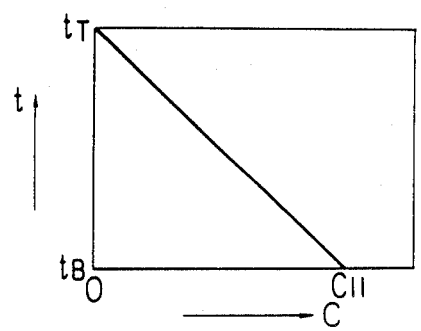

In the embodiment shown in FIG. 33, from the position $t_B$ to the position $t_T$, the distribution concentration C of the substance (C) is decreased continuously as a first order function from the concentration $C_{11}$ to zero.

Figure 34:
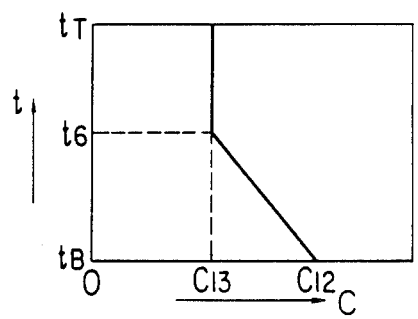

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
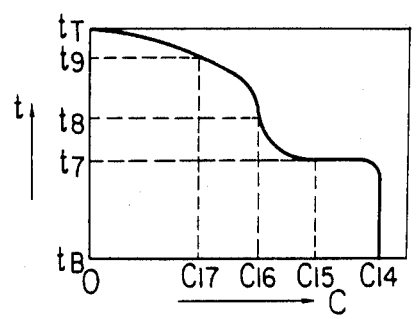

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within $5\mu$ from the interface position $t_B$.

In the present invention, the above localized region (B) may be made to be identical with the whole of the layer region (L) from the interface position $t_B$ to the thickness of $5\mu$, or alternatively a part of the layer region (L).

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

In the light-receiving member of the present invention, for the purpose of obtaining higher photosensitivity and dark resistance, and further for the purpose of improving adhesion between the substrate and the light-receiving layer, at least one kind of atoms selected from oxygen atoms, carbon atoms and nitrogen atoms can be contained in the light-receiving layer in either uniform or ununiform distribution state in the layer thickness direction. Such atoms (OCN) to be contained in the light-receiving layer may be contained therein throughout the whole layer region of the light-receiving layer or localized by being contained in a part of the layer region of the light-receiving layer.

The distribution concentration C (OCN) of the atoms (OCN) should desirably be uniform within the plane parallel to the surface of the substrate.

In the present invention, the layer region (OCN) where atoms (OCN) are contained is provided so as to occupy the whole layer region of the light-receiving layer when it is primarily intended to improve photosensitivity and dark resistance, while it is provided so as to occupy the end portion layer region on the substrate side of the light-receving layer when it is primarily intended to strengthen adhesion between the substrate and the light-receiving layer.

In the former case, the content of atoms (OCN) contained in the layer region (OCN) should desirably be made relatively smaller in order to maintain high photosensitivity, while in the latter case relatively larger in order to ensure reinforcement of adhesion to the substrate.

In the present invention, the content of the atoms (OCN) to be contained in the layer region (OCN) provided in the light-receiving layer can be selected suitably in organic relationship with the characteristics required for the layer region (OCN) itself, or with the characteristic at the contacted interface with the substrate when the said layer region (OCN) is provided in direct contact with the substrate, etc.

When other layer regions are to be provided in direct contact with the layer region (OCN), the content of the atoms (OCN) may suitably be selected with due considerations about the characteristics of said other layer regions or the characteristics at the contacted interface with said other layer regions.

The amount of the atoms (OCN) contained in the layer region (OCN) may be determined as desired depending on the characteristics required for the light-receiving member to be formed, but it may preferably be 0.001 to 50 atomic %, more preferably 0.002 to 40 atomic %, most preferably 0.003 to 30 atomic %.

In the present invention, when the layer region (OCN) occupies the whole region of the light-receiving layer or, although not occupying the whole region, the proportion of the layer thickness $T_O$ of the layer region (OCN) occupied in the layer thickness T of the light-receiving layer is sufficiently large, the upper limit of the content of the atoms (OCN) contained in the layer region (OCN) should desirably be made sufficiently smaller than the value as specified above.

In the case of the present invention, when the proportion of the layer thickness $T_O$ of the layer region (OCN) occupied relative to the layer thickness T of the light-receiving layer is 2/5 or higher, the upper limit of the atoms (OCN) contained in the layer region (OCN) should desirably be made 30 atomic % or less, more preferably 20 atomic % or less, most preferably 10 atomic % or less.

According to a preferred embodiment of the present invention, it is desirable that the atoms (OCN) should be contained in at least the above first layer to be provided directly on the substrate. In short, by incorporating the atoms (OCN) at the end portion layer region on the substrate side in the light-receiving layer, it is possible to effect reinforcement of adhesion between the substrate and the light-receiving layer.

Further, in the case of nitrogen atoms, for example, under the co-presence with boron atoms, improvement of dark resistance and improvement of photosensitivity can further be ensured, and therefore they should preferably be contained in a desired amount in the light-receiving layer.

Plural kinds of these atoms (OCN) may also be contained in the light-receiving layer. For example, oxygen atoms may be contained in the first layer, nitrogen atoms in the second layer, or alternatively oxygen atoms and nitrogen atoms may be permitted to be co-present in the same layer region.

FIGS. 43 through 51 show typical examples of ununiform depth profiles in the layer thickness direction of the atoms (OCN) contained in the layer region (OCN) in the light-receiving member of the present invention.

In FIGS. 43 through 51, the abscissa indicates the distribution concentration C of the atoms (OCN), and the ordinate the layer thickness of the layer region (OCN), $t_B$ showing the position of the end surface of the layer region on the substrate side, while $t_T$ shows the position of the end face of the layer region (OCN) opposite to the substrate side. Thus, layer formation of the layer region (OCN) containing the atoms (OCN) proceeds from the $t_B$ side toward the $t_T$ side.

Figure 43:
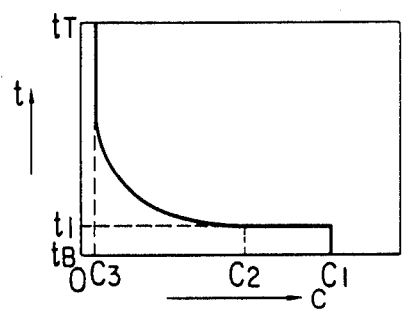
FIGS. 43 to 51 are illustrations for explanation of distribution states of the atoms (OCN) in the layer region (OCN)

FIG. 43 shows a first typical embodiment of the depth profile in the layer thickness direction of the atoms (OCN) contained in the layer region (OCN).

In the embodiment shown in FIG. 43, from the interface position $t_B$ where the surface on which the layer region (OCN) containing the atoms (OCN) is formed contacts the surface of said layer region (OCN) to the position of $t_1$, the atoms (OCN) are contained in the layer region (OCN) to be formed while the distribution concentration of the atoms (OCN) taking a constant value of $C_1$, said distribution concentration being gradually continuously reduced from $C_2$ from the position $t_1$ to the interface position $t_T$, until at the interface position $t_T$, the distribution concentration C is made $C_3$.

Figure 44:
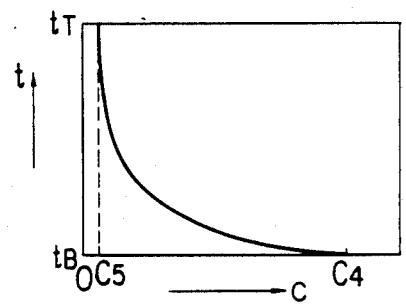

In the embodiment shown in FIG. 44, the distribution concentration C of the atoms (OCN) contained is reduced gradually continuously from the concentration $C_4$ from the position $t_B$ to the position $t_T$, at which it becomes the concentration $C_5$.

Figure 45:
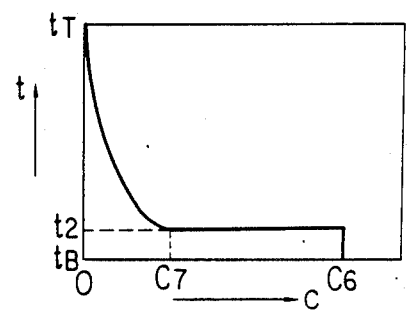

In the case of FIG. 45, from the position $t_B$ to the position $t_2$, the distribution concentration of the atoms (OCN) is made constantly at $C_6$, reduced gradually continuously from the concentration $C_7$ between the position $t_2$ and the position $t_T$, until at the position $t_T$, the distribution concentration C is made substantially zero (here substantially zero means the case of less than the detectable level).

Figure 46:
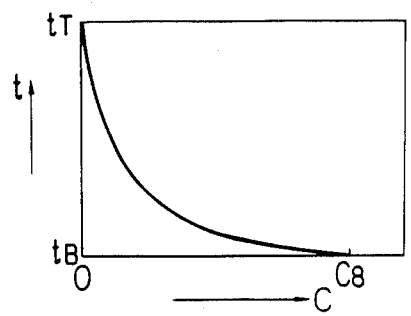

In the case of FIG. 46, the distribution concentration C of the atoms (OCN) is reduced gradually continuously from the concentration $C_8$ from the position $t_B$ up to the position $t_T$, to be made substantially zero at the position $t_T$.

Figure 47:
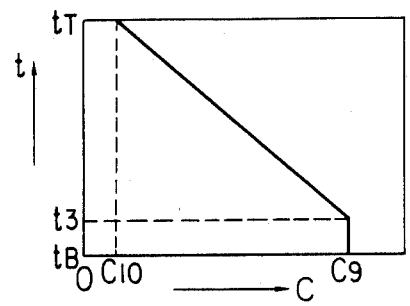

In the embodiment shown in FIG. 47, the distribution concentration C of the atoms (OCN) is made constantly $C_9$ between the position $t_B$ and the position $t_3$, and it is made the concentration $C_{10}$ at the position $t_T$. Between the position $t_3$ and the position $t_T$, the distribution concentration C is reduced from the concentration $C_9$ to substantially zero as a first order function from the position $t_3$ to the position $t_T$.

Figure 48:
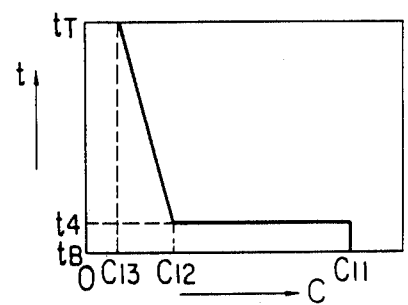

In the embodiment shown in FIG. 48, from the position $t_B$ to the position $t_4$, the distribution concentration C takes a constant value of $C_{11}$, while the distribution state is changed to a first order function in which the concentration is decreased from the concentration $C_{12}$ to the concentration $C_{13}$ from the position $t_4$ to the position $t_T$, and the concentration C is made substantially zero at the position $t_T$.

Figure 49:
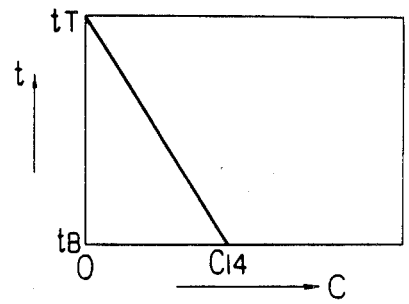

In the embodiment shown in FIG. 49, from the position $t_B$ to the position $t_T$, the distribution concentration C of the atoms (OCN) is reduced as a first order function from the concentration $C_{14}$ to substantially zero.

Figure 50:
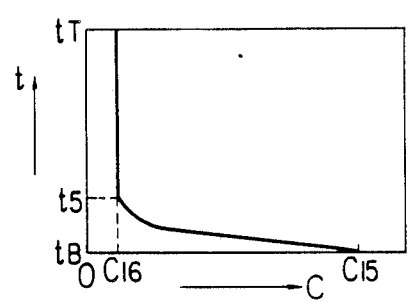

In FIG. 50, there is shown an embodiment, wherein from the position $t_B$ to the position $t_5$, the distribution concentration of the atoms (OCN) is reduced approximately as a first order function from the concentration $C_{15}$ to $C_{16}$, and it is made constantly $C_{16}$ between the position $t_5$ and the position $t_T$.

Figure 51:
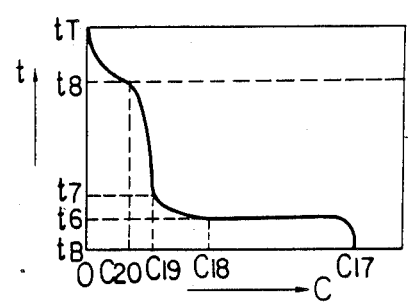

In the embodiment shown in FIG. 51, the distribution concentration C of the atoms (OCN) is $C_{17}$ at the position $t_B$, and, toward the position $t_6$, this $C_{17}$ is initially reduced gradually and then abruptly reduced near the position $t_6$, until it is made the concentration $C_{18}$ at the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced very gradually to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (OCN) contained in the layer region (OCN) by referring to FIGS. 43 through 51, it is desirable in the present invention that, when the atoms (OCN) are to be contained ununiformly in the layer region (OCN), the atoms (OCN) should be distributed in the layer region (OCN) with higher concentration on the substrate side, while having a portion considerably depleted in concentration on the interface $t_T$ side as compared with the substrate side.

The layer region (OCN) containing atoms (OCN) should desirably be provided so as to have a localized region (B) containing the atoms (OCN) at a relatively higher concentration on the substrate side as described above, and in this case, adhesion between the substrate and the light-receiving layer can be further improved.

The above localized region (B) should desirably be provided within $5\mu$ from the interface position $t_B$, as explained in terms of the symbols indicated in FIGS. 43 through 51.

In the present invention, the above localized region (B) may be made the whole of the layer region $(L_T)$ from the interface position $t_B$ to $5\mu$ thickness or a part of the layer region $(L_T)$.

It may suitably be determined depending on the characteristics required for the light-receiving layer to be formed whether the localized region (B) is made a part or the whole of the layer region $(L_T)$.

The localized region (B) should preferably be formed to have a depth profile in the layer thickness direction such that the maximum value Cmax of the distribution concentration of the atoms (OCN) may preferably be 500 atomic ppm or more, more preferably 800 atomic ppm or more, most preferably 1000 atomic ppm or more.

In other words, in the present invention, the layer region (OCN) containing the atoms (OCN) should preferably be formed so that the maximum value Cmax of the distribution concentration C may exist within $5\mu$ layer thickness from the substrate side (in the layer region with $5\mu$ thickness from $t_B$).

In the present invention, when the layer region (OCN) is provided so as to occupy a part of the layer region of the light-receiving layer, the depth profile of the atoms (OCN) should desirably be formed so that the refractive index may be changed moderately at the interface between the layer region (OCN) and other layer regions.

By doing so, reflection of the light incident upon the light-receiving layer from the interface between contacted interfaces can be inhibited, whereby appearance of interference fringe pattern can more effectively be prevented.

It is also preferred that the distribution concentration C of the atoms (OCN) in the layer region (OCN) should be changed along a line which is changed continuously and moderately, in order to give smooth refractive index change.

In this regard, it is preferred that the atoms (OCN) should be contained in the layer region (OCN) so that the depth profiles as shown, for example, in FIGS. 43 through 46, FIG. 49 and FIG. 51 may be assumed.

In the present invention, for provision of a layer region (OCN) containing the atoms (OCN) in the light-receiving layer, a starting material for introduction of the atoms (OCN) may be used together with the starting material for formation of the light-receiving layer during formation of the light-receiving layer and incorporated in the layer formed while controlling its amount.

When the glow discharge method is employed for formation of the layer region (OCN), a starting material for introduction of the atoms (OCN) is added to the material selected as desired from the starting materials for formation of the light-receiving layer as described above. For such a starting material for introduction of the atoms (OCN), there may be employed most of gaseous or gasified gasifiable substances containing at least the atoms (OCN) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$); lower siloxanes containing silicon atom (Si), oxygen atom (O) and hydrogen atom (H) as constituent atoms, such as disiloxane ($H_3SiOSiH_3$), trisiloxane ($H_3SiOSiH_2OSiH_3$), and the like; saturated hydrocarbons having 1-5 carbon atoms such as methane ($CH_4$), ethane ($C_2H_6$), propane ($C_3H_8$), n-butane (n-$C_4H_{10}$), pentane ($C_5H_{12}$); ethylenic hydrocarbons having 2-5 carbon atoms such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons having 2-4 carbon atoms such as acetylene ($C_2H_2$), methyl acetyllene ($C_3H_4$), butyne ($C_4H_6$); and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms (OCN), there may also be employed solid starting materials such as $SiO_2$, $Si_3N_4$ and carbon black in addition to those gasifiable as enumerated for the glow discharge method. These can be used in the form of a target for sputtering together with the target of Si, etc.

In the present invention, when forming a layer region (OCN) containing the atoms (OCN) during formation of the light-receiving layer, formation of the layer region (OCN) having a desired depth profile in the direction of layer thickness formed by varying the distribution concentration C of the atoms (OCN) contained in said layer region (OCN) may be conducted in the case of glow discharge by introducing a starting gas for introduction of the atoms (OCN) the distribution concentration C of which is to be varied into a deposition chamber, while varying suitably its gas flow rate according to a desired change rate curve.

For example, by the manual method or any other method conventionally used such as an externally driven motor, etc., the opening of a certain needle valve provided in the course of the gas flow channel system may be gradually varied. During this operation, the rate of variation is not necessarily required to be linear, but the flow rate may be controlled according to a variation rate curve previously designed by means of, for example, a microcomputer to give a desired content curve.

When the layer region (OCN) is formed according to the sputtering method, formation of a desired depth profile of the atoms (OCN) in the layer thickness direction by varying the distribution concentration C of the atoms (OCN) may be performed first similarly as in the case of the glow discharge method by employing a starting material for introduction of the atoms (OCN) under gaseous state and varying suitably as desired the gas flow rate of said gas when introduced into the deposition chamber. Secondly, formation of such a depth profile can also be achieved by previously changing the composition of a target for sputtering. For example, when a target comprising a mixture of Si and $SiO_2$ is to be used, the mixing ratio of Si to SiO$_2$ may be varied in the direction of layer thickness of the target.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, In$_2$O$_3$, SnO$_2$, ITO (In$_2$O$_3$+SnO$_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally 10$\mu$ or more from the points of fabrication and handling of the substrate as well as its mechanical strength.

Next, an example of the process for producing the light-receiving member of this invention is to be briefly described.

Figure 20:
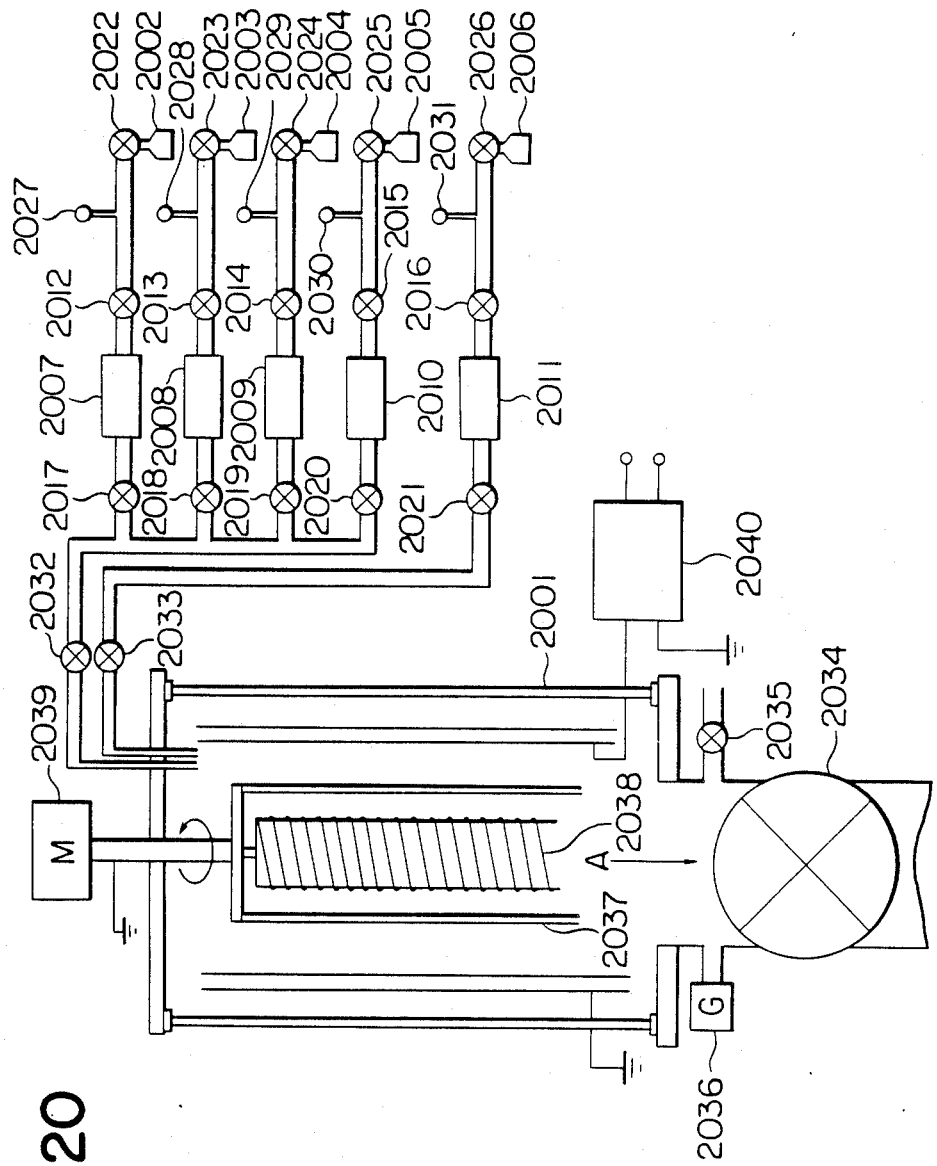
FIG. 20 is a schematic illustration of the vacuum deposition device for preparation of the light-receiving members employed in Examples.

FIG. 20 shows one example of a device for producing a light-receiving member.

In the gas bombs 2002 to 2006, there are hermetically contained starting gases for formation of the light-receiving member of the present invention. For example, 2002 is a bomb containing SiH$_4$ gas (purity 99.999%, hereinafter abbreviated as SiH$_4$), 2003 is a bomb contaiing GeH$_4$ gas (purity 99.999%, hereinafter abbreviated as GeH$_4$), 2004 is a bomb containing NO gas (purity 99.99%, hereinafter abbreviated as NO), 2005 is bomb containing B$_2$H$_6$ gas diluted with H$_2$ (purity 99.999%, hereinafter abbreviated as B$_2$H$_6$/H$_2$) and 2006 is a bomb containing H$_2$ gas (purity: 99.999%).

For allowing these gases to flow into the reaction chamber 2001, on confirmation of the valves 2022 to 2026 of the gas bombs 2002 to 2006 and the leak valve 2035 to be closed, and the inflow valves 2012 to 2016, the outflow valves 2017 to 2021 and the auxiliary valves 2032 and 2033 to be opened, the main valve 2034 is first opened to evacuate the reaction chamber 2001 and the gas pipelines. As the next step, when the reading on the vacuum indicator 2036 becomes 5×10$^{-6}$ Torr, the auxiliary valves 2032, 2033 and the outflow valves 2017 to 2021 are closed.

Referring now to an example of forming a light-receiving layer on the cylindrical substrate 2037, SiH$_4$ gas from the gas bomb 2002, GeH$_4$ gas from the gas bomb 2003, NO gas from the gas bomb 2004, B$_2$H$_6$/H$_2$ gas from the gas bomb 2005 and H$_2$ gas from the gas bomb 2006 are permitted to flow into the mass-flow controllers 2007, 2008, 2009, 2010 and 2011, respectively, by opening the valves 2022, 2023, 2024, 2025 and 2026 and controlling the pressures at the output pressure gauges 2027, 2028, 2029 2030 and 2031 to 1 Kg/cm$^2$ and opening gradually the inflow valves 2012, 2013, 2014, 2015 and 2016, respectively. Subsequently, the outflow valves 2017, 2018, 2019, 2020 and 2021 and the auxiliary valves 2032 and 2033 were gradually opened to permit respective gases to flow into the reaction chamber 2001. The outflow valves 2017, 2018, 2019, 2020 and 2021 are controlled so that the flow rate ratio of SiH$_4$ gas, GeH$_4$ gas, B$_2$H$_6$/H$_2$ gas, NO gas and H$_2$ may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distributed concentrations of germanium atoms and boron atoms to be contained in the layer formed by carrying out the operation to change gradually the openings of the valves 2018, 2020 by the manual method or by means of an externally driven motor, etc. thereby changing the flow rates of GeH$_4$ gas and B$_2$H$_6$ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valves 2019 or 2020, oxygen atoms or boron atoms may be contained or not, or oxygen atoms or boron atoms may be contained only in a part of the layer region of the respective layers.

When nitrogen atoms or carbon atoms are to be contained in place of oxygen atoms, layer formation may be conducted by replacing NO gas in the gas bomb 2004 with NH$_3$ or CH$_4$. Also, when the kinds of the gases employed are desired to be increased, bombs of desirable gases may be provided additionally before carrying out layer formation similarly. During layer formation, for uniformization of the layer formation, it is desirable to rotate the substrate 2037 by means of a motor 2039 at a constant speed.

The present invention is described in more detail by referring to the following Examples.

EXAMPLE 1

By means of a lathe, an aluminum substrate was worked to have the surface characteristic as shown in FIG. 21(B).

Next, by use of the deposition device shown in FIG. 20, following various procedures under the conditions as shown in Table 1A, a light-receiving member for electrophotography of A-Si type was deposited on the above aluminum substrate.

The surface condition of a light-receiving member for electrophotography thus prepared was as shown in FIG. 21(C).

Figure 26:
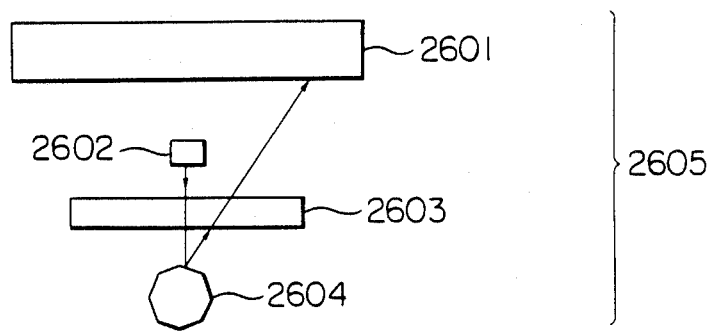
FIG. 26 is a schematic illustration of the image exposure device employed in Examples.
Figure 26:
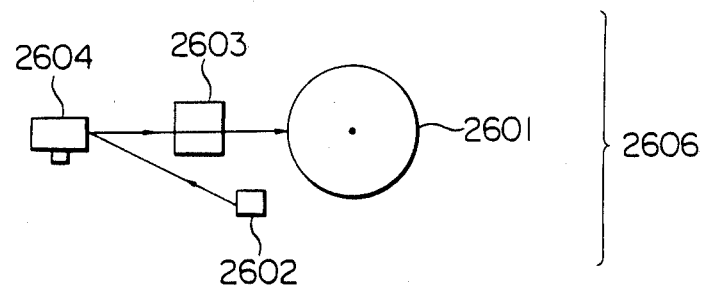

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 2

Figure 63:
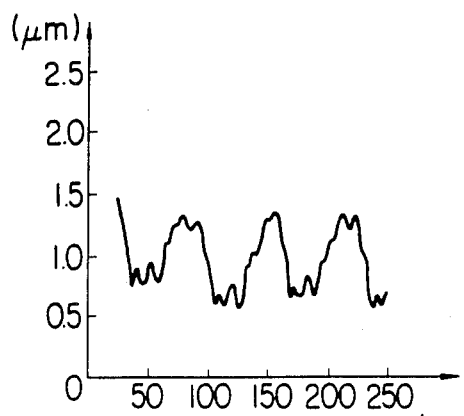
FIGS. 63 to 65 are illustrations of the surface states of the aluminum substrates employed in Examples.
Figure 64:
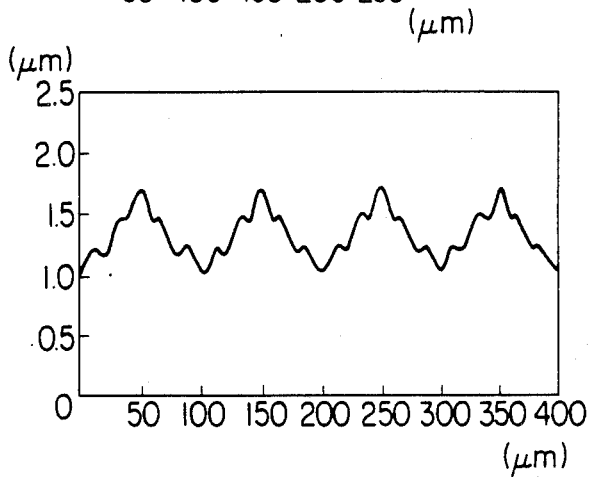
Figure 65:
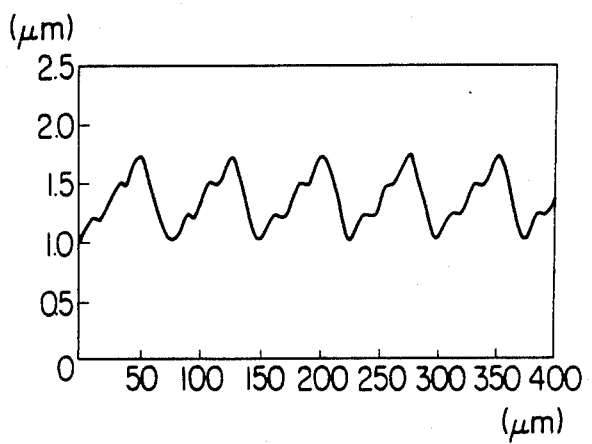

On cylindrical aluminum substrates having the surface characteristic as shown in FIGS. 63, 64 and 65, light-receiving members for electrophotography were prepared under the conditions as shown in Table 2A.

For these light-receiving members, by means of the device as in Example 1, image exposure was performed, followed by developing, transfer and fixing to obtain visible images on plain papers.

The images obtained were free from any interference fringe pattern, having practically satisfactory characteristics.

EXAMPLE 3

On cylindrical aluminum substrates having the surface characteristic as shown in FIGS. 63, 64 and 65, light-receiving members for electrophotography were prepared under the conditions as shown in Table 3A.

For these light-receiving members for electrophotography, by means of the device as in Example 1, image exposure was performed, followed by developing, transfer and fixing to obtain visible images on plain papers. Such an image forming process was repeated successively for 100,000 times.

In this case, in all of the images obtained, no interference fringe pattern was observed at all, thus giving practically satisfactory characteristics. Also, no difference was recognized at all between the images at the initial stage and the image after 100,000 times of copying, all being images of high quality.

EXAMPLE 4

On cylindrical aluminum substrates having the surface characteristic as shown in FIGS. 63, 64 and 65, light-receiving members for electrophotography were prepared under the conditions as shown in Table 4A.

For these light-receiving members, by means of the device as in Example 1, image exposure was performed, followed by developing, transfer and fixing to obtain visible images on plain papers.

The images obtained were free from any interference fringe pattern, having practically satisfactory characteristics.

EXAMPLE 5

By means of a lathe, an aluminum substrate (length (L): 357 mm, outer diameter (r): 80 mm) was worked as shown in FIG. 21(B).

Next, a light-receiving member for electrophotography of A-Si:H type was prepared following various procedures using the deposition device in FIG. 20 under the conditions as shown in Table 1B.

Figure 22:
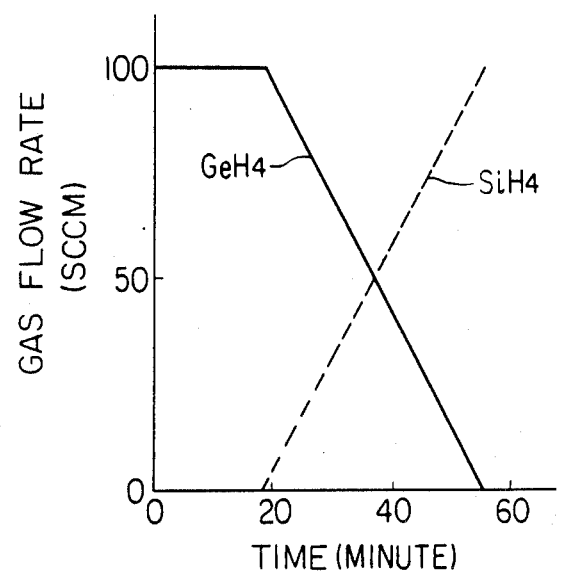
FIGS. 22 to 25, FIGS. 36 to 42, FIGS. 52 to 62 and FIGS. 66 to 82 each is a schematic illustration of the change in gas flow rate of respective gases in Examples.

The A-Si:Ge:H layer as the first layer was formed while controlling the flow rate of $GeH_4$ and $SiH_4$ as shown in FIG. 22 by operating mass flow controllers 2007 and 2008 for $GeH_4$ and $SiH_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 6

On cylindrical aluminum substrates having the surface characteristic as shown in FIGS. 63, 64 and 65, light receiving members for electrophotography were prepared under the conditions as shown in Table 1B.

Figure 23:
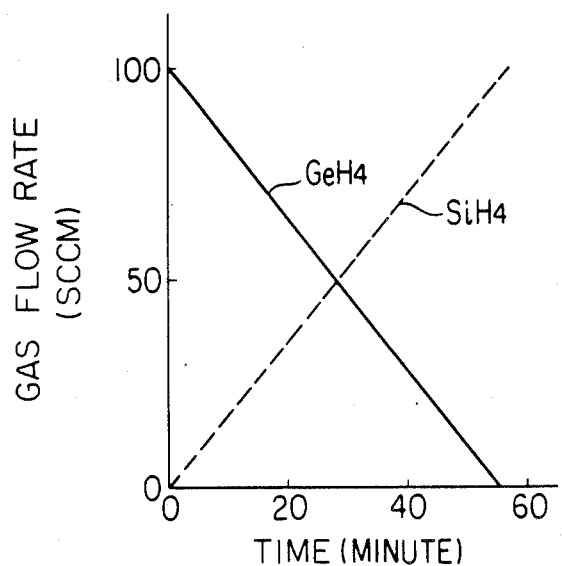

The A-Si:Ge:H layer as the first layer was formed while controlling the flow rate of $GeH_4$ and $SiH_4$ as shown in FIG. 23 by operating mass flow controllers 2007 and 2008 for $GeH_4$ and $SiH_4$, respectively, using a computer (HP9845B).

For these light-receiving members, by means of the device as in Example 5, image exposure was performed, followed by developing, transfer and fixing to obtain visible images on plain papers.

The images obtained were free from any interference fringe pattern, having practically satisfactory characteristics.

EXAMPLE 7

A light-receiving member for electrophotography was prepared on a cylindrical aluminum substrate which have the surface characteristic as shown in FIGS. 63, 64 and 65, under the conditions as shown in Table 2B.

Figure 24:
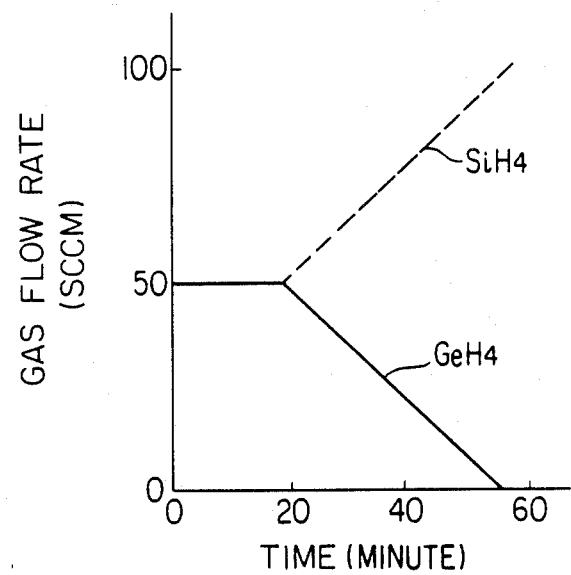

The A-Si:Ge:H layer as the first layer was formed while controlling the flow rate of $GeH_4$ and $SiH_4$ as shown in FIG. 24 by operating mass flow controllers 2007 and 2008 for $GeH_4$ and $SiH_4$, respectively, using a computer (HP9845B).

For these light-receiving members for electrophotography, by means of the device as in Example 5, image exposure was performed, followed by developing, transfer and fixing to obtain visible images on plain papers. Such an image forming process was repeated successively for 100,000 times.

In this case, in all of the images obtained, no interference fringe pattern was observed at all, thus giving practically satisfactory characteristics. Also, no difference was recognized at all between the images at the initial stage and the image after 100,000 times of copying, all being images of high quality.

EXAMPLE 8

On a cylindrical aluminum substrate, having the surface characteristic as shown in FIGS. 63, 64 and 65, a light-receiving member for electrophotography was prepared under the conditions as shown in Table 2B.

Figure 25:
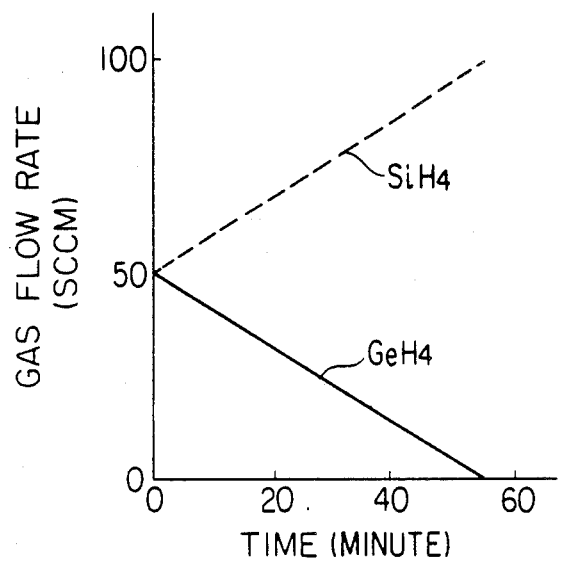

The A-Si:Ge:H layer as the first layer was formed while controlling the flow rate of GeH$_4$ and SiH$_4$ as shown in FIG. 25 by operating mass flow controllers 2007 and 2008 for GeH$_4$ and SiH$_4$, respectively, using a computer (HP9845B).

For these light-receiving members, by means of the device as in Example 5, image exposure was performed, followed by developing, transfer and fixing to obtain visible images on plain papers.

The images obtained were free from any interference fringe pattern, having practically satisfactory characteristics.

EXAMPLE 9

By means of a lathe, an aluminum substrate (length (L): 357 mm, outer diameter (r): 80 mm) was worked as shown in FIG. 21(B).

Next, by use of the deposition device shown in FIG. 20, following various procedures under the conditions as shown in Table 1C, a light-receiving member for electrophotography was prepared.

The surface condition of the light-receiving member for electrophotography of A-Si:H thus prepared was as shown in FIG. 21(C).

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 10

By means of a lathe, an aluminum substrate (length (L): 357 mm, outer diameter (r) 80 mm) was worked to have the characteristic as shown in FIGS. 63, 64 and 65.

Next, by use of the deposition device shown in FIG. 20, under the conditions as shown in Table 2C, a light-receiving member for electrophotography was prepared.

For these light-receiving members for electrophotography, image exposure was effected by means of an image exposure device as shown in FIG. 26 (wavelength of laser beam: 780 nm, spot diameter 80 $\mu$m), followed by developing and transfer, to obtain images. Such an image forming was repeated successively for 100,000 times.

In this case, in all of the images obtained, no interference fringe pattern was observed at all, thus giving practically satisfactory characteristics. Also, no difference was recognized at all between the images at the initial stage and the image after 100,000 times of copying, all being images of high quality.

EXAMPLE 11

By means of a lathe, an aluminum substrate (length (L): 357 mm, outer diameter (r) 80 mm) was worked to have the characteristic as shown in FIGS. 63, 64 and 65.

Next, by use of the deposition device shown in FIG. 20, under the conditions as shown in Table 3C, a light-receiving member for electrophotography was prepared.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 12

By means of a lathe, an aluminum substrate (length (L) 357 mm, outer diameter (r) 80 mm) was worked to have the characteristic as shown in FIGS. 63, 64 and 65.

Next, by use of the deposition device shown in FIG. 20, under the conditions as shown in Table 4C, a light-receiving member for electrophotography was prepared.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 13

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 5C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 14

By means of a lathe, an aluminum substrate (length (L): 357 mm, outer diameter (r); 80 mm) was worked as shown in FIGS. 63, 64 and 65.

Next, a light-receiving member for electrophotography of A-Si type was prepared following various procedures using the deposition device in FIG. 20 under the conditions as shown in Table 6C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 15

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 7C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 16

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 8C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 17

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 9C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 18

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 10C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 19

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 11C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 20

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 12C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 21

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 13C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 22

By means of a lathe, an aluminum substrate (length (L): 357 mm, outer diameter (r): 80 mm) was worked as shown in FIGS. 63, 64 and 65.

Next, a light-receiving member for electrophotography was prepared following various procedures using the deposition device in FIG. 20 under the conditions as shown in Table 14C.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 23

For examples 9 through 22, light-receiving members for electrophotography were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 9 through 24.

These light-receiving members for electrophotography were each subjected to image exposure by means of a device as shown in FIG. 26 (wavelength of laser beam: 780 nm, spot diameter 80 $\mu$m), followed by developing and transfer to obtain an image. Each image was free from any interference fringe pattern observed and proved to be satisfactory for practical application.

EXAMPLE 24

By means of a lathe, an aluminum substrate (length (L): 357 mm, outer diameter (r): 80 mm) was worked as shown in FIG. 21(B).

Next, a light-receiving member for electrophotography of A-Si type was prepared following various procedures using the deposition device in FIG. 20 under the conditions as shown in Table 1D.

The surface condition of a light-receiving member for electrophotography thus prepared was as shown in FIG. 21(C).

The A-Si:Ge:H:B layer as the first layer was formed while controlling the flow rate of GeH$_4$ and SiH$_4$ as shown in FIG. 22 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. Such an image forming process was repeated successively for 100,000 times.

In this case, in all of the images obtained, no interference fringe pattern was observed at all, thus giving practically satisfactory characteristics. Also, no difference was recognized at all between the images at the initial stage and the image after 100,000 times of copying, all being images of high quality.

EXAMPLE 25

By means of a lathe, an aluminum substrate (length (L): 357 mm, outer diameter (r): 80 mm) was worked as shown in FIG. 63.

Next, a light-receiving member for electrophotography of A-Si type was prepared following various procedures using the deposition device in FIG. 20 under the conditions as shown in Table 1D.

The A-Si:Ge:H:B layer as the first layer was formed while controlling the flow rate of GeH$_4$ and SiH$_4$ as shown in FIG. 23 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 26

By means of a lathe, an aluminum substrate (length (L): 357 mm, outer diameter (r): 80 mm) was worked as shown in FIG. 63.

Next, a light-receiving member for electrophotography of A-Si type was prepared following various procedures using the deposition device in FIG. 20 under the conditions as shown in Table 2D.

The A-Si:Ge:H:B layer as the first layer was formed while controlling the flow rate of GeH$_4$ and SiH$_4$ as shown in FIG. 22 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 27

By means of a lathe, an aluminum substrate (length (L): 357 mm, outer diameter (r): 80 mm) was worked as shown in FIG. 64.

Next, a light-receiving member for electrophotography of A-Si type was prepared following various procedures using the deposition device in FIG. 20 under the conditions as shown in Table 2D.

The A-Si:Ge:H:B layer as the first layer was formed while controlling the flow rate of GeH$_4$ and SiH$_4$ as shown in FIG. 23 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 28

By means of a lathe, an aluminum substrate (length (L): 357 mm, outer diameter (r): 80 mm) was worked as shown in FIG. 65.

Next, a light-receiving member for electrophotography was prepared following various procedures using the deposition device in FIG. 20 under the conditions as shown in Table 3D.

The A-Si:Ge:H:B layer as the first layer was formed while controlling the flow rate of GeH$_4$ and SiH$_4$ as shown in FIG. 22 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 29

By means of a lathe, an aluminum substrate (length (L): 357 mm, outer diameter (r): 80 mm) was worked as shown in FIG. 63.

Next, a light-receiving member for electrophotography of A-Si type was prepared following various procedures using the deposition device in FIG. 20 under the conditions as shown in Table 4D.

The A-Si:Ge:H:B layer as the first layer was formed while controlling the flow rate of GeH$_4$ and SiH$_4$ as shown in FIG. 24 by operating mass flow controllers 2007 and 2008 for GeH$_4$ and SiH$_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 30

By means of a lathe, an aluminum substrate (length (L): 357 mm, outer diameter (r): 80 mm) was worked as shown in FIG. 64.

Next, a light-receiving member for electrophotography was prepared following various procedures using the deposition device in FIG. 20 under the conditions as shown in Table 5D.

The A-Si:Ge:H layer as the first layer was formed while controlling the flow rate of $GeH_4$ and $SiH_4$ as shown in FIG. 25 by operating mass flow controllers 2007 and 2008 for $GeH_4$ and $SiH_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 31

By means of a lathe, an aluminum substrate (length (L): 357 mm, outerdiameter (r): 80 mm) was worked as shown in FIG. 65.

Next, a light-receiving member for electrophotography was prepared following various procedures using the deposition device in FIG. 20 under the conditions as shown in Table 6D.

The A-Si:Ge:H:B layer as the first layer was formed while controlling the flow rate of $GeH_4$ and $SiH_4$ as shown in FIG. 23 by operating mass flow controllers 2007 and 2008 for $GeH_4$ and $SiH_4$, respectively, using a computer (HP9845B).

The light-receiving member for electrophotography as prepared above was subjected to image exposure by means of a device as shown in FIG. 26 (wavelength of laser beam: 780 nm, spot diameter 80 um), followed by developing and transfer to obtain an image. The image was free from any interference fringe pattern observed and proved to be satisfactory for practical application.

EXAMPLE 32

For Examples 24 through 31, light-receiving members for electrophotography were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 24 through 31.

These light-receiving members for electrophotography were each subjected to image exposure by means of a device as shown in FIG. 26 (wavelength of laser beam: 780 nm, spot diameter 80 μm), followed by developing and transfer to obtain an image. Each image was free from any interference fringe pattern observed and proved to be satisfactory for practical application.

EXAMPLE 33

Figure 21:
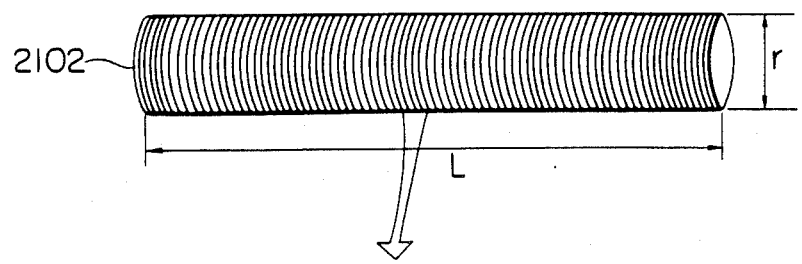
FIGS. 21(A), (B) and (C) are schematic illustrations of the surface states of the aluminum substrates employed in Examples.
Figure 21:
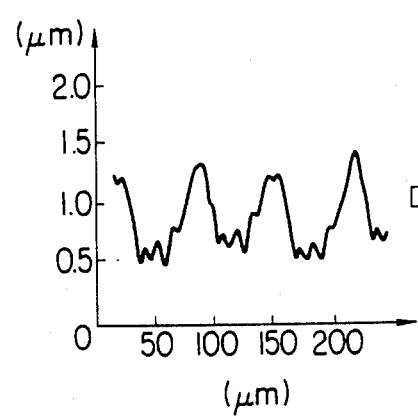
Figure 21:
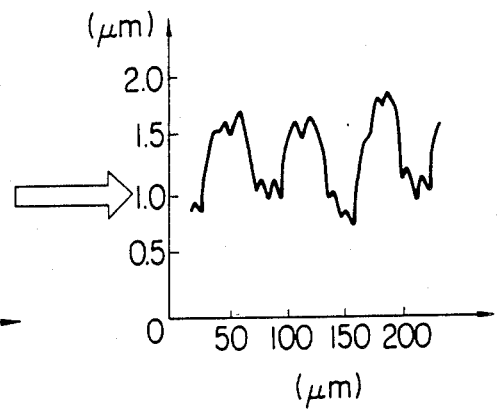

By means of a lathe, an aluminum substrate was worked to have the surface characteristics of FIG. 21 (B).

Next, by use of the deposition device shown in FIG. 20, following various procedures under the conditions as shown in Table 1E, a light-receiving member for electrophotography of A-Si type was deposited on the above aliminum substrate.

The surface condition of the light-receiving member for electrophotography of A-Si type thus prepared was measured to obtain results as shown in FIG. 21(C).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 34

By means of a lathe, an aluminum substrate was worked by the same manner as in Example 33 to have the surface characteristic of FIG. 63.

Next, by use of the deposition device shown in FIG. 20, following the same procedures as in Example 33 under the conditions as shown in Table 2E, a light-receiving member for electrophotography of A-Si type was deposited on the above aluminum substrate.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 35

By means of a lathe, an aluminum substrate was worked by the same manner as in Example 33 to have the surface characteristic of FIG. 64.

Next, by use of the deposition device shown in FIG. 20, following the same procedures as in Example 33 under the conditions as shown in Table 3E, a light-receiving member for electrophotography of A-Si type was deposited on the above aluminum substrate.

The light-receiving member for electrophotography as prepared above was subjected to image exposure by means of a device as shown in FIG. 26 (wavelength of laser beam: 780 nm, spot diameter 80 um), followed by developing and transfer to obtain an image. The image was free from any interference fringe pattern observed and proved to be satisfactory for practical application.

EXAMPLE 36

By means of a lathe, an aluminum substrate was worked by the same manner as in Example 33 to have the surface characteristic of FIG. 65.

Next, by use of the deposition device shown in FIG. 20, following the same procedures as in Example 33 under the conditions as shown in Table 4E, a light-receiving member for electrophotography of A-Si type was deposited on the above aluminum substrate.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 37

By means of a lathe, an aluminum substrate (length (L): 357 mm, outerdiameter (r): 80 mm) was worked as shown in FIG. 63.

Next, a light-receiving member for electrophotography was prepared following various procedures using the deposition device in FIG. 20 under the conditions as shown in Table 5E.

Figure 60:
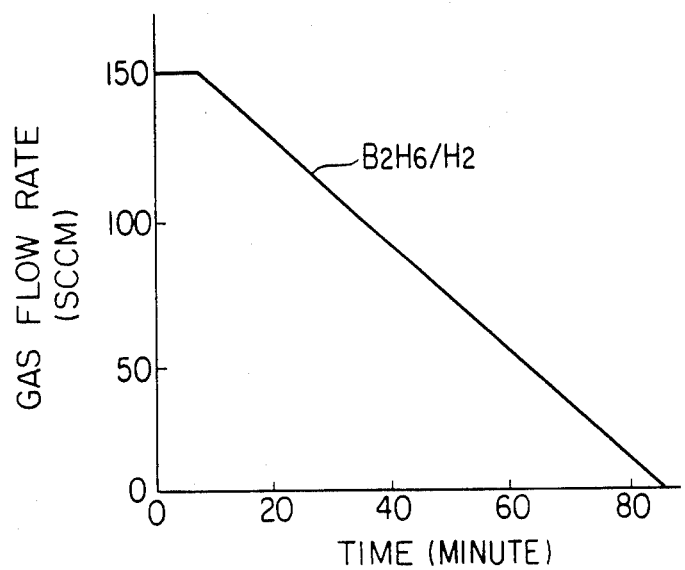

The boron-containing layer was formed while controlling the flow rate of $B_2H_6/H_2$ as shown in FIG. 60 by operating mass flow controller 2010 for $B_2H_6/H_2$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 38

By means of a lathe, an aluminum substrate (length (L): 357 mm, outerdiameter (r): 80 mm) was worked as shown in FIG. 64.

Next, a light-receiving member for electrophotography of A-Si type was prepared following various procedures using the deposition device in FIG. 20 under the conditions as shown in Table 6E.

Figure 61:
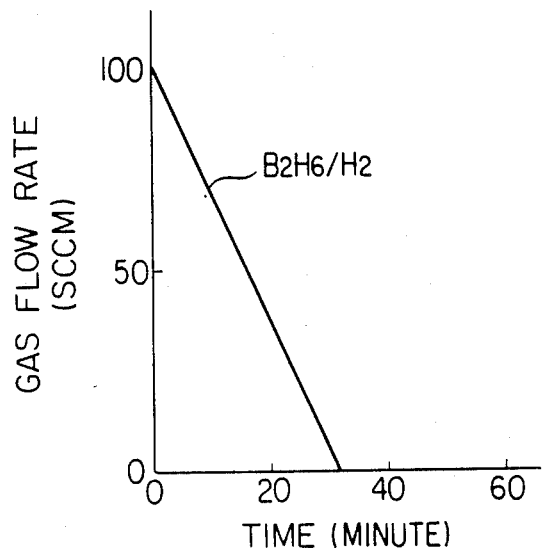
Figure 62:
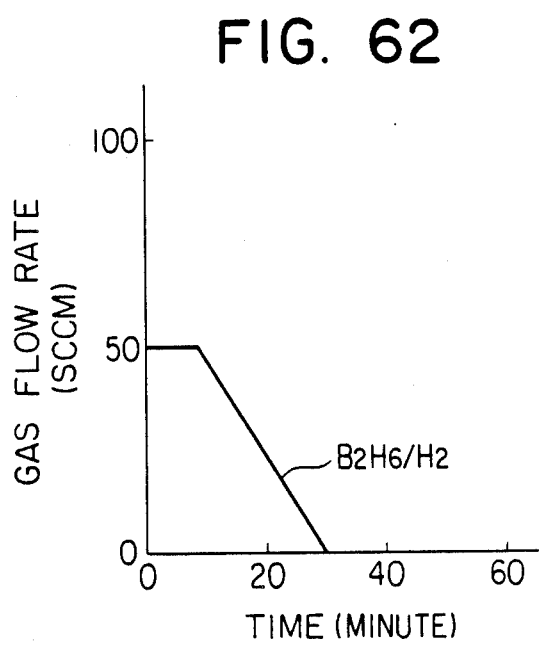

The boron-containing layer was formed while controlling the flow rate of $B_2H_6/H_2$ as shown in FIG. 61 by operating mass flow controller 2010 for $B_2H_6/H_2$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 39

By means of a lathe, an aluminum substrate (length (L): 357 mm, outerdiameter (r): 80 mm) was worked as shown in FIG. 65.

Next, a light-receiving member for electrophotography was prepared following various procedures using the deposition device in FIG. 20 under the conditions as shown in Table 7E.

Figure 69:
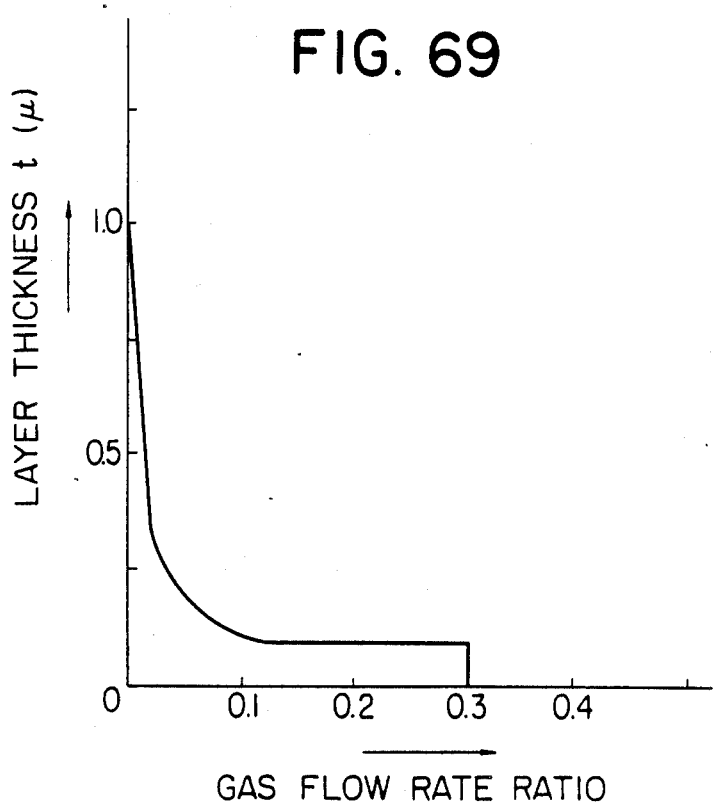

The boron-containing layer was formed while controlling the flow rate of $B_2H_6/H_2$ as shown in FIG. 69 by operating mass flow controller 2010 for $B_2H_6/H_2$ using a computer (HP9845B).

The light-receiving member for electrophotography as prepared above was subjected to image exposure by means of a device as shown in FIG. 26 (wavelength of layer beam: 780 nm, spot diameter 80 μm), followed by developing and transfer to obtain an image. The image was free from any interference fringe pattern observed and proved to be satisfactory for practical application.

EXAMPLE 40

By means of a lathe, an aluminum substrate (length (L): 357 mm, outerdiameter (r): 80 mm) was worked as shown in FIG. 63.

Next, a light-receiving member for electrophotography was prepared following various procedures using the deposition device in FIG. 20 under the conditions as shown in Table 8E.

Figure 81:
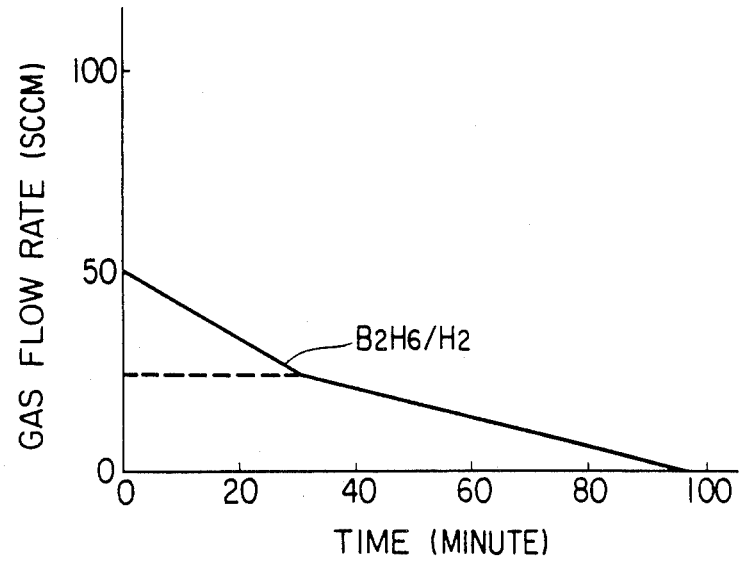

The boron-containing layer was formed while controlling the flow rate of $B_2H_6/H_2$ as shown in FIG. 81 by operating mass flow controller 2010 for $B_2H_6/H_2$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 41

For Examples 33 through 40, light-receiving members for electrophotography were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 33 through 40.

These light-receiving members for electrophotography were each subjected to image exposure by means of a device as shown in FIG. 26 (wavelength of laser beam: 780 nm, spot diameter 80 μm), followed by developing and transfer to obtain an image. Each image was free from any interference fringe pattern and proved to be satisfactory for practical application.

EXAMPLE 42

By means of a lathe, an aluminum substrate (length (L): 357 mm, outerdiameter (r): 80 mm) shown in FIG. 21(A) was wroked as shown in FIG. 21(B).

Next, a light-receiving member for electrophotography of A-Si type was prepared following various procedures using the deposition device in FIG. 20 under the conditions as shown in Table 1F.

Figure 36:
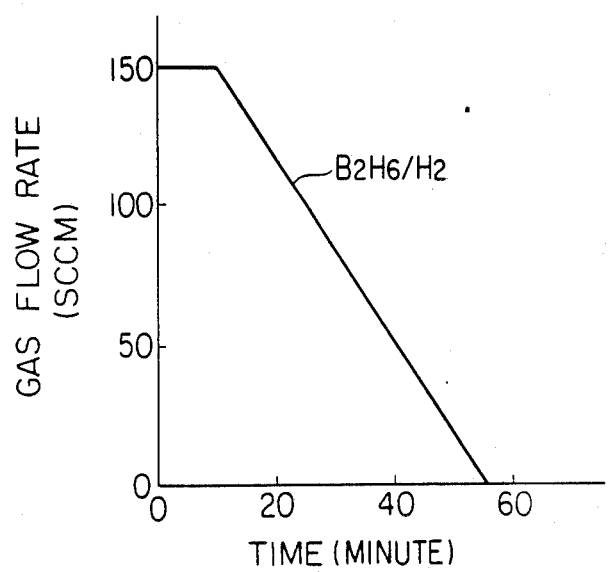

The first layer was formed while controlling each flow rate of $GeH_4$, $SiH_4$ and $B_2H_6/H_2$ as shown in FIGS. 22 and 36 by operating mass flow controllers 2007, 2008 and 2010 using a computer (HP9845B).

The surface condition of the light-receiving members thus prepared was as shown in FIG. 21(C).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 43

By means of a lathe, an aluminum substrate (length (L); 357 mm, outerdiameter (r): 80 mm) was worked as shown in FIG. 63.

Next, a light-receiving member for electrophotography of A-Si type was prepared following various procedures using the deposition device in FIG. 20 under the conditions as shown in Table 1F.

Figure 37:
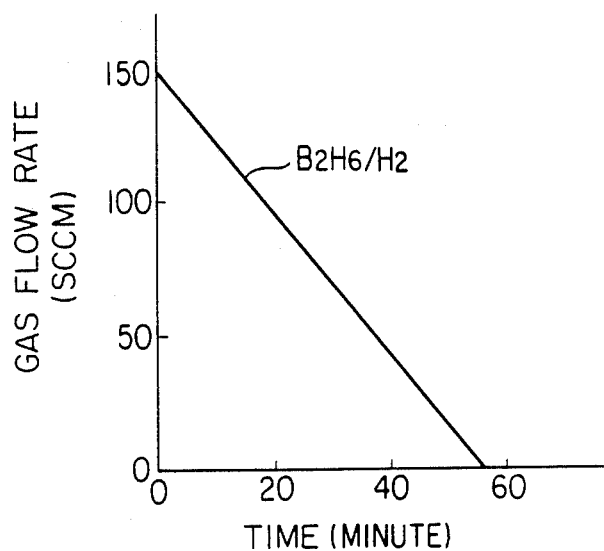

The first layer was formed while controlling each flow rate of $GeH_4$, $SiH_4$ and $B_2H_6/H_2$ as shown in FIGS. 23 and 37 be operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 44

By means of a lathe, an aluminum substrate (length (L): 357 mm, outerdiameter (r): 80 mm) was worked as shown in FIG. 64.

Next, a light-receiving member for electrophotography, of A-Si type was prepared following various procedures using the deposition device in FIG. 20 under the conditions as shown in Table 2F.

Figure 38:
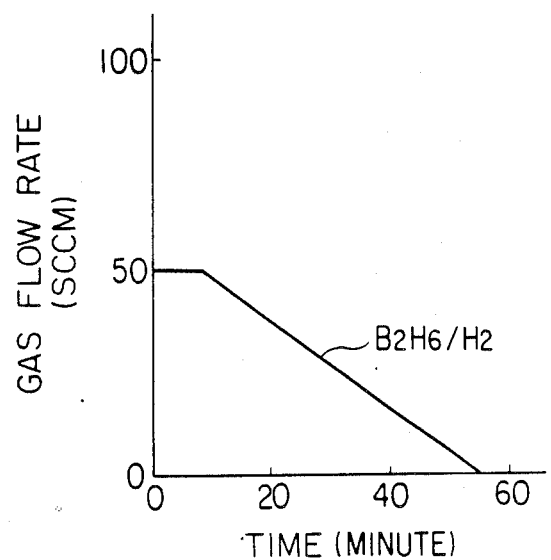

The first layer was formed while controlling each flow rate of $GeH_4$, $SiH_4$ and $B_2H_6/H_2$ as shown in FIGS. 24 and 38 by operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 45

By means of a lathe, an aluminum substrate (length (L): 357 mm, outerdiameter (r): 80 mm) was worked as shown in FIG. 65.

Next, a light-receiving member for electrophotography of A-Si type was prepared following various procedures using the deposition device in FIG. 20 under the conditions as shown in Table 2F.

Figure 39:
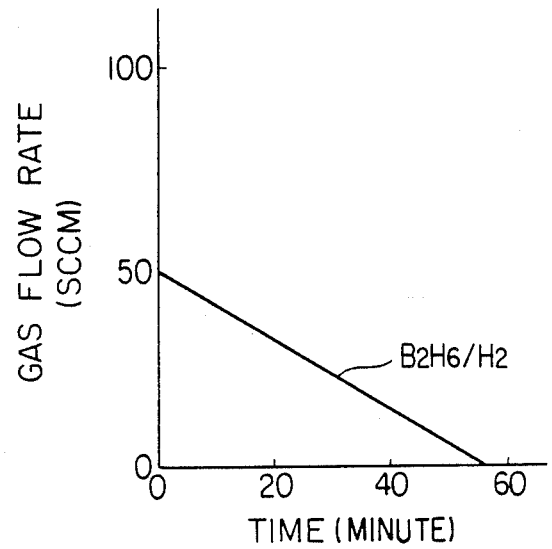

The first layer was formed while controlling each flow of $GeH_4$, $SiH_4$ and $B_2H_6/H_2$ as shown in FIGS. 25 and 39 by operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 46

By means of a lathe, an aluminum substrate (length (L): 357 mm, outerdiameter (r): 80 mm) was worked as shown in FIG. 63.

Next, a light-receiving member for electrophotography was prepared following various procedures using the deposition device in FIG. 20 under the conditions as shown in Table 3F.

Figure 40:
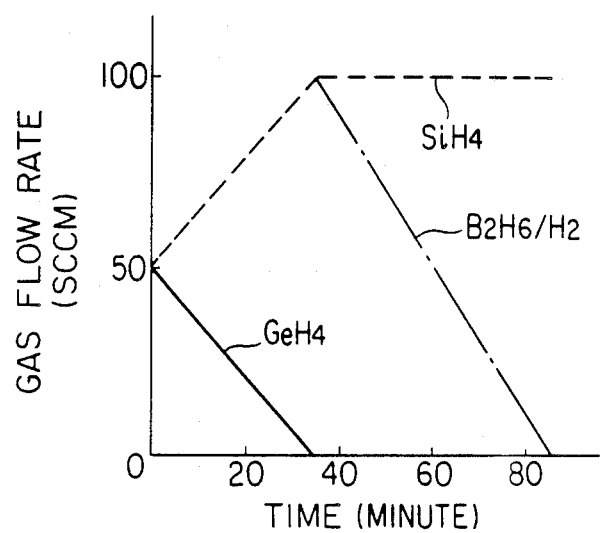

The first layer and the A layer were formed while controlling each flow rate of $GeH_4$, $SiH_4$ and $B_2H_6/H_2$ as shown in FIG. 40 by operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 47

By means of a lathe, an aluminum substrate (length (L): 357 mm, outerdiameter (r): 80 mm) was worked as shown in FIG. 64.

Next, a light-receiving member for electrophotography was prepared following various procedures using the deposition device in FIG. 20 under the conditions as shown in Table 4F.

Figure 41:
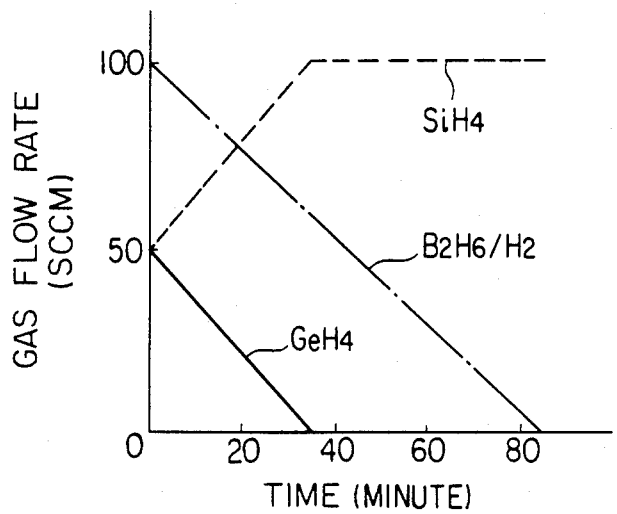

The first layer and the A layer were formed while controlling the flow rate of $GeH_4$, $SiH_4$ and $B_2H_6/H_2$ as shown in FIG. 41 by operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 48

By means of a lathe, an aluminum substrate (length (L): 357 mm, outerdiameter (r): 80 mm) was worked as shown in FIG. 65.

Next, a light-receiving member for electrophotography was prepared following various procedures using the deposition device in FIG. 20 under the conditions as shown in Table 5F.

Figure 42:
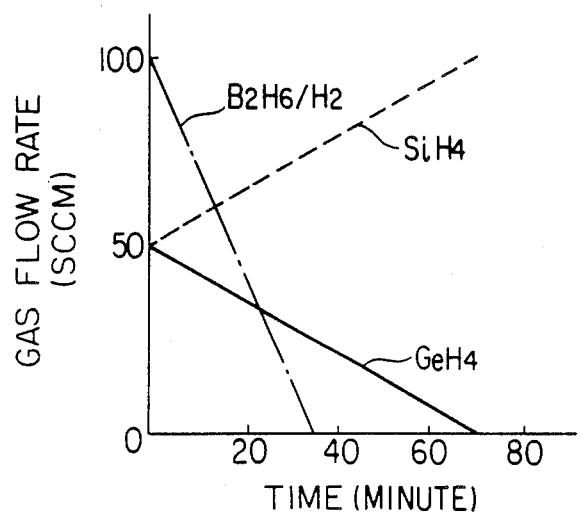

The first layer and the A layer were formed while controlling the flow rate of $GeH_4$, $SiH_4$ and $B_2H_6/H_2$ as shown in FIG. 42 by operating mass flow controllers 2007, 2008 and 2010 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 49

In this Example, a semiconductor laser (wavelength: 780 nm) with a spot size of 80 μm was employed. Thus, a cylindrical aluminum substrate [length (L) 357 mm, outerdiameter (r) 80 mm] on which A-Si:H is to be deposited, having the surface characteristic as shown in FIG. 21(B) was prepared.

Next, a light-receiving member for electrophotography of A-Si type was prepared following various procedures using the film deposition device in FIG. 20 under the conditions as shown in Table 1aG.

Then, by setting the mass flow controllers so that the flow rate of NO gas may be 3.4 vol. % in an initial value relative to the sum total of $SiH_4$ gas flow rate and $GeH_4$ gas flow rate, NO gas was introduced.

The surface condition of the light-receiving members for electrophotography of A-Si:H thus prepared was as shown in FIG. 21(C).

These light-receiving members for electrophotography were each subjected to image exposure by means of a device as shown in FIG. 26 using a semiconductor laser (wavelength of laser beam: 780 nm, spot diameter 80 μm), followed by developing and transfer to obtain an image. Each image was free from any interference fringe pattern observed and there could be obtained a member exhibiting practically satisfactory electrophotographic characteristics.

EXAMPLE 50

The surfaces of cylindrical aluminum substrates wcre worked by a lathe as shown in FIGS. 64 and 65. On these aluminum substrates were prepared light-receiving members for electrophotography under the same conditions as in Example 49.

For light-receiving member for electrophotography as prepared above, image exposure was effected with a semiconductor laser of wavelength 780 nm at a spot diameter of 80 μm by means of the device as shown in FIG. 26, similarly as in Example 49 to obtain an image. In the image, no interference fringe pattern was observed to give a produce exhibiting electrophotographic characteristics acceptable in practical application.

EXAMPLE 51

Light-receiving members were prepared under the same conditions as in Example 50 except for the following points. The first layer was made to have a thickness of 10 μm.

For these light-receiving members, image exposure was conducted in the same image exposure device as in Example 49 to obtain an image. In this image, no interference fringe pattern was observed to give a member exhibiting electrophotographic characteristics acceptable in practical application.

EXAMPLE 52

On cylindrical aluminum substrates having the surface characteristics as shown in FIGS. 64 and 65, a light-receiving member was prepared under the conditions as shown in Table 1G.

The cross-sections of the light receiving members prepared under the above conditions were observed by an electron microscope. The average layer thickness of the first layer at the center and both ends of the cylinder was 0.09 μm. The average layer thickness of the second layer was 3 μm at the center and both ends of the cylinder.

For these light-receiving members, image exposure was conducted in the same image exposure device as in Example 49 to obtain an image. In this image, no interference fringe pattern was observed and there could be obtained a member exhibiting practically satisfactory electrophotographic characteristics. EXAMPLE 53

On cylindrical aluminum substrates having the surface characteristicsas shown in FIGS. 64 and 65, a light-receiving member was prepared under the condition as shown in Table 2G.

When these light-receiving members were subjected to image exposure with laser beam similarly as described in Example 49, no interference fringe pattern was observed in the image, and there could be obtained a member exhibiting practically satisfactory electrophotographic characteristics.

EXAMPLE 54

On cylindrical aluminum substrates having the surface characteristics as shown in FIGS. 64 and 65, a light-receiving member was prepared under the conditions shown in Table 3G.

When these light-receiving members were subjected to image exposure with laser beam similarly as described in Example 49, no interference fringe pattern was observed and there could be obtained a member exhibiting practically satisfactory electrophotographic characteristics.

EXAMPLE 55

On cylindrical aluminum substrates having the surface characteristics as shown in FIGS. 64 and 65, a light-receiving member was prepared under the conditions as shown in Table 4G.

When these light-receiving members were subjected to image exposure with laser beam similarly as described in Example 49, no interference fringe pattern was observed and there could be obtained a member exhibiting practically satisfactory electrophotographic characteristics.

EXAMPLE 56

Light-receiving members were prepared under the same conditions as in Example 49 except for the following points. The first layer was formed while changing the flow rate ratio of NO gas to the sum total of $SiH_4$ gas and $GeH_4$ gas following the change rate curve as shown in Example 49 until it became zero on completion of layer preparation.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be sufficiently good electrophotographic characteristics for practical application.

EXAMPLE 57

The surfaces of cylindrical aluminum substrates were worked by a lathe as shown in FIGS. 64 and 65. On these aluminum substrates were prepared light-receiving members for electrophotography under the same conditions as in Example 56.

For these light-receiving members for electrophotography as prepared above, image exposure was effected with a semiconductor laser of wavelength 780 nm at a spot diameter of 80 μm by means of the device as shown in FIG. 26, similarly as in Example 56, to obtain an image. In the image, no interference fringe pattern was observed to give a produce exhibiting electrophotographic characteristics acceptable in practical application.

EXAMPLE 58

Light-receiving members were prepared under the same conditions as in Example 57 except for the following points. The first layer was made to have a thickness of 10 μm.

For these light-receiving members, image exposure was conducted in the same image exposure device as in Example 49 to obtain an image. In this image, no interference fringe pattern was observed to give a member exhibiting electrophotographic characteristics acceptable in practical application.

EXAMPLE 59

On cylindrical aluminum substrates having the surface characteristicsas shown in FIGS. 64 and 65, light-receiving members were prepared under the conditions as shown in Table 5G.

When these light-receiving members were subjected to image exposure with laser beam similarly as described in Example 49, the image was free from any interference fringe pattern observed and proved to be sufficiently good electrophotographic characteristics for practical application.

EXAAMPLE 60

On cylindrical aluminum substrate having the surface characteristicsas shown in FIGS. 64 and 65, light-receiving members were prepared under the conditions as shown in Table 6G.

When these light-receiving members were subjected to image exposure with laser beam similarly as described in Example 49, the image was free from any interference fringe pattern observed and proved to be sufficiently good electrophotographic characteristics for practical application.

EXAMPLE 61

On cylindrical aluminum substrates having the surface characteristics as shown in FIGS. 64 and 65, light-receiving members were prepared under the conditions as shown in Table 7G.

When these light-receiving members were subjected to image exposure with laser beam similarly as described in Example 49, the image was free from any interference fringe pattern observed and proved to be sufficiently good electrophotographic characteristics for practical application.

EXAMPLE 62

On cylindrical aluminum substrates having the surface characteristics as shown in FIGS. 64 and 65, light-receiving members were prepared under the conditions as shown in Table 8G.

When these light-receiving members were subjected to image exposure with laser beam similarly as described in Example 49, the image was free from any interference fringe pattern observed and proved to be sufficiently good electrophotographic characteristics for practical application.

EXAMPLE 63

By means of the preparation device shown in FIG. 20, respective light-receiving members for electrophotography were prepared by carrying out layer formation on cylindrical aluminum substrates (Cylinder B) under the respective conditions as shown in Table 9G to Table 12G while changing the gas flow rate ratio of NO to $SiH_4$ according to the change rate curve of the gas flow rate ratio as shown in FIG. 66 to FIG. 69 with lapse of time for layer formation.

The thus prepared light receiving members were subjected to evaluation of characteristics, following the same conditions and the same procedure as in Example 49. As the result, in each sample, no interference fringe pattern was observed at all with naked eyes, and sufficiently good electrophotographic characteristics could be exhibited as suited for the object of the present invention.

EXAMPLE 64

Figure 66:
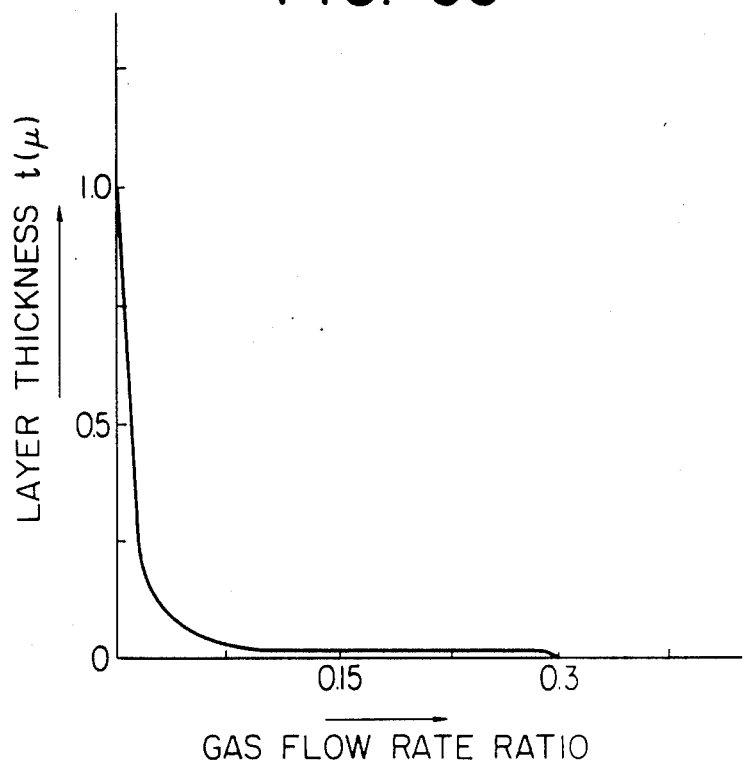
Figure 67:
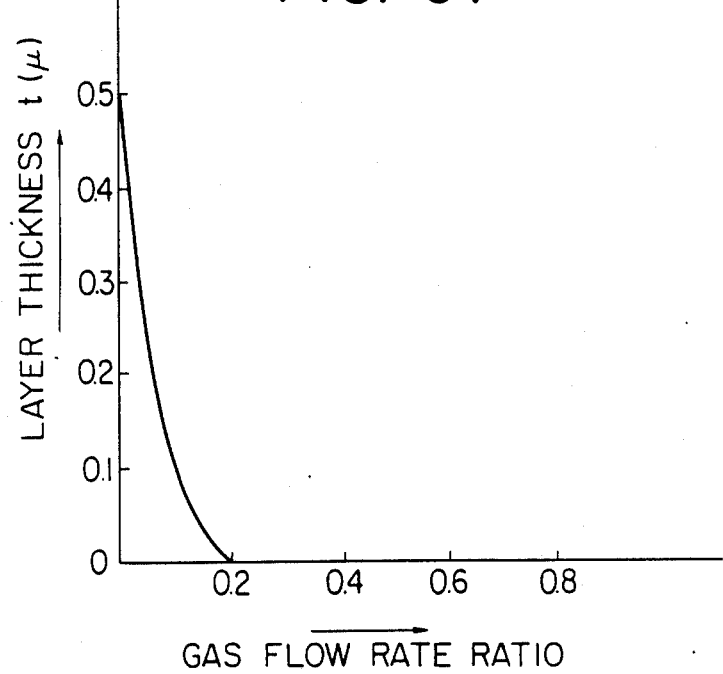

By means of the preparation device shown in FIG. 20, a light-receiving member for electrophotography was prepared by carrying out layer formation on cylindrical aluminum substrates (Cylinder B) under the respective conditions as shown in Table 13G while changing the gas flow rate ratio of NO to $SiH_4+GeH_4$ according to the change rate curve of the gas flow rate ratio as shown in FIG. 66 with lapse of time for layer formation.

The thus prepared light-receiving member was subjected to evaluation of characteristics, following the same conditions and the same procedure as in Example 49. As the result, in the sample, no interference fringe pattern was observed at all with naked eyes, and sufficiently good electrophotographic characteristics could be exhibited as suited for the object of the present invention.

EXAMPLE 65

Figure 68:
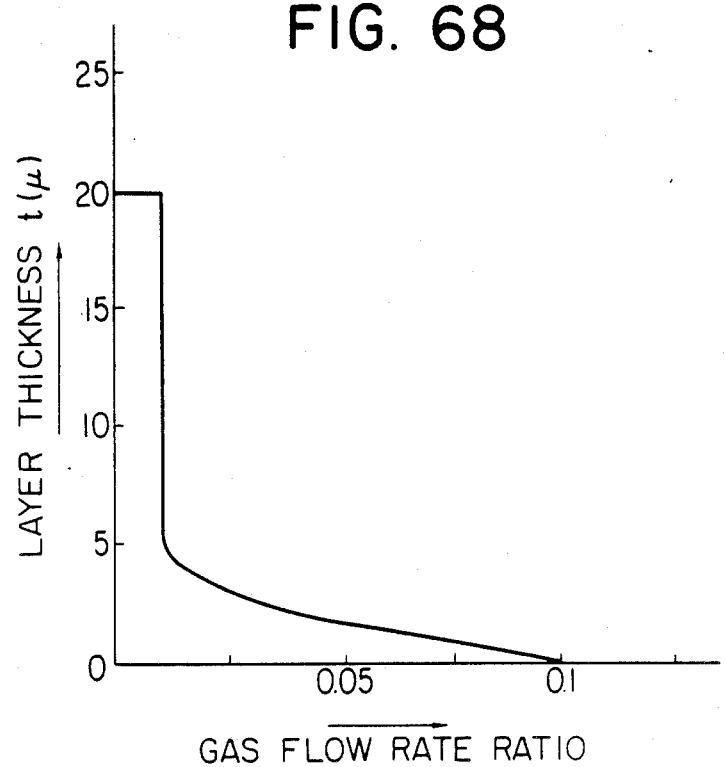

By means of the preparation device shown in FIG. 20, respective light-receiving members for electrophotography were prepared by carrying out layer formation on cylindrical aluminum substrates (Cylinder B) under the respective conditions as shown in Table 14G to Table 15G while changing the gas flow rate ratio of $NH_3$ to $SiH_4+GeH_4$ and $CH_4$ to $SiH_4+GeH_4$ according to the change rate curve of the gas flow rate ratio as shown in FIG. 68 with lapse of time for layer formation.

The thus prepared light-receiving members were subjected to evaluation of characteristics, following the same conditions and the same procedure as in Example 49. As the result, in each sample, no interference fringe pattern was observed at all with naked eyes, and sufficiently good electrophotographic characteristics could be exhibited as suited for the object of the present invention.

EXAMPLE 66

By means of a lathe, an aluminum substrate (length (L): 357 mm, outerdiameter (r): 80 mm) was worked to have the surface characteristics as shown in FIG. 21(B).

Next, a light-receiving member for electrophotography of A-Si was following various procedures using the deposition device in FIG. 20 under the conditions as shown in Table 1H.

The first layer was formed while controlling the flow rate of $GeH_4$ and $SiH_4$ as shown in FIG. 22 by operating mass flow controllers 2007 and 2008 using a computer (HP9845B).

The surface condition of the light-receiving members thus prepared was as shown in FIG. 21(C). In this case, the difference of average layer thickness was 2 μm between center and both ends of the aluminum substrate.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 67

A light-receiving member for electrophotography of A-Si was prepared following various procedures using the film deposition device in FIG. 20 by the same manner as in Example 66 except for under the conditions as shown in Table 2H.

The first layer was formed while controlling the flow rate of $GeH_4$ and $SiH_4$ as shown in FIG. 23 by operating mass flow controllers 2007 and 2008 using a computer (HP9845B).

The light-receiving member for electrophotography as prepared above was subjected to image exposure as same as in Example 66 by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 68

A light-receiving member for electrophotography of A-Si was prepared following various procedures using the film deposition device in FIG. 20 by the same manner as in Example 66 except for under the conditions as shown in Table 3H.

The first layer was formed while controlling the flow rate of $GeH_4$ and $SiH_4$ as shown in FIG. 24 by operating mass flow controllers 2007 and 2008, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 69

By means of a lathe, three kinds of aluminum substrates (length (L): 357 mm, outerdiameter (r): 80 mm) were worked to have the surface characteristics as shown in FIG. 21(B), FIG. 64 and FIG. 65.

Next, a light-receiving member for electrophotography of A-Si type was prepared following various procedures using the film deposition device in FIG. 20 by the same manner as in Example 66 except for under the conditions as shown in Table 4H.

The first layer was formed while controlling the flow rate of $GeH_4$ and $SiH_4$ as shown in FIG. 25 by operating mass flow controllers 2007 and 2008, using a computer (HP9845B).

The light-receiving members for electrophotography as prepared above are subjected to image exposure as same as Example 66 by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 70

Following the same conditions and procedure as in Example 69 except for changing $NH_3$ gas employed in Example 69 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 71

Following the same conditions and procedure as in Example 69 except for changing $NH_3$ gas employed in Example 69 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 72

Figure 70:
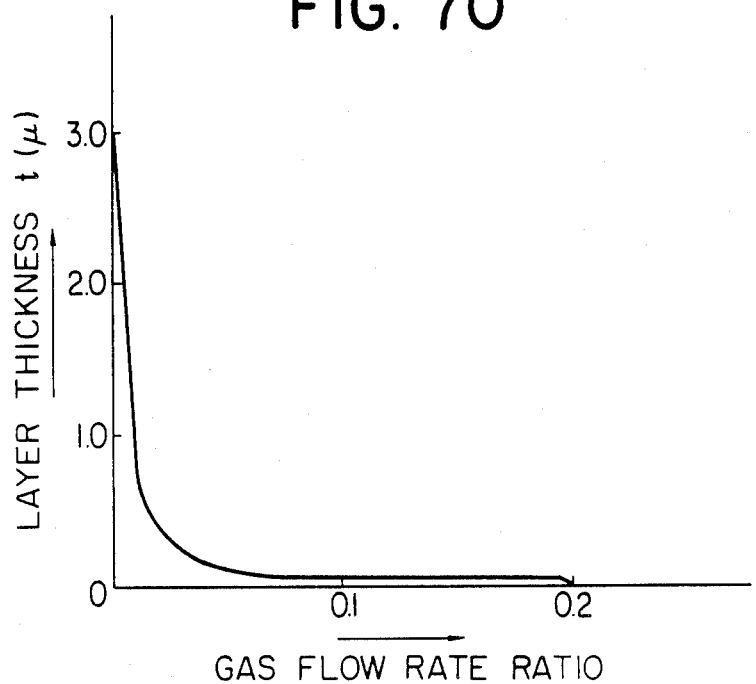

An aluminum substrate (Length (L): 357 mm, outerdiameter (r): 80 mm) was worked by a lathe to have the surface characteristic as shown in FIG. 21(B) and by means of the film deposition device shown in FIG. 20, a light-receiving member for electrophotography was prepared following the same conditions as in Example 66 except for carrying out layer formation on cylindrical aluminum substrates under the conditions as shown in Table 5H while changing the gas flow rate ratio of NO according to the change rate curve of the gas flow rate ratio as shown in FIG. 70 with lapse of time for layer formation.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 73

Figure 71:
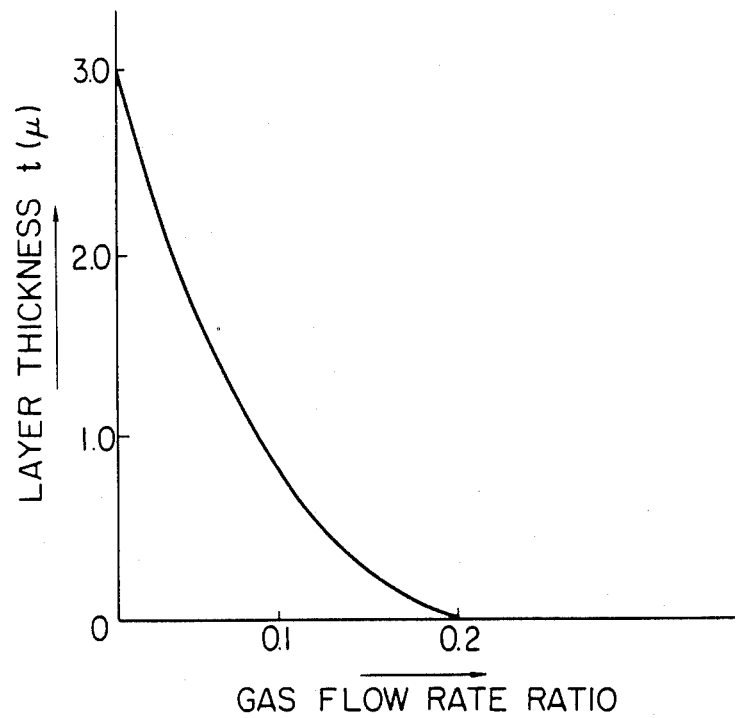

By means of a lathe, an aluminum substrate (length (L): 357 mm, outerdiameter (r): 80 mm) was worked to have the surface characteristics shown in FIG. 21(B). By means of the film deposition device shown in FIG. 20, a light-receiving member for electrophotography was prepared following the same conditions as in Example 66 except for carrying out layer formation on cylindrical aluminum substrate under the conditions as shown in Table 6H while changing the gas flow rate ratio of $NH_3$ according to the change rate curve of the gas flow rate ratio as shown in FIG. 71 with lapse of time for layer formation.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 74

By means of a lathe, an aluminum substrate (length (L): 357 mm, outerdiameter (r): 80 mm) was worked to have the surface characteristics as shown in FIG. 21(B).

Figure 58:
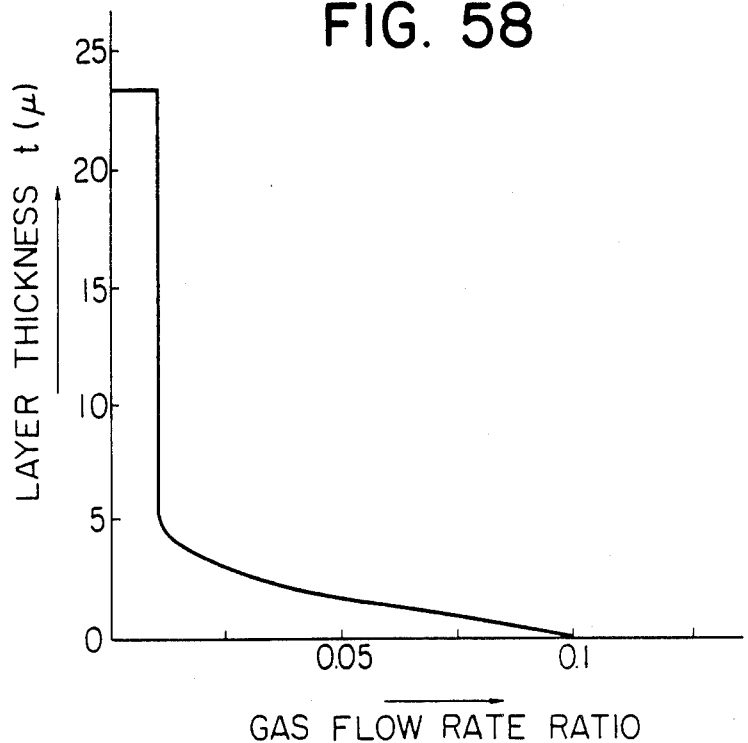

By means of the film deposition devcie shown in FIG. 20, a light-receiving member for electrophotography was prepared following the same conditions as in Example 66 except for carrying out layer formation on cylindrical aluminum substrate under the conditions as shown in Table 7H while changing the gas flow rate ratio of NO according to the change rate curve of the gas flow rate ratio as shown in FIG. 58 with lapse of time for layer formation.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 75

Following the same conditions and procedure as in Example 74 except for changing NO gas employed in Example 74 to $NH_3$ gas, a light-receiving member for electrophotography of A-Si type was prepared The light-receiving member for electrophotography as prepared above was subjected to image exposure by means of a device as shown in FIG. 26 (wavelength of laser beam: 780 nm, spot diameter 80 um), followed by developing and transfer to obtain an image. The image was free from any interference fringe pattern observed and proved to be satisfactory for practical application.

EXAMPLE 76

Following the same conditions and procedure as in Example 74 except for changing NO gas employed in Example 74 to $CH_4$ gas, a light-receiving member for electrophotography of A-Si type was prepared The light-receiving member for electrophotography as prepared above was subjected to image exposure by means of a device as shown in FIG. 26 (wavelength of laser beam: 780 nm, spot diameter 80 μm) followed by developing and transfer to obtain an image. The image was free from any interference fringe pattern observed and proved to be satisfactory for practical application.

EXAMPLE 77

Figure 72:
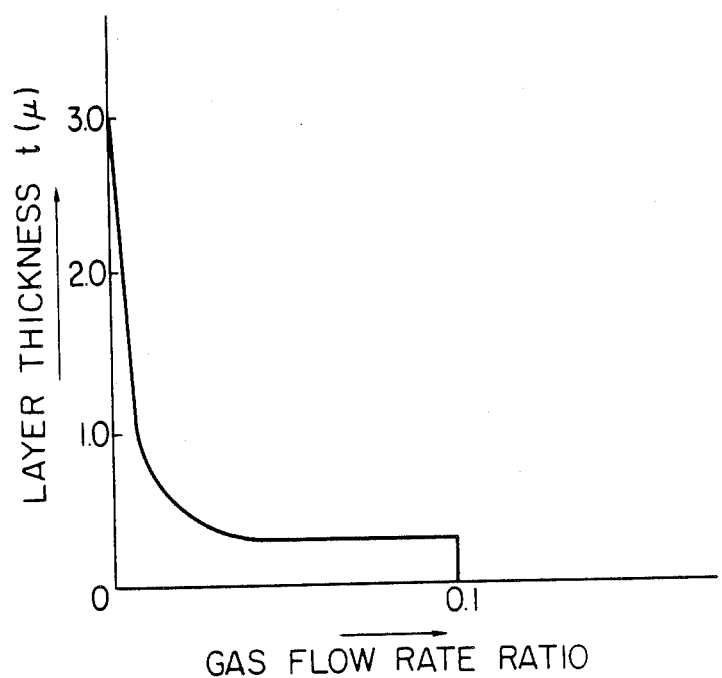

An aluminum substrate (length (L): 357 mm, outer diameter (r) 80 mm) was worked by a lathe to have the surface characteristics as shown in FIG. 21(B). By means of the film deposition device shown in FIG. 20, a light-receiving member for electrophotography was prepared following the same conditions as in Example 66 except for carrying out layer formation on cylindrical aluminum substrate under the conditions as shown in Table 8H while changing the gas flow rate ratio of $CH_4$ according to the change rate curve of the gas flow rate ratio as shown in FIG. 72 with lapse of time for layer formation.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 78

By means of a lathe, an aluminum substrate (length (L): 357 mm, outer diameter (r): 80 mm) was worked to have the surface characteristics as shown in FIG. 21(B).

Next, a light-receiving member for electrophotography of A-Si type was prepared following various procedures using the film deposition device in FIG. 20 under the conditions as shown in Table 1I.

The surface condition of the light-receiving members thus prepared was as shown in FIG. 21(C). The difference in average layer thickness between the center and the both end portions of the aluminum substrate in the light-receiving member for electrophotography was 2 $\mu$m.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 79

A light-receiving member for electrophotography of A-Si type was prepared following various procedures using the film deposition device in FIG. 20 by the same manner as in Example 78 except for under the conditions as shown in Table 2I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 80

A light-receiving member for electrophotography of A-Si type was prepared following various procedures using the film deposition device in FIG. 20 by the same manner as in Example 78 except for under the conditions as shown in Table 3I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 81

By means of a lathe, three kinds of aluminum substrates (length (L): 357 mm, outer diameter (r): 80 mm) were worked to have the surface characteristic as shown in FIG. 21(B), FIG. 64 and FIG. 65.

Next, a light-receiving member for electrophotography of A-Si type was prepared following various procedures using the film deposition device in FIG. 20 under the conditions as shown in Table 4I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 82

By means of a lathe, three kinds of aluminum substrates (length (L): 357 mm, outer diameter (r): 80 mm) were worked to have the surface characteristics as shown in FIG. 21(B), FIG. 64 and FIG. 65.

Next, a light-receiving member for electrophotography of A-Si type was prepared following various procedures using the film deposition device in FIG. 20 under by the same manner as in Example 81 except for under the conditions as shown in Table 5I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 83

By means of a lathe, three kinds of aluminum substrates (length (L): 357 mm, outer diameter (r): 80 mm) were worked to have the surface characteristics as shown in FIG. 21(B), FIG. 64 and FIG. 65.

Next, a light-receiving member for electrophotography of A-Si type was prepared following various procedures using the film deposition device in FIG. 20 by the same manner as in Example 81 expect for under the conditions as shown in Table 6I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 84

By means of a lathe, an aluminum substrate (length (L): 357 mm, outer diameter (r): 80 mm) was worked as shown in FIG. 21(B).

Figure 74:
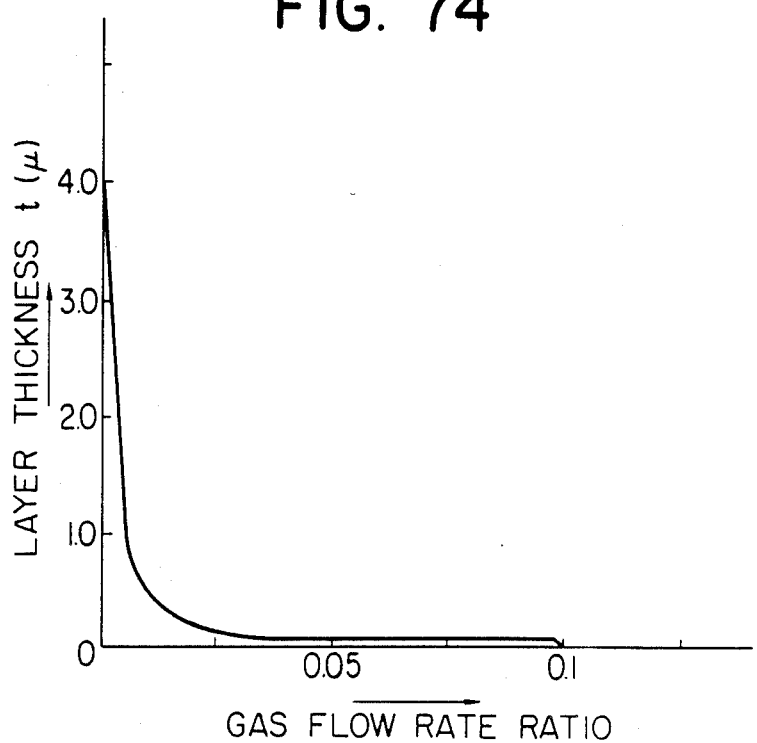

Next, using this substrate a light-receiving member for electrophotography of A-Si type was prepared following various procedures using the film deposition device in FIG. 20 by the same manner as in Example 78 except for under the conditions as shown in Table 7I. During the formation of the first layer, the flow rate ratio of CH$_4$ gas to SiH$_4$+GeH$_4$ gas was controlled as shown in FIG. 74, by operating mass flow controller 2009 for CH$_4$ gas using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 85

By means of a lathe, an aluminum substrate (length (L): 357 mm, outer diameter (r): 80 mm) was worked to have the surface characteristic as shown in FIG. 21(B).

Figure 75:
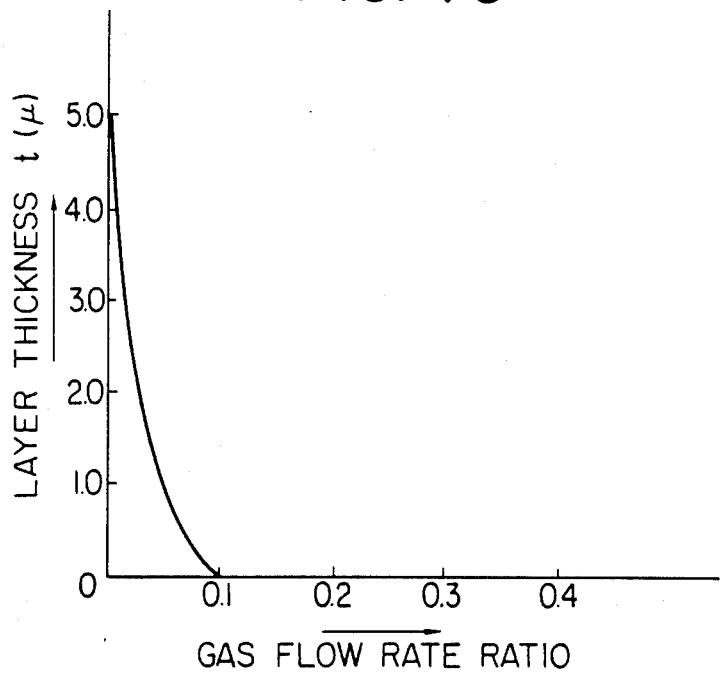

Next, using this substrate a light-receiving member for electrophotography of A-Si type was prepared following various procedures using the film deposition device in FIG. 20 by the same manner as in Example 78 except for under the conditions as shown in Table 8I. The first layer was formed while controlling the flow rate ratio of NO gas to the sum total of GeH$_4$ gas and SiH$_4$ gas was controlled as shown in FIG. 75, by operating mass flow controller 2009 for NO gas using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 86

By means of a lathe, an aluminum substrate (length (L): 357 mm, outer diameter (r): 80 mm) was worked to have the surface characteristic as shown in FIG. 21(B).

Figure 57:
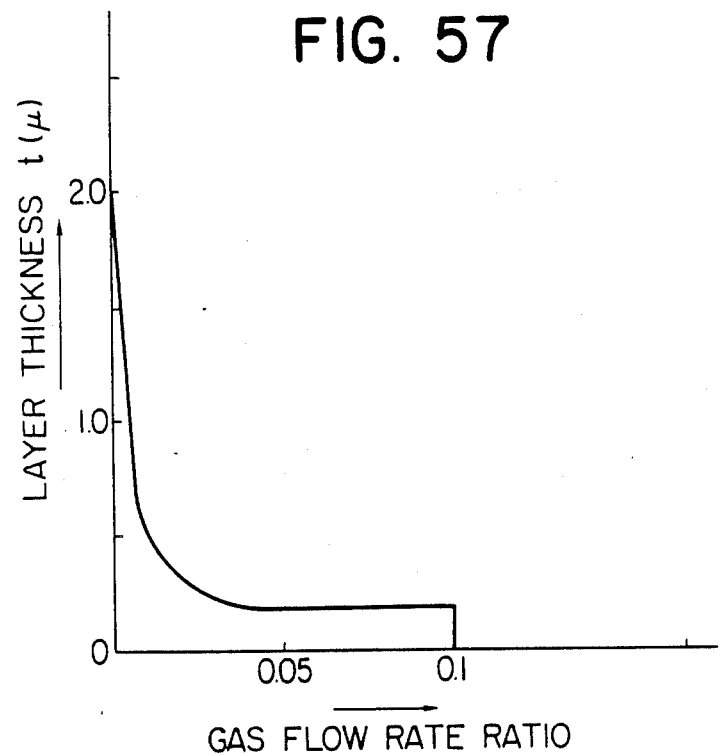

Next, using this substrate a light-receiving member for electrophotography was prepared following various procedures using the deposition device in FIG. 20 by the same manner as in Example 78 except for under the conditions as shown in Table 9I. The first layer was formed while controlling the flow rate ratio of NH$_3$ gas to the sum total of GeH$_4$ gas and SiH$_4$ gas was controlled as shown in FIG. 57 by operating mass flow controller 2009 for NH$_3$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 87

By means of a lathe, an aluminum substrate (length (L): 357 mm, outer diameter (r): 80 mm) was worked to have the surface characteristic as shown in FIG. 21(B).

Figure 76:
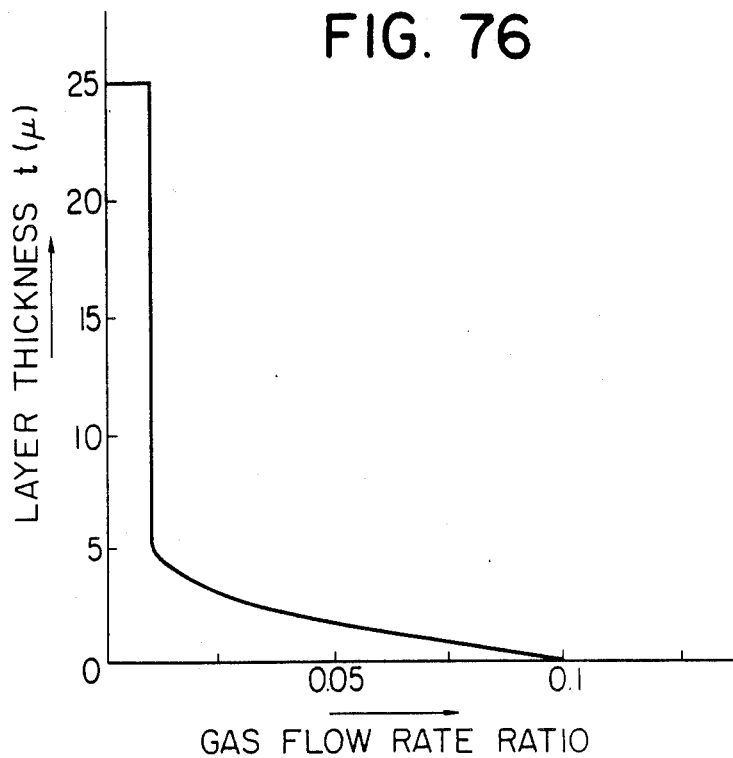

Next, using this substrate, a light-receiving member for electrophotography was prepared following various procedures using the deposition device in FIG. 20 by the same manner as in Example 78 except for under the conditions as shown in Table 10I. During the formation of the layer, the flow rate ratio of CH$_4$ gas to the sum total of GeH$_4$ gas and SiH$_4$ gas was controlled as shown in FIG. 76 by operating mass flow controller 2009 for CH$_4$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 88

By means of a lathe, an aluminum substrate (length (L): 357 mm, outer diameter (r): 80 mm) was worked to have the surface characteristic as shown in FIG. 21(B).

Figure 77:
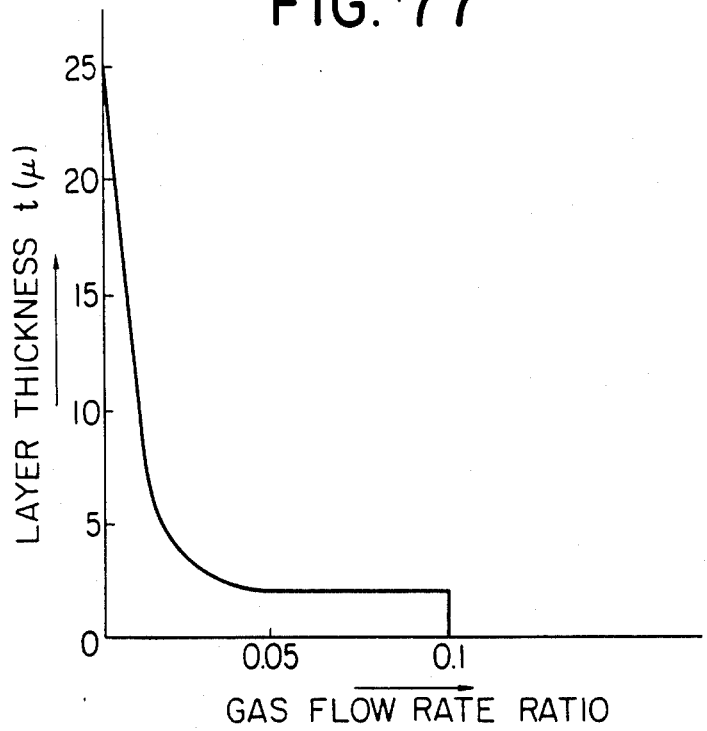

Next, using this substrate a light-receiving member for electrophotography was prepared following various procedures using the deposition device in FIG. 20 by the same manner as in Example 78 except for under the conditions as shown in Table 11I. During the formation of the layer, the flow rate ratio of NO gas to the sum total of GeH$_4$ gas and SiH$_4$ gas was controlled as shown in FIG. 77 by operating mass flow controller 2009 using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 89

By means of a lathe, an aluminum substrate (length (L): 357 mm, outer diameter (r): 80 mm) was worked to have the surface characteristic as shown in FIG. 21(B).

Figure 73:
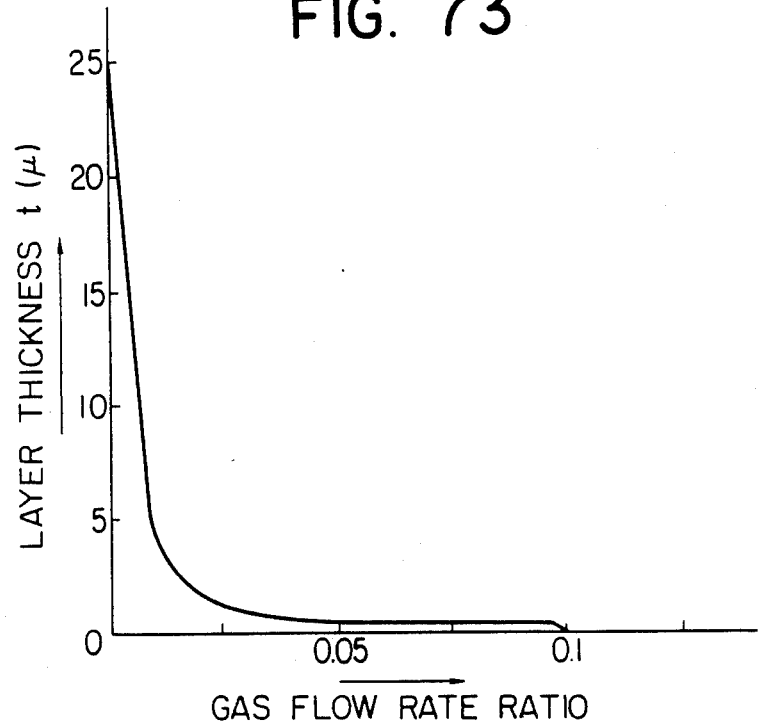

Next, using this substrate a light-receiving member for electrophotography was prepared following various procedures using the deposition device in FIG. 20 by the same manner as in Example 78 except for under the conditions as shown in Table 12I. During the formation of the layer, the flow rate ratio of NH$_3$ gas to the sum total of GeH$_4$ gas and SiH$_4$ gas was controlled as shown in FIG. 73 by operating mass flow controller 2009 for NH$_3$ using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 90

By means of a lathe, an aluminum substrate (length (L): 357 mm, outer diameter (r): 80 mm) was worked to have the surface characteristic as shown in FIG. 21(B).

Next, using this substrate a light-receiving member for electrophotography was prepared following various procedures using the deposition device in FIG. 20 by the same manner as in Example 78 except for under the conditions as shown in table 13I.

The light-receiving member for electrophotography as prepared above was subjected to image exposure by means of a device shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 91

By means of a lathe, an aluminum substrate (length (L): 357 mm, outer diameter (r): 80 mm) was worked to have the surface characteristic as shown in FIG. 21(B).

Next, using this substrate a light-receiving member for electrophotography was prepared following various procedures using the film deposition device in FIG. 20 by the same manner as in Example 78 except for under the conditions as shown in Table 14I.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 92

For Examples 78 through 91, light-receiving members for electrophotography were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 78 through 91.

These light-receiving members for electrophotography were each subjected to iamge exposure by means of a device as shown in FIG. 26 (wavelength of laser beam: 780 nm, spot diameter 80 $\mu$m), followed by developing and transfer to obtain an image. Each image was free from any interference fringe pattern observed and proved to be satisfactory for practical application.

EXAMPLE 93

By means of a lathe, an aluminum substrate (length (L): 357 mm, outer diameter (r): 80 mm) was worked to have the surface characteristic as shown in FIG. 21(B).

Next, a light-receiving member for electrophotography of A-Si was prepared following predetermined procedures using the film deposition device in FIG. 20 under the conditions as shown in Table 1J.

The A-Si:Ge:H:B:O layer as the first layer was formed while controlling the flow rate of $GeH_4$ and $SiH_4$ as shown in FIG. 22 by operating mass flow controllers 2007, 2008 and 2010 using a computer (HP9845B).

The surface condition of the light-receiving members thus prepared was as shown in FIG. 21(C).

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 94

A light-receiving member for electrophotography of A-Si was prepared following various procedures using the film deposition device in FIG. 20 under the conditions as shown in Table 1J except that the A-Si:Ge:H:B:O layer as the first layer was formed while controlling the flow rate of $GeH_4$ and $SiH_4$ as shown in FIG. 23 by operating mass flow controllers 2007 and 2008 for $GeH_4$ and $SiH_4$, respectively, using a computer (HP9845B).

The surface condition of the light-receiving members thus prepared was as shown in FIG. 21(C).

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 95

Under the same conditions as and following the same manner as in Example 93 except for changing NO gas employed in Example 93 to $NH_3$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 96

Under the same conditions as and following the same manner as in Example 93 except for changing NO gas emplyed in Example 93 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 97

A light-receiving member for electrophotography of A-Si was prepared following various procedures using the film deposition device in FIG. 20 by the same manner as in Example 93 except for under the conditions as shown in Table 2J.

The A-SiGe:H:B:N layer as the first layer was formed while controlling the flow rate of $GeH_4$ and $SiH_4$ as shown in FIG. 24 by operating mass flow controllers 2007 and 2008 for $GeH_4$ and $SiH_4$, respectively, using a computer (HP9845B).

The light-receiving member for electrophotography as prepared above was subjected to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 98

A light-receiving member for electrophotography of A-Si was prepared following various procedures using the film deposition device in FIG. 20 by the same manner as in Example 93 except for under the conditions as shown in Table 2J.

The A-Si:Ge:H:B:N layer as the first layer was formed while controlling the flow rate of $GeH_4$ and $SiH_4$ as shown in FIG. 25 by operating mass flow controllers 2007 and 2008 for $GeH_4$ and $SiH_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 99

Under the same conditions as and following the same manner as in Example 97 except for changing NH₃ gas employed in Example 97 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 100

Under the same conditions as and following the same manner as in Example 97 except for changing NH₃ gas employed in Example 97 to CH₄ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 101

A light-receiving member for electrophotography was prepared following various procedures using the film deposition device in FIG. 20 by the same manner as in Example 93 except for under the conditions as shown in Table 3J.

The A-Si:Ge:H:B:C layer as the first layer was formed while controlling the flow rate of GeH₄ and SiH₄ as shown in FIG. 22 by operating mass flow controllers 2007 and 2008 for GeH₄ and SiH₄, respectively, using a computer (HP9845B).

During the formation of the layer, the flow rate ratio of CH₄ gas to the sum total of GeH₄ gas and SiH₄ gas was changed following the change rate curve as shown in FIG. 72.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 102

Under the same conditions as and following the same manner as in Example 101 except for changing CH₄ gas employed in Example 101 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 103

Under the same conditions as and following the same manner as in Example 101 except for changing CH₄ gas employed in Example 101 to NH₃ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 104

A light-receiving member for electrophotography was prepared following various procedures using the deposition device in FIG. 20 by the same manner as in Example 93 except for under the conditions as shown in Table 4J.

The A-Si:Ge:H:B:O layer as the first layer was formed while controlling the flow rate of GeH₄ and SiH₄ as shown in FIG. 24 by operating mass flow controllers 2007 and 2008 for GeH₄ and SiH₄, respectively, using a computer (HP9845B).

During the formation of the layer, the flow rate ratio of NO gas to the sum total of GeH₄ gas and SiH₄ gas was changed following the change rate curve as shown in FIG. 58.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 105

By means of a lathe, an aluminum substrate (length (L): 357 mm, outer diameter (r): 80 mm) was worked to have the surface characteristic as shown in FIG. 64.

Next, a light-receiving member for electrophotography was prepared following various procedures using the film deposition device in FIG. 20 by the same manner as in Example 93 except for under the conditions as shown in Table 5J.

The A-Si:Ge:H:N layer as the first layer was formed while controlling the flow rate of GeH₄ and SiH₄ as shown in FIG. 25 by operating mass flow controllers 2007 and 2008 for GeH₄ and SiH₄, respectively, using a computer (HP9845B).

Figure 78:
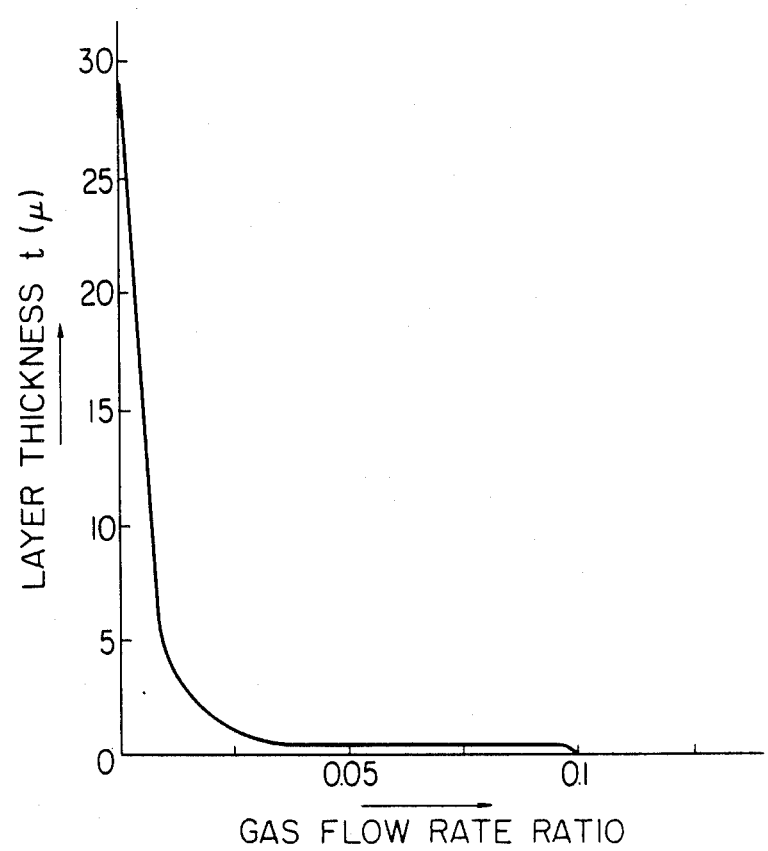
Figure 79:
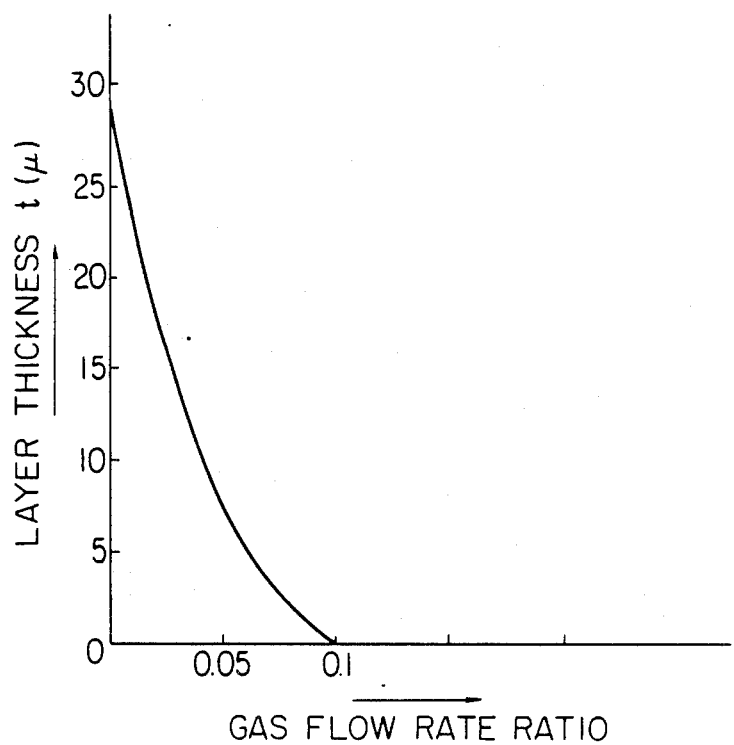

During the formation of the layer, the flow rate ratio of NH₃ gas to the sum total of GeH₄ gas and SiH₄ gas was changed following the change rate curve as shown in FIG. 78.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 106

By means of a lathe, an aluminum substrate (length (L): 357 mm, outer diameter (r): 80 mm) was worked to have the surface characteristic as shown in FIG. 65.

Next, a light-receiving member for electrophotography was prepared following various procedures using the film deposition device in FIG. 20 by the same manner as in Example 93 except for under the conditions as shown in Table 6J.

The A-Si:Ge:H:B:C layer as the first layer was formed while controlling the flow rate of $GeH_4$ and $SiH_4$ as shown in FIG. 23 by operating mass flow controllers 2007 and 2008 for $GeH_4$ and $SiH_4$, respectively, using a computer (HP9845B).

Figure 82:
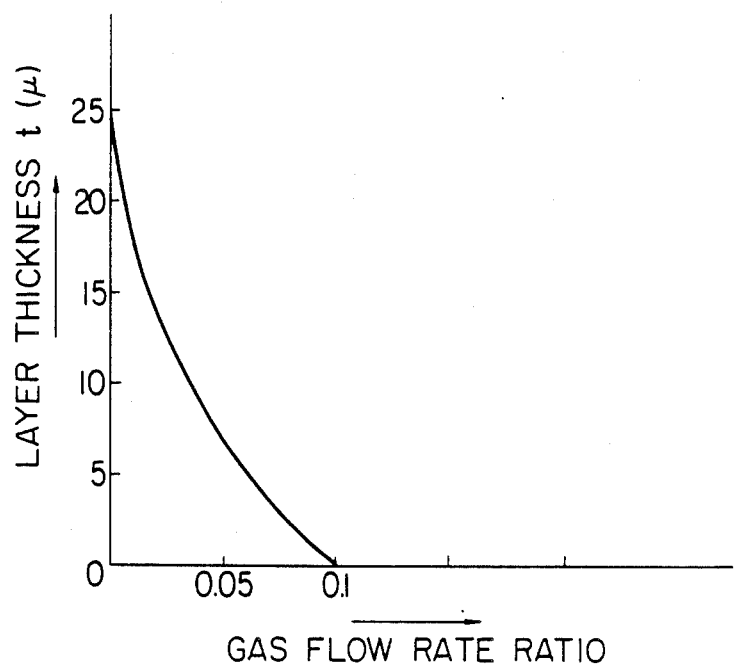

During the formation of the layer, the flow rate ratio of $CH_4$ gas to the sum total of $GeH_4$ gas and $SiH_4$ gas was changed following the change rate curve as shown in FIG. 82.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 107

For Example 93 through Example 106, light-receiving members for electrophotography were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 93 through 106.

These light-receiving members for electrophotography were each subjected to image exposure by means of a device as shown in FIG. 26 (wavelength of laser beam: 780 nm, spot diameter 80 µm), followed by developing and transfer to obtain an image. Each image was free from any interference fringe pattern observed and proved to be satisfactory for practical application.

EXAMPLE 108

By means of a lathe, an aluminum substrate (length (L): 357 mm, outer diameter (r): 80 mm), was worked to have the surface characteristic as shown in FIG. 21(B).

Next, by use of the film deposition device shown in FIG. 20, following various procedures under the conditions as shown in Table 1K, a light-receiving member for electrophotography of A-Si type was prepared.

The surface condition of the light-receiving member for electrophotography thus prepared was as shown in FIG. 21(C). In this case, the average layer thickness difference was 2 µm between the center and both ends of the aluminum substrate.

These light-receiving members for electrophotography as prepared above were subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 109

A light-receiving member for electrophotography of A-Si type was prepared following various procedures using the film deposition device in FIG. 20 by the same manner as in Example 108 except for under the conditions as shown in Table 2K.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 110

A light-receiving member for electrophotography of A-Si type was prepared following various procedures using the film deposition device in FIG. 20 by the same manner as in Example 108 except for under the conditions as shown in Table 3K.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 111

By means of a lathe, three kinds of aluminum substrates (length (L): 357 mm, outer diameter (r): 80 mm) were worked to have the surface characteristic as shown in FIGS. 21(B), 64 and 65.

Next, by use of the film deposition device shown in FIG. 20, following various procedures under the conditions as shown in Table 4K, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 112

Following the same manner as in Example 110 except for changing $CH_4$ gas employed in Example 110 to $NH_3$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 113

Following the same manner as in Example 111 except for changing NO gas employed in Example 111 to $CH_4$ gas, a light-receiving member for electrophotography of A-Si type.

The light-receiving member for electrophotography as prepared above was subjected to image exposure by means of a device as shown in FIG. 26 (wavelength of laser beam: 780 nm, spot diameter 80 µm), followed by developing and transfer to obtain an image. The image was free from any interference fringe pattern observed and proved to be satisfactory for practical application.

EXAMPLE 114

By means of a lathe, an aluminum substrate (length (L): 357 mm, outer diameter (r): 80 mm) was worked to have the surface characteristic as shown in FIG. 21(B).

Next, using this substrate a light-receiving member for electrophotography of A-Si type was prepared following various procedures using the film deposition device in FIG. 20 by the same manner as in Example 108 except for under the conditions as shown in Table 5K.

Figure 56:
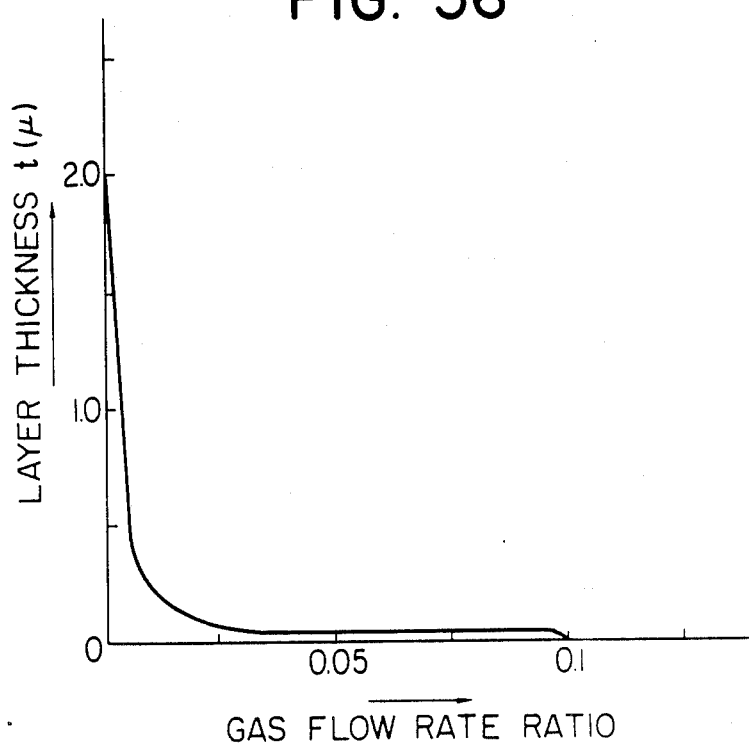

The boron-containing layer was formed while controlling the flow rate of $B_2H_6/H_2$ as shown in FIG. 60 and while controlling the flow rate of $NH_3$ as shown in FIG. 56, by operating mass flow controllers 2010 and 2009 for $B_2H_6/H_2$ and $NH_3$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 115

Following the same manner as in Example 114 except for changing $NH_3$ gas employed in Example 114 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 116

Following the same manner as in Example 114 except for changing $NH_3$ gas employed in Example 114 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 117

By means of a lathe, an aluminum substrate (length (L): 357 mm, outer diameter (r): 80 mm) was worked to have the surface characteristic as shown in FIG. 21(B) under the conditions shown in Table 9K.

Next, using this substrate light-receiving member for electrophotography of A-Si type was prepared following various procedures using the film deposition device in FIG. 20 by the same manner as in Example 108 except for under the conditions as shown in Table 6K.

The boron-containing layer was formed while controlling the flow rate of $B_2H_6/H_2$ as shown in FIG. 61 and while controlling the flow rate of $CH_4$ as shown in FIG. 57, by operating mass flow controllers 2010 and 2009 for $B_2H_6/H_2$ and $CH_4$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 118

Following the same manner as in Example 117 except for changing $CH_4$ gas employed in Example 117 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 119

Following the same manner as in Example 117 except for changing $CH_4$ gas employed in Example 117 to $NH_3$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 120

By means of a lathe, an aluminum substrate (length (L): 357 mm, outer diameter (r): 80 mm) was worked to have the surface characteristic as shown in FIG. 21(B).

Next, using this surbstrate a light-receiving member for electrophotography was prepared following various procedures using the film deposition device in FIG. 20 by the same manner as in Example 108 except for the conditions as shown in Table 7K.

Figure 80:
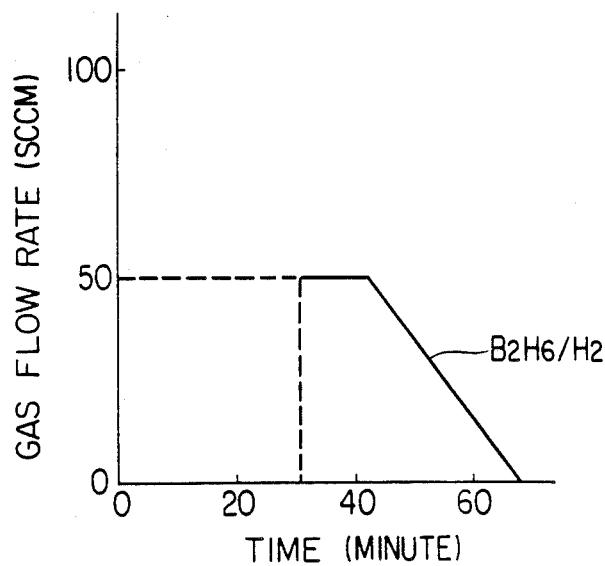

The boron-containing layer was formed while controlling the flow rate of $B_2H_6/H_2$ as shown in FIG. 80 and while controlling the flow rate of NO as shown in FIG. 58, by operating mass flow controllers 2010 and 2009 for $B_2H_6/H_2$ and NO, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 121

Following the same manner as in Example 120 except for changing NO gas employed in Example 120 to $NH_3$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image was free from any interference fringe pattern observed and proved to be satisfactory for practical application.

EXAMPLE 122

Following the same manner as in Example 120 except for changing NO gas employed in Example 120 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to satisfactory for practical application.

EXAMPLE 123

By means of a lathe, an aluminum substrate (length (L): 357 mm, outer diameter (r): 80 mm) was worked to have the surface characteristic as shown in FIG. 21(B).

Next, using this substrate a light-receiving member for electrophotography was prepared following various procedures using the film deposition device in FIG. 20 by the same manner as in Example 108 except for under the conditions as shown in Table 8K.

Figure 59:
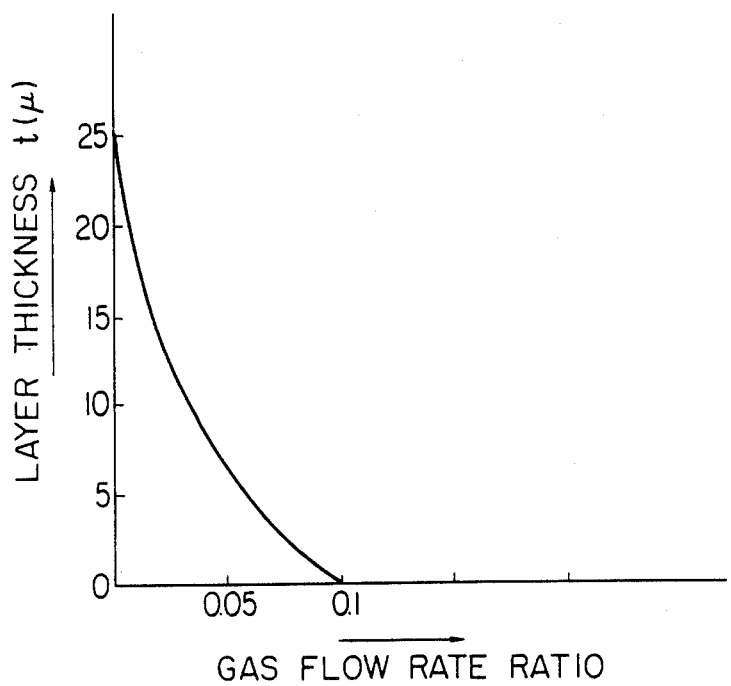

The boron-containing layer was formed while controlling the flow rate of $B_2H_6/H_2$ as shown in FIG. 39 and while controlling the flow rate of $NH_3$ as shown in FIG. 59, by operating mass flow controllers 2010 and 2009 for $B_2H_6/H_2$ and $NH_3$, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 124

Following the same manner as in Example 123 except for changing $NH_3$ gas employed in Example 123 to NO gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 125

Following the same manner as in Example 123 except for changing $NH_3$ gas employed in Example 123 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 126

For Examples 108 through 125, light-receiving members for electrophotography were prepared by use of $PH_3$ gas diluted with $H_2$ to 3000 vol. ppm in place of $B_2H_6$ gas diluted with $H_2$ to 3000 vol. ppm.

Other preparation conditions were the same as in Examples 108 through 125.

These light-receiving members for electrophotography where each subjected to image exposure by means of a device as shown in FIG. 26 (wavelength of laser beam: 780 nm, spot diameter 80 μm), followed by developing and transfer to obtain an image. Each image was free from any interference fringe pattern observed and proved to be satisfactory for practical application.

EXAMPLE 127

By means of a lathe, an aluminum substrate (length (L): 357 mm, outer diameter (r): 80 mm) was worked to have the surface characteristic as shown in FIG. 21(B).

Next, a light-receiving member for electrophotography of A-Si type was prepared following predetermined procedures using the film deposition device in FIG. 20 under the conditions as shown in Table 1L.

The first layer was formed while controlling the flow rates of $GeH_4$, $SiH_4$ and $B_2H_6/H_2$ as shown in FIGS. 22 and 36 by operating mass flow controllers 2007, 2008 and 2010 using a computer (HP9845B).

The surface condition of the light-receiving members thus prepared was as shown in FIG. 21(C).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 128

A light receiving member for electrophotography of A-Si type was prepared under the same conditions as in Example 127 except for the first layer was formed while controlling the flow rates of $GeH_4$, $SiH_4$ and $B_2H_6/H_2$ as shown in FIGS. 23 and 37 by operating mass flow controllers 2007, 2008 and 2010 using a computer (HP9845B).

The light-receiving member for electrophotography as prepared above was subjected as same as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 129

A light-receiving member for electrophotography of A-Si type was prepared following various procedures using the film deposition device in FIG. 20 by the same manner as in Example 127 except for under the conditions as shown in Table 2L.

The first layer was formed while controlling the flow rates of $GeH_4$, $SiH_4$ and $B_2H_6/H_2$ as shown in FIGS. 24 and 38 by operating mass flow controllers 2007, 2008 and 2010 using a computer (HP9845B).

The light-receiving member for electrophotography as prepared above was subjected as same as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 130

A light-receiving member for electrophotography of A-Si type was prepared under the same conditions as in Example 129 except that the first layer was formed while controlling the flow rates of $GeH_4$, $SiH_4$ and $B_2H_6/H_2$ as shown in FIGS. 25 and 39 by operating mass flow controllers 2007, 2008 and 2010 using a computer (HP9845B).

The light-receiving member for electrophotography as prepared above was subjected as same as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 131

A light-receiving member for electrophotography of A-Si type was type was prepared following various procedures using the film deposition device in FIG. 20 by the same manner as in Example 127 except for under the conditions as shown in Table 3L.

The first layer and the A layer were formed while controlling the flow rates of $GeH_4$, $SiH_4$ and $B_2H_6/H_2$ as shown in FIG. 40 by operating mass flow controllers 2007, 2008 and 2010 using a computer (HP9845B).

The light-receiving member for electrophotography as prepared above was as in Example 127 subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 132

A light-receiving member for electrophotography of A-Si type was prepared following various procedures using the film depositon device in FIG. 20 by the same manner as in Example 127 except for under the conditions as shown in Table 4L.

The first layer and the A layer were formed while controlling the flow rates of $GeH_4$, $SiH_4$ and $B_2H_6/H_2$ as shown in FIG. 41 by operating mass flow controllers 2007, 2008 and 2010 using a computer (HP9845B).

The light-receiving member for electrophotography as prepared above was subjected as in Examole 127 to image exposure by means of a device as shown in FIG. 26 (wavelength of laser beam: 780 nm, spot diameter 80 μm), followed by developing and transfer to obtain an image. The image was free from any interference fringe patter observed and proved to be satisfactory for practical application.

EXAMPLE 133

A light-receiving member for electrophotography of A-Si type was prepared following various procedures using the film deposition device in FIG. 20 by the same manner as in Example 127 except for under the conditions as shown in Table 5L.

The first layer and the A layer were formed while controlling the flow rates of $GeH_4$, $SiH_4$ and $B_2H_6/H_2$ as shown in FIG. 42 by operating mass flow controllers 2007, 2008 and 2010 using a computer (HP9845B).

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 134

Under the same conditions as and following the same manner as in Example 127 except for changing NO gas employed in Example 127 to $NH_3$ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 135

Under the same conditions as and following the same manner as in Example 127 except for changing NO gas employed in Example 127 to $CH_4$ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 136

Under the same conditions as and following the same manner as in Example 129 except for changing $NH_3$ gas employed in Example 129 to NO gas, a light-receiving member for electrophotography of A-Si type was prepared.

The light-receiving member for electrophotography as prepared above was subjected as same as in Example 127 image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 137

Under the same conditions as and following the same manner as in Example 129 except for changing $NH_3$ gas employed in Example 129 to $CH_4$ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 138

Under the same conditions as and following the same manner as in Example 131 except for changing CH₄ gas employed in Example 131 to NO gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 139

Under the same conditions as and following the same manner as in Example 131 except for changing CH₄ gas employed in Example 131 to NH₃ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 140

A light-receiving member for electrophotography was prepared following various procedures using the deposition device in FIG. 20 by the same manner as in Example 127 except for under the conditions as shown in Table 6L.

Figure 52:
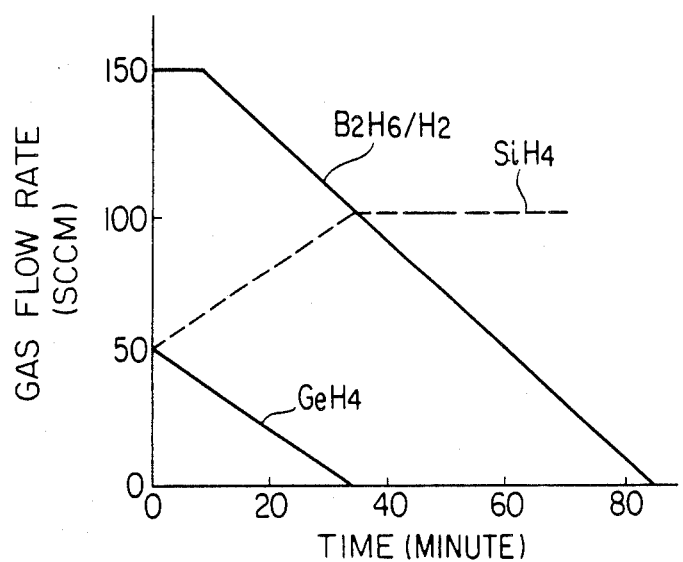

Controllign the flow rates of GeH₄, SiH₄ and B₂H₆/H₂ as shown in FIG. 52 or the nitrogen atom-containing layer was formed while controlling the flow rate of NH₃ as shown in FIG. 56, by operating mass flow controllers 2007, 2008, 2010 and 2009 for GeH₄, SiH₄, B₂H₆/H₂ and NH₃, respectively, using a computer (HP9845B).

The light-receiving member for electrophotography as prepared abaove was subjected by the same manner as in Example 127 to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 141

Under the same conditions as and following the same manner as in Example 140 except for changing NH₃ gas employed in Example 140 to NO gas, a light-receiving member for electrophotography of A-Si type was prepared.

The light receiving member for electrophotography as prepared above was subjected the same manner as in Example 127 to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 142

Under the same conditions as and following the same manner as in Example 140 except for changing NH₃ gas employed in Example 140 to CH₄ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 143

By means of a lathe, an aluminum substrate (length (L): 357 mm outer diameter (r): 80 mm) was worked to have the surface characteristic as shown in FIG. 64.

Next, a light-receiving member for electrophotography was prepared following various procedures using the deposition device in FIG. 20 under the conditions as shown in Table 7L.

Figure 53:
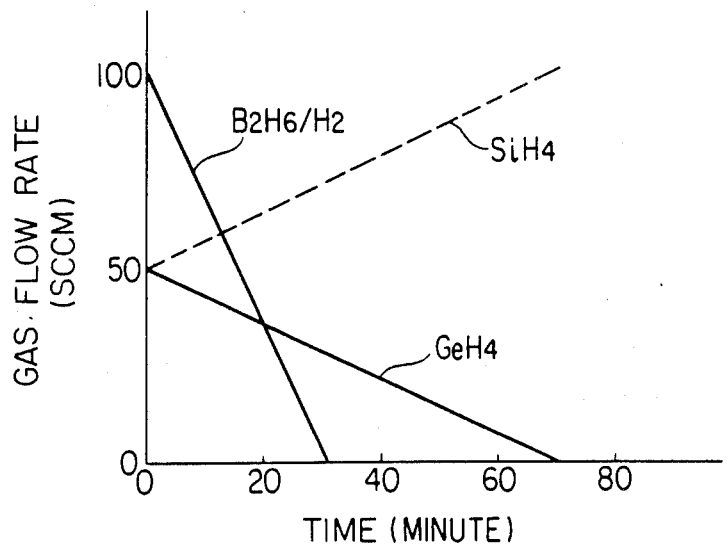

The flow rates of GeH₄, SiH₄ and B₂H₆/H₂ were controlled as shown in FIG. 53 and the carbon atom-containing layer was formed while controlling the flow rate of CH₄ as shown in FIG. 57, by operating mass flow controllers 2007, 2008, 2010 and 2009 for GeH₄, SiH₄, B₂H₆/H₂ and CH₄, respectively, using a computer (HP9845B).

The light-receiving member for electrophotography as prepared above was subjected to image exposure as in Example 127 by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 144

Under the same conditions as and following the same manner as in Example 143 except for changing CH₄ gas employed in Example 143 to NO gas, a light-receiving member for electrophotography of A-Si type was prepared.

The light-receiving member for electrophotography as prepared above was subjected to image exposure by means of a device as shown in FIG. 26 (wavelength of Laser beam: 780 nm, spot diameter 80 $\mu$m), followed by developing and transfer to obtain an image. The image was free from any interference fringe pattern observed and proved to be satisfactory for practical application.

EXAMPLE 145

Under the same conditions as and following the same manner as in Example 143 except for changing CH₄ gas employed in Example 143 to NH₃ gas, a light-receiving member for electrophotography of A-Si type was prepared.

The light-receiving member for electrophotography as prepared above was subjected to image exposure as in Example 127 by means of a device as shown in FIG. 26 (wavelength of laser beam: 780 nm, spot diameter 80 $\mu$m), followed by developing and transfer to obtain an image. The image was free from any interference fringe pattern observed and proved to be satisfactory for practical application.

EXAMPLE 146

By means of a lathe, an aluminum substrate (length (L): 357 mm, outer diameter (r): 80 mm) was worked to have the surface characteristic as shown in FIG. 65.

Next, a light-receiving member for electrophotography was prepared following various procedures using the deposition device in FIG. 20 under the conditions as shown in Table 8L.

Figure 54:
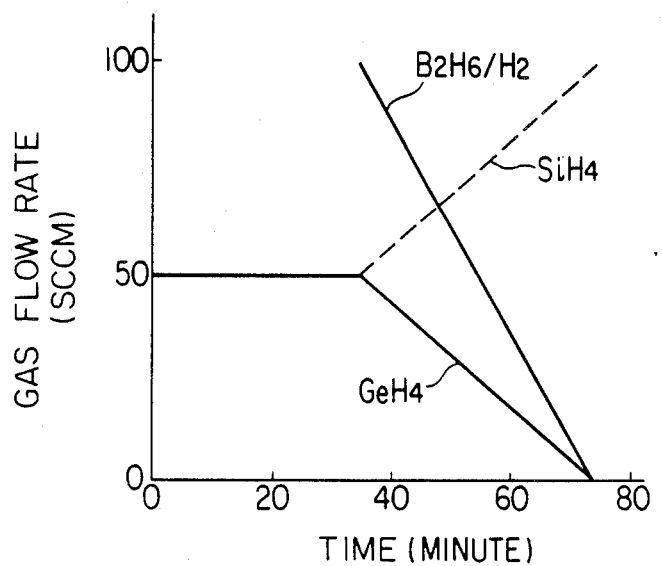

The flow rates of $GeH_4$, $SiH_4$ and $B_2H_6/H_2$ were controlled as shown in FIG. 54 and the oxygen atom-containing layer was formed while controlling the flow rate of NO as fhown in FIG. 58, by operating mass flow controllers 2007, 2008, 2010 and 2009 for $GeH_4$, $SiH_4$, $B_2H_6/H_2$ and NO, respectively, using a computer (HP9845B).

The light-receiving member for electrophotography as prepared above was subjected to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 147

Under the same conditions as and following the same manner as in Example 146 except for changing NO gas employed in Example 146 to $NH_3$ gas, a light-receiving member for electrophotography of A-Si type was prepared.

The light-receiving member for electrophotography as prepared above was subjected to image exposure as in Example 127 by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 148

Under the same conditions as and following the same manner as in Example 146 except for changing NO gas employed in Example 146 to $CH_4$ gas, a light-receiving member for electrophotography of A-Si type was prepared.

The light-receiving member for electrophotography as prepared above was subjected to image exposure by means of a device as shown in FIG. 26 (wavelength of laser beam: 780 nm, spot diameter 80 μm), followed by developing and trasfer to obtain an image. The image was free from any interference fringe pattern observed and proved to be satisfactory for practical application.

EXAMPLE 149

By means of a lathe, an aluminum substrate (length (L): 357 mm, outerdiameter (r): 80 mm) was worked to have the surface charcteristic as shown in FIG. 21(B).

Next, a light-receiving member for electrophotography was prepared following various procedures using the deposition device in FIG. 20 under the conditions as shown in Table 9L.

Figure 55:
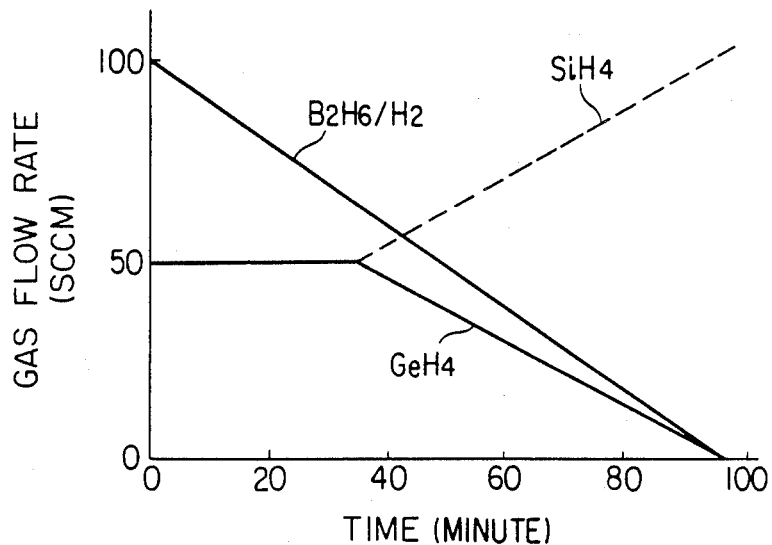

The flow rates of $GeH_4$, $SiH_4$ and $B_2H_6/H_2$ were controlled as shown in FIG. 55 and the nitrogen atom-containing layer was formed while controlling the flow rate of $NH_3$ as shown in FIG. 59, by operating mass flow controllers 2007, 2008, 2010 and 2009 for $GeH_4$, $SiH_4$, $B_2H_6/H_2$ and $NH_3$, respectively, using a computer (HP9845B).

The light-receiving member for electrophotography as prepared above was subjecte as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 150

Under the same conditions as and following the same manner as in Example 149 except for changing $NH_3$ gas employed in Example 149 to NO gas, a light-receiving member for electrophotography of A-Si type was prepred.

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 151

Under the same conditions as and following the same manner as in Example 149 except for changing $NH_3$ gas employed in Example 149 to $CH_4$ gas, a light-receiving member for electrophotography of A-Si type was prepared.

The light-receiving member for electrophotography as prepared above was subjected as in Example 127 to image exposure by means of a device as shown in FIG. 26 (wavelength of laser beam: 780 nm, spot diameter 80 μm), followed by developing and transfer to obtain an image. The image was free from any interference fringe pattern observed and proved to be satisfactory for practical application.

EXAMPLE 152

For examples 127 through 151, light-receiving members for electrophotography (Sample NS. 2601L–2700L) were prepared by use of $PH_3$ gas diluted with $H_2$ to 3000 vol. ppm in place of $B_2H_6$ gas diluted with $H_2$ to 3000 vol. ppm.

Other preparation conditions were the same as in Examples 127 through 151.

These light-receiving members for electrophotography were each subjected to image exposure by means of a device as shown in FIG. 26 (wavelength of laser beam: 780 nm, spot diameter 80 μm), followed by developing and transfer to obtain an image. Each image was free from any interference fringe pattern observed and proved to be satisfactory for practical application.

TABLE 1A

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| Second layer | $H_2$ | 300 | 300 | 24 | 20 |
| | $SiH_4$ | 300 | | | |

TABLE 2A

| | Starting gas | Gas flow rate (SCCM) | Dis-charging power (W) | Deposition rate (Å/sec) | Layer thickness (μm) |
|---|---|---|---|---|---|
| First layer | $H_2$ | 300 | 100 | 14 | 3 |
| | $SiH_4$ | 50 | | | |
| | $GeH_4$ | 100 | | | |
| Second layer | $H_2$ | 300 | 300 | 24 | 20 |
| | $SiH_4$ | 300 | | | |

TABLE 3A

| | Starting gas | Gas Flow rate (SCCM) | Dis-charging power (W) | Deposition rate (Å/sec) | Layer thickness (μm) |
|---|---|---|---|---|---|
| First layer | $H_2$ | 300 | 100 | 12 | 5 |
| | $SiH_4$ | 100 | | | |
| | $GeH_4$ | 50 | | | |
| Second layer | $H_2$ | 300 | 300 | 24 | 20 |
| | $SiH_4$ | 300 | | | |

TABLE 4A

| | Starting gas | Gas flow rate (SCCM) | Dis-charging power (W) | Deposition rate (Å/sec) | Layer thickness (μm) |
|---|---|---|---|---|---|
| First layer | $H_2$ | 300 | 100 | 8 | 7 |
| | $SiH_4$ | 135 | | | |
| | $GeH_4$ | 15 | | | |
| Second layer | $H_2$ | 300 | 300 | 24 | 20 |
| | $SiH_4$ | 300 | | | |

TABLE 1B

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| Second layer | $H_2$ | 300 | 300 | 24 | 20 |
| | $SiH_4$ | 300 | | | |

TABLE 2B

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| Second layer | $H_2$ | 300 | 300 | 24 | 20 |
| | $SiH_4$ | 300 | | | |

TABLE 1C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 3 |
| | $GeH_4$ | 100 | | | |
| | $B_2H_6/H_2$ (=3000 vol ppm) | 100 | | | |
| Second layer | $H_2$ | 300 | 300 | 24 | 20 |
| | $SiH_4$ | 300 | | | |

TABLE 2C

| Layer constitution | Starting gas | Gas flow rate (SCCM) | Discharging power (W) | Deposition rate (Å/sec) | Layer thickness (μm) |
|---|---|---|---|---|---|
| First Layer | $H_2$ | 300 | 100 | 10 | 1 |
| | $GeH_4$ | 100 | | | |
| | $B_2H_6/H_2$ (=3000 vol ppm) | 100 | | | |
| Second layer | | | | | |
| Layer A | $H_2$ | 300 | 100 | 8 | 5 |
| | $SiH_4$ | 100 | | | |
| | $B_2H_6/H_2$ (=3000 vol ppm) | 100 | | | |
| Layer B | $H_2$ | 300 | 300 | 24 | 20 |
| | $SiH_4$ | 300 | | | |

TABLE 3C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |

TABLE 3C-continued

| Layer constitution | Starting gas | Gas flow rate (SCCM) | Discharging power (W) | Deposition rate (Å/sec) | Layer thickness (μm) |
|---|---|---|---|---|---|
| | $B_2H_6/H_2$ (=3000 vol ppm) | 50 | | | |
| Second layer | | | | | |
| Layer A | $H_2$ | 300 | 100 | 8 | 5 |
| | $SiH_4$ | 100 | | | |
| | $B_2H_6/H_2$ (=3000 vol ppm) | 100 | | | |
| Layer B | $H_2$ | 300 | 300 | 24 | 20 |
| | $SiH_4$ | 300 | | | |

TABLE 4C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| | $B_2H_6/H_2$ (=3000 vol ppm) | 150 | | | |
| Second layer | | | | | |
| Layer A | $H_2$ | 300 | 100 | 8 | 5 |
| | $SiH_4$ | 100 | | | |
| | $B_2H_6/H_2$ (=3000 vol ppm) | 100 | | | |
| Layer B | $H_2$ | 300 | 300 | 24 | 20 |
| | $SiH_4$ | 300 | | | |

TABLE 5C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| Second layer | | | | | |
| Layer A | $H_2$ | 300 | 100 | 8 | 5 |
| | $SiH_4$ | 100 | | | |
| | $B_2H_6/H_2$ (=3000 vol ppm) | 100 | | | |
| Layer B | $H_2$ | 300 | 300 | 24 | 20 |
| | $SiH_4$ | 300 | | | |

TABLE 6C

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | $H_2$ | 300 | 100 | 10 | 2 |
| | $GeH_4$ | 100 | | | |
| | $B_2H_6/H_2$ (=3000 vol ppm) | 100 | | | |
| Layer B | $H_2$ | 300 | 100 | 10 | 2 |
| | $GeH_4$ | 100 | | | |
| Second layer | $H_2$ | 300 | 300 | 24 | 20 |
| | $SiH_4$ | 300 | | | |

TABLE 7C

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | $H_2$ | 300 | 100 | 10 | 2 |
| | $GeH_4$ | 100 | | | |
| Layer B | $H_2$ | 300 | 100 | 10 | 2 |
| | $GeH_4$ | 100 | | | |
| | $B_2H_6/H_2$ (=3000 vol ppm) | 100 | | | |
| Second layer | $H_2$ | 300 | 300 | 24 | 20 |
| | $SiH_4$ | 300 | | | |

TABLE 8C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(=3000 vol ppm) | 300<br>50<br>50<br>100 | 100 | 10 | 5 |
| Second layer | $H_2$<br>$SiH_4$ | 300<br>300 | 300 | 24 | 20 |

TABLE 9C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(=3000 vol ppm) | 300<br>50<br>50<br>100 | 100 | 10 | 2 |
| Second layer | | | | | |
| Layer A | $H_2$<br>$GeH_4$<br>$B_2H_6/H_2$<br>(=3000 vol ppm) | 300<br>100<br>100 | 100 | 8 | 3 |
| Layer B | $H_2$<br>$SiH_4$ | 300<br>300 | 300 | 24 | 20 |

TABLE 10C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(=3000 vol ppm) | 300<br>50<br>50<br>50 | 100 | 10 | 2 |
| Second layer | | | | | |
| Layer A | $H_2$<br>$SiH_4$<br>$B_2H_6/H_2$<br>(=3000 vol ppm) | 300<br>100<br>100 | 100 | 8 | 3 |
| Layer B | $H_2$<br>$SiH_4$ | 300<br>300 | 300 | 24 | 20 |

TABLE 11C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(=3000 vol ppm) | 300<br>50<br>50<br>150 | 100 | 10 | 2 |
| Second layer | | | | | |
| Layer A | $H_2$<br>$SiH_4$<br>$B_2H_6/H_2$<br>(=3000 vol ppm) | 300<br>100<br>100 | 100 | 8 | 3 |
| Layer B | $H_2$<br>$SiH_4$ | 300<br>300 | 300 | 24 | 20 |

TABLE 12C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$ | 300<br>50<br>50 | 100 | 10 | 2 |
| Second layer | | | | | |
| Layer A | $H_2$<br>$GeH_4$<br>$B_2H_6/H_2$<br>(=3000 vol ppm) | 300<br>100<br>100 | 100 | 8 | 3 |
| Layer B | $H_2$ | 300 | 300 | 24 | 20 |

TABLE 12C-continued

| Layer constitution | Starting gas | Gas flow rate (SCCM) | Discharging power (W) | Deposition rate (Å/sec) | Layer thickness (μm) |
|---|---|---|---|---|---|
| | SiH$_4$ | 300 | | | |

TABLE 13C

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | H$_2$ | 300 | 100 | 10 | 2 |
| | GeH$_4$ | 50 | | | |
| | SiH$_4$ | 50 | | | |
| | B$_2$H$_6$/H$_2$ (=3000 vol ppm) | 100 | | | |
| Layer B | H$_2$ | 300 | 100 | 10 | 2 |
| | GeH$_4$ | 50 | | | |
| | SiH$_4$ | 50 | | | |
| Second layer | H$_2$ | 300 | 300 | 24 | 20 |
| | SiH$_4$ | 300 | | | |

TABLE 14C

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | H$_2$ | 300 | 100 | 10 | 2 |
| | GeH$_4$ | 50 | | | |
| | SiH$_4$ | 50 | | | |
| Layer B | H$_2$ | 300 | 100 | 10 | 2 |
| | GeH$_4$ | 50 | | | |
| | SiH$_4$ | 50 | | | |
| | B$_2$H$_6$/H$_2$ (=3000 vol ppm) | 100 | | | |
| Second layer | H$_2$ | 300 | 300 | 24 | 20 |
| | SiH$_4$ | 300 | | | |

TABLE 1D

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ (=3000 vol ppm) | GeH$_4$ + SiH$_4$ = 100 | | | |
| Second layer | H$_2$ | 300 | 300 | 24 | 20 |
| | SiH$_4$ | 300 | | | |

TABLE 2D

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ (=3000 vol ppm) | 100 | | | |
| | | GeH$_4$ + SiH$_4$ = 100 | | | |
| Second layer | | | | | |
| Layer A | H$_2$ | 300 | 100 | 8 | 5 |
| | SiH$_4$ | 100 | | | |
| | B$_2$H$_6$/H$_2$ (=3000 vol ppm) | 100 | | | |
| Layer B | H$_2$ | 300 | 300 | 24 | 20 |
| | SiH$_4$ | 300 | | | |

TABLE 3D

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ (=3000 vol ppm) | 100 | | | |
| | | GeH$_4$ + SiH$_4$ = 100 | | | |

TABLE 3D-continued

| Layer constitution | Starting gas | Gas flow rate (SCCM) | Discharging power (W) | Deposition rate (Å/sec) | Layer thickness (μm) |
|---|---|---|---|---|---|
| Second layer | H₂<br>SiH₄ | 300<br>300 | 300 | 24 | 20 |

TABLE 4D

| Layer constitution | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄<br>B₂H₆/H₂<br>(=3000 vol ppm) | 300<br>50 → 0<br>50 → 100<br>50<br>GeH₄ + SiH₄ = 100 | 100 | 10 | 3 |
| Second layer | | | | | |
| Layer A | H₂<br>SiH₄<br>B₂H₆/H₂<br>(=3000 vol ppm) | 300<br>100<br>100 | 100 | 8 | 5 |
| Layer B | H₂<br>SiH₄ | 300<br>300 | 300 | 24 | 20 |

TABLE 5D

| Layer constitution | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄ | 300<br>50 → 0<br>50 → 100<br>GeH₄ + SiH₄ = 100 | 100 | 10 | 3 |
| Second layer | | | | | |
| Layer A | H₂<br>SiH₄<br>B₂H₆/H₂<br>(=3000 vol ppm) | 300<br>100<br>100 | 100 | 8 | 5 |
| Layer B | H₂<br>SiH₄ | 300<br>300 | 300 | 24 | 20 |

TABLE 6D

| Layer constitution | Starting gas | Gas flow rate (SCCM) | Discharging power (W) | Deposition rate (Å/sec) | Layer thickness (μm) |
|---|---|---|---|---|---|
| First layer | | | | | |
| Layer A | H₂<br>GeH₄<br>SiH₄<br>B₂H₆/H₂<br>(=3000 vol ppm) | 300<br>100 → 50<br>0 → 50<br>100 | 100 | 10 | 1.5 |
| Layer B | H₂<br>GeH₄<br>SiH₄ | 300<br>50 → 0<br>50 → 100 | 100 | 10 | 1.5 |
| Second layer | H₂<br>SiH₄ | 300<br>300 | 300 | 24 | 20 |

TABLE 1E

| | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄<br>B₂H₆/H₂<br>(=3000 vol ppm) | 300<br>100<br>100<br>B₂H₆/(GeH₄ + SiH₄) =<br>3/100 → 0 | 100 | 10 | 1 |
| Second layer | H₂<br>SiH₄ | 300<br>300 | 300 | 24 | 20 |

TABLE 2E

| | Starting gas | Gas flow rate (SCCM) | Discharging power (W) | Deposition rate (Å/sec) | Layer thickness (μm) |
|---|---|---|---|---|---|
| First layer | H₂<br>SiH₄<br>GeH₄<br>B₂H₆/H₂ | 300<br>50<br>100<br>B₂H₆/(GeH₄ + SiH₄) = | 100 | 14 | 3 |

TABLE 2E-continued

| | Starting gas | Gas flow rate (SCCM) | Discharging power (W) | Deposition rate (Å/sec) | Layer thickness (μm) |
|---|---|---|---|---|---|
| | (=3000 vol ppm) | 5/100 → 0 | | | |
| Second layer | H$_2$ | 300 | 300 | 24 | 20 |
| | SiH$_4$ | 300 | | | |

TABLE 3E

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 12 | 5 |
| | SiH$_4$ | 100 | | | |
| | GeH$_4$ | 50 | | | |
| | B$_2$H$_6$/H$_2$ | B$_2$H$_6$/(GeH$_4$ + SiH$_4$) = | | | |
| | (=3000 vol ppm) | 1/100 → 0 | | | |
| Second layer | H$_2$ | 300 | 300 | 24 | 20 |
| | SiH$_4$ | 300 | | | |

TABLE 4E

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 8 | 7 |
| | SiH$_4$ | 135 | | | |
| | GeH$_4$ | 15 | | | |
| | B$_2$H$_6$/H$_2$ | B$_2$H$_6$/(GeH$_4$ + SiH$_4$) = | | | |
| | (=3000 vol ppm) | 1/100 → 0 | | | |
| Second layer | H$_2$ | 300 | 300 | 24 | 20 |
| | SiH$_4$ | 300 | | | |

TABLE 5E

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ | 150 → 110 | | | |
| | | (= 3000 vol ppm) | | | | |
| Second layer | Layer A | H$_2$ | 300 | 100 | 10 | 3 |
| | | SiH$_4$ | 100 | | | |
| | | B$_2$H$_6$/H$_2$ | 110 → 0 | | | |
| | | (= 3000 vol ppm) | | | | |
| | Layer B | H$_2$ | 300 | 300 | 24 | 20 |
| | | SiH$_4$ | 300 | | | |

TABLE 6E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | | B$_2$H$_6$/H$_2$ | 100 → 0 | | | |
| | | (= 3000 vol ppm) | | | | |
| | Layer B | H$_2$ | 300 | 100 | 10 | 2 |
| | | GeH$_4$ | 50 | | | |
| | | SiH$_4$ | 50 | | | |
| Second layer | | H$_2$ | 300 | 300 | 24 | 20 |
| | | SiH$_4$ | 300 | | | |

TABLE 7E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ | 50 → 0 | | | |
| | | (= 3000 vol ppm) | | | | |
| Second layer | | H$_2$ | 300 | 300 | 24 | 20 |

TABLE 7E-continued

| Layer constitution | Starting gas | Gas flow rate (SCCM) | Discharging power (W) | Deposition rate (Å/sec) | Layer thickness (μm) |
|---|---|---|---|---|---|
| | SiH$_4$ | 300 | | | |

TABLE 8E

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ | 50 → 25 | | | |
| | | (= 3000 vol ppm) | | | | |
| Second layer | Layer A | H$_2$ | 300 | 100 | 8 | 3 |
| | | GeH$_4$ | 50 | | | |
| | | SiH$_4$ | 50 | | | |
| | | B$_2$H$_6$/H$_2$ | 25 → 0 | | | |
| | | (= 3000 vol ppm) | | | | |
| | Layer B | H$_2$ | 300 | 300 | 24 | 20 |
| | | SiH$_4$ | 300 | | | |

TABLE 1F

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | B$_2$H$_6$/H$_2$ | GeH$_4$ + SiH$_4$ = 100 | | | |
| | (= 3000 vol ppm) | 150 → 0 | | | |
| Second layer | H$_2$ | 300 | 300 | 24 | 20 |
| | SiH$_4$ | 300 | | | |

TABLE 2F

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 50 → 0 | | | |
| | SiH$_4$ | 50 → 100 | | | |
| | B$_2$H$_6$/H$_2$ | GeH$_4$ + SiH$_4$ = 100 | | | |
| | (= 3000 vol ppm) | 50 → 0 | | | |
| Second layer | H$_2$ | 300 | 300 | 24 | 20 |
| | SiH$_4$ | 300 | | | |

TABLE 3F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| Second layer | Layer A | H$_2$ | 300 | 100 | 10 | 3 |
| | | SiH$_4$ | 100 | | | |
| | | B$_2$H$_6$/H$_2$ | 100 → 0 | | | |
| | | (= 3000 vol ppm) | | | | |
| | Layer B | H$_2$ | 300 | 300 | 24 | 20 |
| | | SiH$_4$ | 300 | | | |

TABLE 4F

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | B$_2$H$_6$/H$_2$ | 100 → * | | | |
| | | (= 3000 vol ppm) | | | | |
| Second layer | Layer A | H$_2$ | 300 | 100 | 10 | 3 |
| | | SiH$_4$ | 100 | | | |
| | | B$_2$H$_6$/H$_2$ | * → 0 | | | |
| | | (= 3000 vol ppm) | | | | |
| | Layer | H$_2$ | 300 | 300 | 24 | 20 |

TABLE 4F-continued

| Layer constitution | Starting gas | Gas flow rate (SCCM) | Discharging power (W) | Deposition rate (Å/sec) | Layer thickness (μm) |
|---|---|---|---|---|---|
| B | SiH$_4$ | 300 | | | |

TABLE 5F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 → 25 | | | |
| | | SiH$_4$ | 50 → 75 | | | |
| | | B$_2$H$_6$/H$_2$ (= 3000 vol ppm) | 100 → 0 | | | |
| | Layer B | H$_2$ | 300 | 100 | 10 | 2 |
| | | GeH$_4$ | 25 → 0 | | | |
| | | SiH$_4$ | 75 → 100 | | | |
| Second layer | | H$_2$ | 300 | 300 | 24 | 20 |
| | | SiH$_4$ | 300 | | | |

TABLE 1aG

| | Starting gas | Gas flow rate (SCCM) | Discharging power (W) | Layer thickness (μm) |
|---|---|---|---|---|
| First layer | H$_2$ | 300 | 160 | 5 |
| | GeH$_4$ | 50 | | |
| | SiH$_4$ | 100 | | |
| | NO | | | |
| Second layer | H$_2$ | 300 | 150 | 20 |
| | SiH$_4$ | 300 | | |

TABLE 1G

| Layer | Starting gas | Flow rate (SCCM) | High frequency power (W) | Layer thickness (μm) |
|---|---|---|---|---|
| First layer | H$_2$ | 300 | 160 | 3 |
| | SiH$_4$ | 100 | | |
| | GeH$_4$ | 50 | | |
| | NH$_3$ | 30 | | |
| Second layer | H$_2$ | 300 | 300 | 20 |
| | SiH$_4$ | 300 | | |

TABLE 2G

| Layer | Starting gas | Flow rate (SCCM) | High frequency power (W) | Layer thickness (μm) |
|---|---|---|---|---|
| First layer | H$_2$ | 300 | 160 | 5 |
| | SiH$_4$ | 100 | | |
| | GeH$_4$ | 50 | | |
| | NH$_3$ | 15 | | |
| Second layer | H$_2$ | 300 | 200 | 20 |
| | SiH$_4$ | 300 | | |
| | NH$_3$ | 15 | | |

TABLE 3G

| Layer | Starting gas | Flow rate (SCCM) | High frequency power (W) | Layer thickness (μm) |
|---|---|---|---|---|
| First layer | H$_2$ | 300 | 170 | 2.8 |
| | SiH$_4$ | 50 | | |
| | GeH$_4$ | 100 | | |
| | CH$_4$ | 15 | | |
| Second layer | H$_2$ | 300 | 200 | 21 |
| | SiH$_4$ | 300 | | |
| | CH$_4$ | 15 | | |

TABLE 4G

| Layer | Starting gas | Flow rate (SCCM) | High frequency power (W) | Layer thickness (μm) |
|---|---|---|---|---|
| First layer | H$_2$ | 300 | 170 | 5.1 |
| | SiH$_4$ | 100 | | |
| | GeH$_4$ | 60 | | |

TABLE 4G-continued

| Layer | Starting gas | Flow rate (SCCM) | High frequency power (W) | Layer thickness (μm) |
|---|---|---|---|---|
| | CH$_4$ | 16 | | |
| Second layer | H$_2$ | 300 | 230 | 22 |
| | SiH$_4$ | 300 | | |

TABLE 5G

| Layer | Starting gas | Flow rate (SCCM) | High frequency power (W) | Layer thickness (μm) |
|---|---|---|---|---|
| First layer | H$_2$ | 300 | 160 | 3 |
| | SiH$_4$ | 50 | | |
| | GeH$_4$ | 100 | | |
| | NH$_3$ | 30~0 | | |
| Second layer | H$_2$ | 300 | 300 | 20 |
| | SiH$_4$ | 300 | | |

TABLE 6G

| Layer | Starting gas | Flow rate (SCCM) | High frequency power (W) | Layer thickness (μm) |
|---|---|---|---|---|
| First layer | H$_2$ | 300 | 160 | 5 |
| | SiH$_4$ | 100 | | |
| | GeH$_4$ | 50 | | |
| | NH$_3$ | 15~0 | | |
| Second layer | H$_2$ | 300 | 200 | 20 |
| | SiH$_4$ | 300 | | |
| | NH$_3$ | | | |

TABLE 7G

| Layer | Starting gas | Flow rate (SCCM) | High frequency power (W) | Layer thickness (μm) |
|---|---|---|---|---|
| First layer | H$_2$ | 300 | 170 | 2.8 |
| | SiH$_4$ | 100 | | |
| | GeH$_4$ | 50 | | |
| | CH$_4$ | 15~0 | | |
| Second layer | H$_2$ | 300 | 200 | 21 |
| | SiH$_4$ | 300 | | |

TABLE 8G

| Layer | Starting gas | Flow rate (SCCM) | High frequency power (W) | Layer thickness (μm) |
|---|---|---|---|---|
| First layer | H$_2$ | 300 | 170 | 5.1 |
| | SiH$_4$ | 100 | | |
| | GeH$_4$ | 60 | | |
| | CH$_4$ | 16~0 | | |
| Second layer | H$_2$ | 300 | 230 | 22 |
| | SiH$_4$ | 300 | | |

TABLE 8G-continued

| | Flow rate | High frequency | Layer thickness |
|---|---|---|---|

CH₄

TABLE 9G (Sample No. 2201)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NO | SiH₄ + GeH₄ = 50 | NO/(SiH₄ + GeH₄) = 3/10~0 | 150 | 12 | 1 |
| Second layer | SiH₄/He = 0.05 | SiH₄ = 50 | | 150 | 12 | 20 |

TABLE 10G (Sample No. 2202)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NO | SiH₄ + GeH₄ = 50 | NO/(SiH₄ + GeH₄) = 2/10~0 | 150 | 12 | 0.5 |
| Second layer | SiH₄/He = 0.05 | SiH₄ = 50 | | 150 | 12 | 20 |

TABLE 11G (Sample No. 2203)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NO | SiH₄ + GeH₄ = 50 | NO/(SiH₄ + GeH₄) = 1/10~1/100 | 160 | 14 | 5 |
| Second layer | SiH₄/He = 0.05 | SiH₄ = 50 | | 160 | 14 | 15 |

TABLE 12G (Sample No. 2204)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NO | SiH₄ + GeH₄ = 50 | NO/(SiH₄ + GeH₄) = 3/10~0 | 160 | 14 | 1.0 |
| Second layer | SiH₄/He = 0.05 | SiH₄ = 50 | | 160 | 12 | 15 |

TABLE 13G (Sample No. 2205)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NO | SiH₄ + GeH₄ = 50 | NO/(SiH₄ + GeH₄) = 3/10~0 | 170 | 15 | 1 |
| Second layer | SiH₄/He = 0.05 | SiH₄ = 50 | | 170 | 15 | 20 |

| Layer | Starting gas | (SCCM) | power (W) | ness (μm) |
|---|---|---|---|---|

TABLE 14G (Sample No. 2206)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH₄/He = 0.05<br>GeH₄/He = 0.05<br>NH₃ | SiH₄ + GeH₄ = 50 | NH₃/(SiH₄ + GeH₄) = 1/10~1/100 | 160 | 14 | 5 |
| Second layer | SiH₄/He = 0.05 | SiH₄ = 50 | NH₃/SiH₄ = 1/100 | 160 | 14 | 15 |

TABLE 14G-continued (Sample No. 2206)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| layer | NH$_3$ | | | | | |

TABLE 15G (Sample No. 2206)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>CH$_4$ | SiH$_4$ + GeH$_4$ = 50 | CH$_4$/(SiH$_4$ + GeH$_4$) = 1/10~1/100 | 160 | 14 | 5 |
| Second layer | SiH$_4$/He = 0.05<br>CH$_4$ | SiH$_4$ = 50 | CH$_4$/SiH$_4$ = 1/100 | 160 | 14 | 15 |

TABLE 1H

| | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$<br><br>NO | 300<br>100 → 0<br>0 → 100<br>GeH$_4$ + SiH$_4$ = 100<br>10 | 100 | 9 | 3 |
| Second layer | H$_2$<br>SiH$_4$ | 300<br>300 | 300 | 24 | 20 |

TABLE 2H

| | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$<br><br>CH$_4$ | 300<br>100 → 0<br>0 → 100<br>GeH$_4$ + SiH$_4$ = 100<br>10 | 100 | 9 | 3 |
| Second layer | H$_2$<br>SiH$_4$ | 300<br>300 | 300 | 24 | 20 |

TABLE 3H

| | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$<br><br>NH$_3$ | 300<br>50 → 0<br>50 → 100<br>GeH$_4$ + SiH$_4$ = 100<br>10 | 100 | 9 | 3 |
| Second layer | H$_2$<br>SiH$_4$ | 300<br>300 | 300 | 24 | 20 |

TABLE 4H

| | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$<br><br>NH$_3$ | 300<br>50 → 0<br>50 → 100<br>GeH$_4$ + SiH$_4$ = 100<br>6 | 100 | 9 | 3 |
| Second layer | H$_2$<br>SiH$_4$<br>NH$_3$ | 300<br>300<br>6 | 300 | 24 | 20 |

TABLE 5H

| | Starting gas | Gas flow rate (SCCM) | Discharging power (W) | Deposition rate (Å/sec) | Layer thickness (μm) |
|---|---|---|---|---|---|
| First | H$_2$ | 300 | 100 | 9 | 3 |

TABLE 5H-continued

| | Starting gas | Gas flow rate (SCCM) | Discharging power (W) | Deposition rate (Å/sec) | Layer thickness (μm) |
|---|---|---|---|---|---|
| layer | GeH$_4$ | 100 → 0 | | | |
| | SiH$_4$ | 0 → 100 | | | |
| | | GeH$_4$ + SiH$_4$ = 100 | | | |
| | NO | 20 → 0 | | | |
| Second layer | H$_2$ | 300 | 300 | 24 | 20 |
| | SiH$_4$ | 300 | | | |

TABLE 6H

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| | NH$_3$ | 20 → 0 | | | |
| Second layer | H$_2$ | 300 | 300 | 24 | 20 |
| | SiH$_4$ | 300 | | | |

TABLE 7H

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| | NO | 10 → * | | | |
| Second layer | H$_2$ | 300 | 300 | 24 | 20 |
| | SiH$_4$ | 300 | | | |
| | NO | * → 0 | | | |

NOTE:
The symbol * represents continuity of change in the gas flow rate. The same note applies to the subsequent other table.

TABLE 8H

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| | CH$_4$ | 10 → 0 | | | |
| Second layer | H$_2$ | 300 | 300 | 24 | 20 |
| | SiH$_4$ | 300 | | | |

TABLE 1I

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 50 | | | |
| | SiH$_4$ | 50 | | | |
| | B$_2$H$_6$/H$_2$ (= 3000 vol ppm) | 100 | | | |
| | NO | 10 | | | |
| Second layer | H$_2$ | 300 | 300 | 24 | 20 |
| | SiH$_4$ | 300 | | | |

TABLE 2I

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 1 |
| | GeH$_4$ | 50 | | | |
| | SiH$_4$ | 50 | | | |
| | B$_2$H$_6$/H$_2$ (= 3000 vol ppm) | 100 | | | |
| | NH$_3$ | 11 | | | |
| Second layer A | H$_2$ | 300 | 100 | 8 | 5 |
| | SiH$_4$ | 100 | | | |
| | B$_2$H$_6$/H$_2$ | 100 | | | |

TABLE 2I-continued

| Layer constitution | | Starting gas | Gas flow rate (SCCM) | Discharging power (W) | Deposition rate (Å/sec) | Layer thickness (μm) |
|---|---|---|---|---|---|---|
| | | (= 3000 vol ppm) | | | | |
| | Layer B | H₂ | 300 | 300 | 24 | 20 |
| | | SiH₄ | 300 | | | |

TABLE 3I

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 1 |
| | | GeH₄ | 50 | | | |
| | | SiH₄ | 50 | | | |
| | | B₂H₆/H₂ | 50 | | | |
| | | (= 3000 vol ppm) | | | | |
| | | CH₄ | 10 | | | |
| Second layer | Layer A | H₂ | 300 | 100 | 8 | 5 |
| | | SiH₄ | 100 | | | |
| | | B₂H₆/H₂ | 100 | | | |
| | | (= 3000 vol ppm) | | | | |
| | Layer B | H₂ | 300 | 300 | 24 | 20 |
| | | SiH₄ | 300 | | | |

TABLE 4I

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 1 |
| | | GeH₄ | 50 | | | |
| | | SiH₄ | 50 | | | |
| | | B₂H₆/H₂ | 150 | | | |
| | | (= 3000 vol ppm) | | | | |
| | | NO | 10 | | | |
| Second layer | Layer A | H₂ | 300 | 100 | 8 | 5 |
| | | SiH₄ | 100 | | | |
| | | B₂H₆/H₂ | 100 | | | |
| | | (= 3000 vol ppm) | | | | |
| | | NO | 10 | | | |
| | Layer B | H₂ | 300 | 300 | 24 | 20 |
| | | SiH₄ | 300 | | | |
| | | NO | 10 | | | |

TABLE 5I

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 1 |
| | | GeH₄ | 50 | | | |
| | | SiH₄ | 50 | | | |
| | | NH₃ | 12 | | | |
| Second layer | Layer A | H₂ | 300 | 100 | 8 | 5 |
| | | SiH₄ | 100 | | | |
| | | B₂H₆/H₂ | 100 | | | |
| | | (= 3000 vol ppm) | | | | |
| | | NH₃ | 12 | | | |
| | Layer B | H₂ | 300 | 300 | 24 | 20 |
| | | SiH₄ | 300 | | | |
| | | NH₃ | 12 | | | |

TABLE 6I

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 2 |
| | | GeH₄ | 100 | | | |
| | | B₂H₆/H₂ | 100 | | | |
| | | (= 3000 vol ppm) | | | | |
| | | CH₄ | 8 | | | |
| | Layer B | H₂ | 300 | 100 | 10 | 2 |
| | | GeH₄ | 50 | | | |
| | | SiH₄ | 50 | | | |
| | | CH₄ | 8 | | | |
| Second layer | | H₂ | 300 | 300 | 24 | 20 |
| | | SiH₄ | 300 | | | |

TABLE 6I-continued

| Layer constitution | Starting gas | Gas flow rate (SCCM) | Discharging power (W) | Deposition rate (Å/sec) | Layer thickness (μm) |
|---|---|---|---|---|---|
| | CH$_4$ | 8 | | | |

TABLE 7I

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 100 | | | |
| | | CH$_4$ | 10~* | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | | CH$_4$ | *~0 | | | |
| Second layer | | H$_2$ | 300 | 300 | 24 | 20 |
| | | SiH$_4$ | 300 | | | |

TABLE 8I

| | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 5 |
| | GeH$_4$ | 50 | | | |
| | SiH$_4$ | 50 | | | |
| | B$_2$H$_6$/H$_2$ (= 3000 vol ppm) | 100 | | | |
| | NO | 10~0 | | | |
| Second layer | H$_2$ | 300 | 300 | 24 | 20 |
| | SiH$_4$ | 300 | | | |

TABLE 9I

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 100 | | | |
| | | NH$_3$ | 10~0 | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 10I

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 50 | | | |
| | | CH$_4$ | 10~* | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | | CH$_4$ | *~** | | | |
| | Layer B | H$_2$ | 300 | 300 | 24 | 20 |
| | | SiH$_4$ | 300 | | | |
| | | CH$_4$ | **~0 | | | |

NOTE:
The symbols * and ** represent continuity of change in the gas flow rate respectively. The same note applies to the subsequent other tables.

TABLE 11I

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| | | NO | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | NO | *~** | | | |
| | Layer B | $H_2$ | 300 | 300 | 24 | 20 |
| | | $SiH_4$ | 300 | | | |
| | | NO | **~0 | | | |

TABLE 12I

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $NH_3$ | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | $NH_3$ | *~** | | | |
| | Layer B | $H_2$ | 300 | 300 | 24 | 20 |
| | | $SiH_4$ | 300 | | | |
| | | $NH_3$ | **~0 | | | |

TABLE 13I

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | 8 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |

TABLE 14I

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $NH_3$ | 11 | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |

TABLE 1J

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |

TABLE 1J-continued

| Layer constitution | Starting gas | Gas flow rate (SCCM) | Discharging power (W) | Deposition rate (Å/sec) | Layer thickness (μm) |
|---|---|---|---|---|---|
| | B$_2$H$_6$/H$_2$ (= 3000 vol ppm) | GeH$_4$ + SiH$_4$ = 100 | | | |
| | NO | 12 | | | |
| Second layer | H$_2$ SiH$_4$ | 300 300 | 300 | 24 | 20 |

TABLE 2J

| Layer constitution | | Starting gas | Gas flow late (SCCM) | Discharging powe (W) | Deposition rate (Å/sec) | Layer thickness (μm) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | B$_2$H$_6$/H$_2$ (= 3000 vol ppm) | 100 GeH$_4$ + SiH$_4$ = 100 | | | |
| | | NH$_3$ | 8 | | | |
| Second layer | Layer A | H$_2$ SiH$_4$ B$_2$H$_6$/H$_2$ (= 3000 vol ppm) NH$_3$ | 300 100 100 8 | 100 | 8 | 5 |
| | Layer B | H$_2$ SiH$_4$ NH$_3$ | 300 300 8 | 300 | 24 | 20 |

TABLE 3J

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 100 → 0 | | | |
| | SiH$_4$ | 0 → 100 | | | |
| | B$_2$H$_6$/H$_2$ (= 3000 vol ppm) | 100 GeH$_4$ + SiH$_4$ = 100 | | | |
| | CH$_4$ | 10 → 0 | | | |
| Second layer | H$_2$ SiH$_4$ | 300 300 | 300 | 24 | 20 |

TABLE 4J

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 3 |
| | | GeH$_4$ | 50 → 0 | | | |
| | | SiH$_4$ | 50 → 100 | | | |
| | | B$_2$H$_6$/H$_2$ (= 3000 vol ppm) | 50 GeH$_4$ + SiH$_4$ = 100 | | | |
| | | NO | 10 → * | | | |
| Second layer | Layer A | H$_2$ SiH$_4$ B$_2$H$_6$/H$_2$ (= 3000 vol ppm) NO | 300 100 100 * → ** | 100 | 8 | 5 |
| | Layer B | H$_2$ SiH$_4$ NO | 300 300 ** → 0 | 300 | 24 | 20 |

TABLE 5J

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 3 |
| | GeH$_4$ | 50 → 0 | | | |
| | SiH$_4$ | 50 → 100 GeH$_4$ + SiH$_4$ = 100 | | | |

TABLE 5J-continued

| Layer constitution | | Starting gas | Gas flow rate (SCCM) | Discharging power (W) | Deposition rate (Å/sec) | Layer thickness (μm) |
|---|---|---|---|---|---|---|
| Second layer | Layer A | NH₃<br>H₂<br>SiH₄<br>B₂H₆/H₂<br>(= 3000 vol ppm) | 10 → *<br>300<br>100<br>100 | 100 | 8 | 5 |
| | Layer B | NH₃<br>H₂<br>SiH₄<br>NH₃ | * → <br>300<br>300<br> → 0 | 300 | 24 | 20 |

TABLE 6J

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂<br>GeH₄<br>SiH₄<br>B₂H₆/H₂<br>(= 3000 vol ppm)<br>CH₄ | 300<br>100 → 0<br>0 → 100<br>100<br><br>10 → * | 100 | 10 | 1.5 |
| | Layer B | H₂<br>GeH₄<br>SiH₄<br>CH₄ | 300<br>50 → 0<br>50 → 100<br>* → ** | 100 | 10 | 1.5 |
| Second layer | | H₂<br>SiH₄<br>CH₄ | 300<br>300<br>** → 0 | 300 | 24 | 20 |

TABLE 1K

| | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄<br>B₂H₆/H₂<br>(= 3000 vol ppm)<br>NO | 300<br>100<br>100<br>B₂H₆/(GeH₄ + SiH₄) =<br>3/100 → 0<br>12 | 100 | 10 | 1 |
| Second layer | H₂<br>SiH₄ | 300<br>300 | 300 | 24 | 20 |

TABLE 2K

| | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄<br>B₂H₆/H₂<br>(= 3000 vol ppm)<br>NH₃ | 300<br>100<br>50<br>B₂H₆/(GeH₄ + SiH₄) =<br>5/100 → 0<br>10 | 100 | 14 | 3 |
| Second layer | H₂<br>SiH₄<br>NH₃ | 300<br>300<br>10 | 300 | 24 | 20 |

TABLE 3K

| | Starting gas | Gas flow rate (SCCM) | Discharging power (W) | Deposition rate (Å/sec) | Layer thickness (μm) |
|---|---|---|---|---|---|
| First layer | H₂<br>GeH₄<br>SiH₄<br>B₂H₆/H₂<br>(= 3000 vol ppm)<br>CH₄ | 300<br>50<br>100<br>B₂H₆/(GeH₄ + SiH₄) =<br>1/100 → 0<br>15 | 100 | 12 | 5 |
| Second layer | H₂<br>SiH₄ | 300<br>300 | 300 | 24 | 20 |

TABLE 4K

| | Starting gas | Gas flow rate (SCCM) | Discharging Power (W) | Deposition rate (Å/sec) | Layer thickness ($\mu$m) |
|---|---|---|---|---|---|
| First layer | $H_2$ | 300 | 100 | 8 | 7 |
| | $GeH_4$ | 15 | | | |
| | $SiH_4$ | 135 | | | |
| | $B_2H_6/H_2$ (= 3000 vol ppm) | $B_2H_6/(GeH_4 + SiH_4)$ = 1/100 → 0 | | | |
| | NO | 15 | | | |
| Second layer | $H_2$ | 300 | 300 | 24 | 20 |
| | $SiH_4$ | 300 | | | |
| | NO | 15 | | | |

TABLE 5K

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 → 110 10 → 0 | | | |
| | | $NH_3$ | | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 110 → 0 | | | |
| | Layer B | $H_2$ | 300 | 300 | 24 | 20 |
| | | $SiH_4$ | 300 | | | |

TABLE 6K

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 → 0 | | | |
| | | $CH_4$ | 10 → 0 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |

TABLE 7K

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | NO | 10 → * | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 50 → 0 | | | |
| | | NO | * → ** | | | |
| Second layer | | $H_2$ | 300 | 300 | 24 | 20 |
| | | $SiH_4$ | 300 | | | |
| | | NO | ** → 0 | | | |

TABLE 8K

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ (= 3000 vol ppm) | 50 → *** | | | |
| | $NH_3$ | 10 → * | | | |

TABLE 8K-continued

| Layer constitution | | Starting gas | Gas flow rate (SCCM) | Discharging power (W) | Deposition rate (Å/sec) | Layer thickness (μm) |
|---|---|---|---|---|---|---|
| Second layer | Layer A | $H_2$ | 300 | 100 | 8 | 3 |
| | | $GeH_4$ | 50 | | | |
| | | $SiH_4$ | 50 | | | |
| | | $B_2H_6/H_2$ (= 3000 vol ppm) | *** → 0 | | | |
| | | $NH_3$ | * → 0** | | | |
| | Layer B | $H_2$ | 300 | 300 | 24 | 20 |
| | | $SiH_4$ | 300 | | | |
| | | $NH_3$ | ** → 0 | | | |

NOTE:
The symbol *** represents continuity of change in the gas flow rate.

TABLE 1L

| | Starting gas | Gas flow rate (SCCM) | Discharging Power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $B_2H_6/H_2$ (=3000 vol ppm) | 150 → 0 | | | |
| | NO | 12 | | | |
| Second layer | $H_2$ | 300 | 300 | 24 | 20 |
| | $SiH_4$ | 300 | | | |

TABLE 2L

| | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $B_2H_6/H_2$ (= 3000 vol ppm) | 50 → 0 | | | |
| | $NH_3$ | 12 | | | |
| Second layer | $H_2$ | 300 | 300 | 24 | 20 |
| | $SiH_4$ | 300 | | | |
| | $NH_3$ | 12 | | | |

TABLE 3L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $CH_4$ | 15 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 100 → 0 | | | |
| | Layer B | $H_2$ | 300 | 300 | 24 | 20 |
| | | $SiH_4$ | 300 | | | |

TABLE 4L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 → * | | | |
| | | NO | 10 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | * → 0 | | | |
| | | NO | 10 | | | |
| | Layer B | $H_2$ | 300 | 300 | 24 | 20 |
| | | $SiH_4$ | 300 | | | |

TABLE 4L-continued

| Layer constitution | Starting gas | Gas flow rate (SCCM) | Discharging power (W) | Deposition rate (Å/sec) | Layer thickness (μm) |
|---|---|---|---|---|---|
| | NO | 10 | | | |

TABLE 5L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 2 |
| | | GeH₄ | 50 → 25 | | | |
| | | SiH₄ | 50 → 75 | | | |
| | | B₂H₆/H₂ (= 3000 vol ppm) | 100 → 0 | | | |
| | | NH₃ | 10 | | | |
| | Layer B | H₂ | 300 | 100 | 10 | 2 |
| | | GeH₄ | 25 → 0 | | | |
| | | SiH₄ | 75 → 100 | | | |
| | | NH₃ | 10 | | | |
| Second layer | | H₂ | 300 | 300 | 24 | 20 |
| | | SiH₄ | 300 | | | |

TABLE 6L

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 2 |
| | | GeH₄ | 50 → 0 | | | |
| | | SiH₄ | 50 → 100 | | | |
| | | B₂H₆/H₂ (= 3000 vol ppm) | 150 → 110 | | | |
| | | NH₃ | 10 → 0 | | | |
| Second layer | Layer A | H₂ | 300 | 100 | 10 | 3 |
| | | SiH₄ | 100 | | | |
| | | B₂H₆/H₂ (= 3000 vol ppm) | 110 → 0 | | | |
| | Layer B | H₂ | 300 | 300 | 24 | 20 |
| | | SiH₄ | 300 | | | |

TABLE 7L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 2 |
| | | GeH₄ | 50 → * | | | |
| | | B₂H₆/H₂ (= 3000 vol ppm) | 100 → 0 | | | |
| | | CH₄ | 10 → 0 | | | |
| | Layer B | H₂ | 300 | 100 | 10 | 2 |
| | | GeH₄ | * → 0 | | | |
| | | SiH₄ | ** → 100 | | | |
| Second layer | | H₂ | 300 | 300 | 24 | 20 |
| | | SiH₄ | 300 | | | |

TABLE 8L

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H₂ | 300 | 100 | 10 | 2 |
| | | GeH₄ | 50 | | | |
| | | SiH₄ | 50 | | | |
| | | NO | 10 → * | | | |
| | Layer B | H₂ | 300 | 100 | 10 | 2 |
| | | GeH₄ | 50 → 0 | | | |
| | | SiH₄ | 50 → 100 | | | |
| | | B₂H₆/H₂ (= 3000 vol ppm) | | | | |
| | | NO | * → ** | | | |
| Second layer | | H₂ | 300 | 300 | 24 | 20 |
| | | SiH₄ | 300 | | | |
| | | NO | ** → 0 | | | |

TABLE 9L

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 → *** | | | |
| | | $NH_3$ | 10 → * | | | |
| Second layer | Layer A | $H_2$ | 300 | 100 | 8 | 3 |
| | | $GeH_4$ | 50 → 0 | | | |
| | | $SiH_4$ | 50 → 100 | | | |
| | | $B_2H_6/H_2$ (= 3000 vol ppm) | *** → 100 | | | |
| | | $NH_3$ | * → ** | | | |
| | Layer B | $H_2$ | 300 | 300 | 24 | 20 |
| | | $SiH_4$ | 300 | | | |
| | | $NH_3$ | ** → 0 | | | |

Note:
The symbol *** represents continuity of change in the gas flow rate.

What we claim is:

1. A light-receiving member comprising a substrate having a large number of protruding portions on a surface thereof, each of said protruding portions having at a predetermined cut position a sectional shape comprising a mainprojection and a subprojection, the main projection and the subprojection overlapping each other, and a light-receiving layer of a multi-layer structure having a first layer comprising an amorphous material containing silicon atoms and germanium atoms and a second layer comprising an amorphous material containing silicon atoms and exhibiting photoconductivity provided on said substrate successively from the substrate side.

2. An electrophotographic system comprising a light-receiving member comprising a substrate having a large number of protruding portions on a surface thereof, each of said protruding portions having at a predetermined cut position a sectional shape comprising a main projection and a subprojection, the main projection and the subprojection overlapping each other, and a light-receiving layer of a multi-layer structure having a first layer comprising an amorphous material containing silicon atoms and germanium atoms and a second layer comprising an amorphous material containing silicon atoms and exhibiting photoconductivity provided on said substrate successively from the substrate side.

3. The invention according to claim 1 or 2, wherein said protruding portions are arranged regularly.

4. The invention according to claim 1 or 2, wherein said protruding portions are arranged in cycles.

5. The invention according to claim 1 or 2, wherein each of said protruding portions has the same shape as the first order approximation.

6. The invention according to claim 1 or 2, wherein said protruding portions have a plurality of subprojections.

7. The invention according to claim 1 or 2, wherein said sectional shape of said protruding portion is symmetrical with the main projection as its center.

8. The invention according to claim 1 or 2, wherein said sectional shape of said protruding portion is asymmetrical with the main projection as its center.

9. The invention according to claim 1 or 2, wherein said protruding portion is formed by mechanical working.

10. The invention according to claim 1 or 2, wherein hydrogen atoms are contained in at least one of the first layer and the second layer.

11. The invention according to claim 1 or 2, wherein halogen atoms are contained in at least one of the first layer and the second layer.

12. The invention according to claim 1 or 2, wherein the distribution state of germanium atoms in the first layer is nonuniform in the layer thickness direction.

13. The invention according to claim 12, wherein the nonuniform distribution state of germanium atoms is such that the distribution concentration is enriched on the substrate side.

14. The invention according to claim 1 or 2, wherein a substance for controlling conductivity is contained in the first layer.

15. The invention according to claim 14, wherein the substance for controlling conductivity is an atom belonging to the group III or the group V of the periodic table.

16. The invention according to claim 1 or 2, wherein the substance for controlling conductivity is contained in the second layer.

17. The invention according to claim 16, wherein the substance for controlling conductivity is an atom belonging to the group III or the group V of the periodic table.

18. The invention according to claim 1 or 2, wherein the light-receiving layer has a layer region (PN) containing a substance for controlling conductivity.

19. The invention according to claim 18, wherein the distribution state of the substance for controlling conductivity in the layer region (PN) is nonuniform in the layer thickness direction.

20. The invention according to claim 18, wherein the distribution state of the substance for controlling conductivity in the layer region (PN) is uniform in the layer thickness direction.

21. The invention according to claim 18, wherein the substance for controlling conductivity is an atom belonging to the group III or the group V of the periodic table.

22. The invention according to claim 18, wherein the layer region (PN) is provided in the first layer.

23. The invention according to claim 18, wherein the layer region (PN) is provided in the second layer.

24. The invention according to claim 18, wherein the layer region (PN) is provided at the end portion on the substrate side of the light-receiving layer.

25. The invention according to claim 18, wherein the layer region (PN) is provided extending over the first layer and the second layer.

26. The invention according to claim 18, wherein the layer region (PN) occupies a part of the layer region in the light-receiving layer.

27. The invention according to claim 26, wherein the content of the substance for controlling conductivity in the layer region (PN) is 0.01 to $5 \times 10^4$ atomic ppm.

28. The invention according to claim 1 or 2, wherein 0.01 to 40 atomic % of hydrogen atoms are contained in the first layer.

29. The invention according to claim 1 or 2, wherein 0.01 to 40 atomic % of halogen atoms are contained in the first layer.

30. The invention according to claim 1 or 2, wherein 0.01 to 40 atomic % as a total of hydrogen atoms and halogen atoms are contained in the first layer.

31. The invention according to claim 1 or 2, wherein 1 to 40 atomic % of hydrogen atoms are contained in the second layer.

32. The invention according to claim 1 or 2, wherein 1 to 40 atomic % of hydrogen atoms are contained in the second layer.

33. The invention according to claim 1 or 2, wherein 1 to 40 atomic % as a total of hydrogen atoms and halogen atoms are contained in the second layer.

34. The invention according to claim 1 or 2, wherein the light-receiving layer contains at least one kind of atoms selected from oxygen atoms, carbon atoms and nitrogen atoms.

35. The invention according to claim 1 or 2, wherein the light-receiving layer has a layer region (OCN) containing at least one kind of atoms selected from oxygen atoms, carbon atoms and nitrogen atoms.

36. The invention according to claim 35, wherein the layer region (OCN) is provided at the end portion on the substrate side of the light-receiving layer.

37. The invention according to claim 36, wherein the layer region (OCN) contains 0.001 to 50 atomic % of oxygen atoms.

38. The invention according to claim 36, wherein the layer region (OCN) contains 0.001 to 50 atomic % of carbon atoms.

39. The invention according to claim 36, wherein the layer region (OCN) contains 0.001 to 50 atomic % of carbon atoms.

40. The invention according to claim 36, wherein the layer region (OCN) contains oxygen atoms in nonuniform distribution state in the layer thickness direction.

41. The invention according to claim 36, wherein the layer region (OCN) contains oxygen atoms in uniform distribution state in the layer thickness direction.

42. The invention according to claim 36, wherein the layer region (OCN) contains oxygen atoms in uniform distribution state in the layer thickness direction.

43. The invention according to claim 36, wherein the layer region (OCN) contains oxygen atoms in uniform distribution state in the layer thickness direction.

44. The invention according to claim 36, wherein the layer region (OCN) contains oxygen atoms in uniform distribution state in the layer thickness direction.

45. The invention according to claim 36, wherein the layer region (OCN) contains oxygen atoms in uniform distribution state in the layer thickness direction.

46. The invention according to claim 1 or 2, wherein the first layer has a layer thickness of 30 Å to 50μ.

47. The invention according to claim 1 or 2, wherein the second layer has a layer thickness of 0.5 to 90μ.

48. The invention according to claim 1 or 2, wherein the light-receiving layer has a layer thickness of 1 to 100μ.

49. The invention according to claim 1 or 2, wherein the thickness $T_B$ of the first layer and the thickness T of the second layer satisfy the relationship of $T_B/T \leq 1$.

50. An electrophotographic image forming process comprising:
    (a) applying a charging treatment to the light receiving member of claim 1;
    (b) irradiating the light receiving member with a laser beam carrying information to form an electrostatic latent image; and
    (c) developing said electrostatic latent image.

* * * * *

UNITED STATES PATENT AND TRADEMARK OFFICE
CERTIFICATE OF CORRECTION

PATENT NO. : 4,705,732                    Page 1 of 2

DATED : November 10, 1987

INVENTOR(S) : KEISHI SAITOH, ET AL.

It is certified that error appears in the above-identified patent and that said Letters Patent is hereby corrected as shown below:

COLUMN 2

Line 66, "±1000 Å," should read --±10000 Å,--.

COLUMNS 83-84

Table 8G, Lines 1-2,
"TABLE 8G-continued          CH$_4$                    "
   Flow rate    High frequency    Layer-thick-
should read
--TABLE 8G-continued                                    --
             Flow rate  High frequency  Layer thick-
  Layer Starting Gas (SCCM)   power (W)    ness (μm)
       CH$_4$ Table 8G, Line 59,
"Layer   Starting gas   (SCCM)   power (W)   ness (μm)"
should be deleted.

COLUMN 105

Line 25, "mainprojection" should read --main projection--.

COLUMN 107

Line 22, "hydrogen" should read --halogen--.

UNITED STATES PATENT AND TRADEMARK OFFICE
CERTIFICATE OF CORRECTION

PATENT NO. : 4,705,732

DATED : November 10, 1987

INVENTOR(S) : KEISHI SAITOH, ET AL.

Page 2 of 2

It is certified that error appears in the above-identified patent and that said Letters Patent is hereby corrected as shown below:

<u>COLUMN 108</u>

```
Line  6, "carbon"  should read --nitrogen--.
Line 14, "oxygen"  should read --carbon--.
Line 14, "uniform" should read --nonuniform--.
Line 17, "oxygen"  should read --carbon--.
Line 20, "oxygen"  should read --nitrogen--.
Line 20, "uniform" should read --nonuniform--.
Line 23, "oxygen"  should read --nitrogen--.
```

Signed and Sealed this

Ninth Day of August, 1988

*Attest:*

DONALD J. QUIGG

*Attesting Officer*  *Commissioner of Patents and Trademarks*